(12) United States Patent
Ahn et al.

(10) Patent No.: US 12,736,560 B2
(45) Date of Patent: Sep. 15, 2026

(54) ELECTRICALLY CONDUCTIVE CONTACT PIN AND MANUFACTURING METHOD THEREFOR

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Tae Hwan Song, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 334 days.

(21) Appl. No.: 18/284,524

(22) PCT Filed: Mar. 22, 2022

(86) PCT No.: PCT/KR2022/003948
§ 371 (c)(1),
(2) Date: Sep. 27, 2023

(87) PCT Pub. No.: WO2022/211342
PCT Pub. Date: Oct. 6, 2022

(65) Prior Publication Data

US 2024/0192253 A1 Jun. 13, 2024

(30) Foreign Application Priority Data

Mar. 30, 2021 (KR) ........................ 10-2021-0041138

(51) Int. Cl.

| | |
|---|---|
| ***G01R 1/067*** | (2006.01) |
| ***G01R 1/04*** | (2006.01) |
| ***G01R 1/073*** | (2006.01) |
| ***G01R 3/00*** | (2006.01) |
| ***G01R 31/02*** | (2006.01) |
| ***G01R 31/28*** | (2006.01) |

(52) U.S. Cl.
CPC ..... *G01R 1/06761* (2013.01); *G01R 1/07342* (2013.01)

(58) Field of Classification Search
CPC .......... G01R 1/04; G01R 1/067; G01R 1/073; G01R 3/00; G01R 31/02; G01R 31/28
See application file for complete search history.

(56) References Cited

U.S. PATENT DOCUMENTS 9,774,121 B2 * 9/2017 Kimura .............. H01R 13/2428
2021/0123949 A1 * 4/2021 Chu ........................ G03F 7/422

FOREIGN PATENT DOCUMENTS

| | | |
|---|---|---|
| JP | H05109064 | 4/1993 |
| JP | 2006261099 | 9/2006 |
| JP | 2007173846 | 7/2007 |
| JP | 5109064 | 12/2012 |

(Continued)

OTHER PUBLICATIONS

"Office Action of Taiwan Counterpart Application", issued on Jun. 20, 2025, with English translation thereof, p. 1-p. 12.

(Continued)

*Primary Examiner* — Neel D Shah
(74) *Attorney, Agent, or Firm* — JCIPRNET

(57) ABSTRACT

Proposed are an electrically conductive contact pin formed by stacking a plurality of metal layers and a manufacturing method therefor, in which the electrically conductive contact pin has improved physical or electrical characteristics.

19 Claims, 76 Drawing Sheets

(56) References Cited

FOREIGN PATENT DOCUMENTS

| | | |
|---|---|---|
| KR | 100449308 | 9/2004 |
| KR | 1020090068116 | 6/2009 |
| KR | 100970571 | 7/2010 |
| KR | 1020120038159 | 4/2012 |
| KR | 20150132657 | 11/2015 |
| KR | 1020170061314 | 6/2017 |
| KR | 101766261 | 8/2017 |
| KR | 101865756 | 6/2018 |
| KR | 1020200098622 | 8/2020 |
| TW | 1706139 | 10/2020 |
| WO | 2008075918 | 6/2008 |

OTHER PUBLICATIONS

"Decision to Grant a Patent of Korean Counterpart Application," issued on May 29, 2025, with English translation thereof, pp. 1-10.

"International Search Report (Form PCT/ISA/210) of PCT/KR2022/003948," mailed on Jun. 29, 2022, with English translation thereof, pp. 1-4.

* cited by examiner

ELECTRICALLY CONDUCTIVE CONTACT PIN AND MANUFACTURING METHOD THEREFOR

CROSS-REFERENCE TO RELATED APPLICATION

This application is a 371 application of an international PCT application serial no. PCT/KR2022/003948, filed on Mar. 22, 2022, which claims the priority benefit of Korean application KR10-2021-0041138, filed on Mar. 30, 2021. The entirety of the above-mentioned patent application is hereby incorporated by reference herein and made a part of this specification.

TECHNICAL FIELD

The present disclosure relates to an electrically conductive contact pin and a manufacturing method therefor.

BACKGROUND ART

Electrically conductive contact pins are contact pins that can be used in probe cards or test sockets that contact and inspect an object. Hereinafter, contact pins of a probe card will be described as an example.

A test for electrical characteristics of a semiconductor device is performed by approaching a wafer to a probe card having a plurality of electrically conductive contact pins and then bringing the respective electrically conductive contact pins into contact with corresponding electrode pads on the wafer. After the electrically conductive contact pins reach positions where they are brought into contact with the electrode pads, a process of further approaching the wafer to the probe card is performed. This process is called overdrive. Overdrive is a process that elastically deforms the electrically conductive contact pins. By overdrive, all electrically conductive contact pins can be reliably brought into contact with the electrode pads even when there is a height difference between the electrode pads or the electrically conductive contact pins. During overdrive, each electrically conductive contact pin is elastically deformed, and performs scrubbing while a tip thereof moves on an electrode pad. By such scrubbing, an oxide film on a surface of the electrode pad can be removed and contact resistance can be reduced thereby.

Meanwhile, electrically conductive contact pins may be manufactured using an MEMS process. A process of manufacturing an electrically conductive contact pin using the MEMS process involves first applying a photoresist to a surface of a conductive substrate and then patterning the photoresist. After that, a metal material is deposited within openings by electroplating using the photoresist as a mold, and the photoresist and the conductive substrate are removed to obtain electrically conductive contact pins. Here, each electrically conductive contact pin is formed by stacking a plurality of metal materials vertically. Since a metal material having relatively high wear resistance has relatively low electrical conductivity, when the electrically conductive contact pin is manufactured by stacking the plurality of metal materials, there is a trade-off relationship between wear resistance and electrical conductivity. In order to improve wear resistance at an end portion of the electrically conductive contact pin, a metal material having high wear resistance is required to have a large thickness, so the content of a metal material having relatively high electrical conductivity is reduced. As a result, the overall electrical conductivity of the electrically conductive contact pin is lowered, causing a problem of a decrease in current carrying capacity.

Meanwhile, the end portion of the electrically conductive contact pin is a part that is brought into contact with an object. When the electrically conductive contact pin is composed of the plurality of metal materials stacked vertically, it is difficult to vary only the content of the metal material at the end, so a problem arises in that it is difficult to improve physical or electrical properties at the end.

DOCUMENTS OF RELATED ART

Patent Documents (Patent Document 1) Korean Patent No. 10-0449308

SUMMARY OF INVENTION

Technical Problem

Accordingly, the present disclosure has been made keeping in mind the above problems occurring in the related art, and an objective of the present disclosure is to provide an electrically conductive contact pin formed by stacking a plurality of metal layers and a manufacturing method therefor, in which the electrically conductive contact pin has improved physical or electrical characteristics.

Technical Solution

In order to accomplish the above objective, according to one aspect of the present disclosure, there is provided an electrically conductive contact pin formed by stacking a plurality of horizontal metal layers. Here, at least one end portion of the electrically conductive contact pin may include a vertical metal layer formed in a stacking direction of the plurality of horizontal metal layers.

In addition, the vertical metal layer may be made of the same metal as a material of at least one of the horizontal metal layers.

In addition, the vertical metal layer may be made of a metal different from materials of the plurality of horizontal metal layers composed of different materials.

In addition, the vertical metal layer may be continuously formed from a lower surface to an upper surface of the electrically conductive contact pin in a thickness direction of the electrically conductive contact pin, and may be located at a center of the end portion of the electrically conductive contact pin in a width direction of the electrically conductive contact pin.

In addition, the vertical metal layer may be continuously formed from a lower surface to an upper surface of the electrically conductive contact pin in a thickness direction of the electrically conductive contact pin, and may be located at a side of the end portion of the electrically conductive contact pin in a width direction of the electrically conductive contact pin.

In addition, the vertical metal layer may include: a center vertical metal layer located at a center portion of the end portion of the electrically conductive contact pin; and a side vertical metal layer located at a side of the end portion of the electrically conductive contact pin.

Meanwhile, according to another aspect of the present disclosure, there is provided an electrically conductive contact pin. Here, at least one end portion of the electrically conductive contact pin may include: a first region in which a plurality of horizontal metal layers are stacked; and a second region in which a vertical metal layer is formed in a stacking direction of the horizontal metal layers. Here, the first region and the second region may have the same thickness.

In addition, the vertical metal layer may include an inner extension portion extending in a length direction of the electrically conductive contact pin to an inside of the electrically conductive contact pin.

In addition, the vertical metal layer may include an outer extension portion extending in a length direction of the electrically conductive contact pin to an outside of the electrically conductive contact pin and protruding from the end portion of the electrically conductive contact pin.

In addition, the vertical metal layer may have a width in a range of 10 μm to 40 μm.

In addition, the inner extension portion may have a length in a range of 100 μm to 400 μm.

In addition, the second region may have a higher hardness than an average hardness of the first region.

In addition, the second region may have a higher electrical conductivity than an average electrical conductivity of the first region.

Meanwhile, according to another aspect of the present disclosure, there is provided an electrically conductive contact pin, including a plurality of stacked horizontal metal layers including a first metal and second metals. Here, at at least one end portion of the electrically conductive contact pin, the second metals may be formed to be spaced apart in a width direction of the electrically conductive contact pin and the first metal may be formed between the spaced apart second metals.

In addition, the first metal may be made of a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, and the second metals may be made of a metal selected from the group consisting of copper (Cu), silver (Ag), gold (Au), and an alloy of these metals.

In addition, at the least one end portion of the electrically conductive contact pin, the first metal may be additionally formed to surround side surfaces of the second metals.

Meanwhile, according to another aspect of the present disclosure, there is provided an electrically conductive contact pin, including a plurality of stacked horizontal metal layers including a first metal and second metals. Here, at at least one end portion of the electrically conductive contact pin, the second metals may be formed to be spaced apart from each other and a third metal made of a metal different from materials of the first and second metals may be formed between the spaced apart second metals.

In addition, the first metal may be made of a metal selected from the group consisting of platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, the second metals may be made of a metal selected from the group consisting of copper (Cu), silver (Ag), gold (Au), and an alloy of these metals, and the third metal may be made of rhodium (Rh).

In addition, the first metal may be made of a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, the second metals may be made of a metal selected from the group consisting of copper (Cu), silver (Ag), and an alloy of these metals, and the third metal may be made of gold (Au).

Meanwhile, according to another aspect of the present disclosure, there is provided a method of manufacturing an electrically conductive contact pin having a structure in which at least one end portion of the electrically conductive contact pin includes a first region in which a plurality of horizontal metal layers are stacked and a second region in which a vertical metal layer is formed in a stacking direction of the horizontal metal layers. Here, each of the first region and the second region may be formed by plating using a mold.

In addition, the mold may be made of an anodic aluminum oxide film.

Advantageous Effects

The present disclosure provides an electrically conductive contact pin formed by stacking a plurality of metal layers and a manufacturing method therefor, in which the electrically conductive contact pin has improved physical or electrical characteristics.

DESCRIPTION OF EMBODIMENTS

Figure 1:
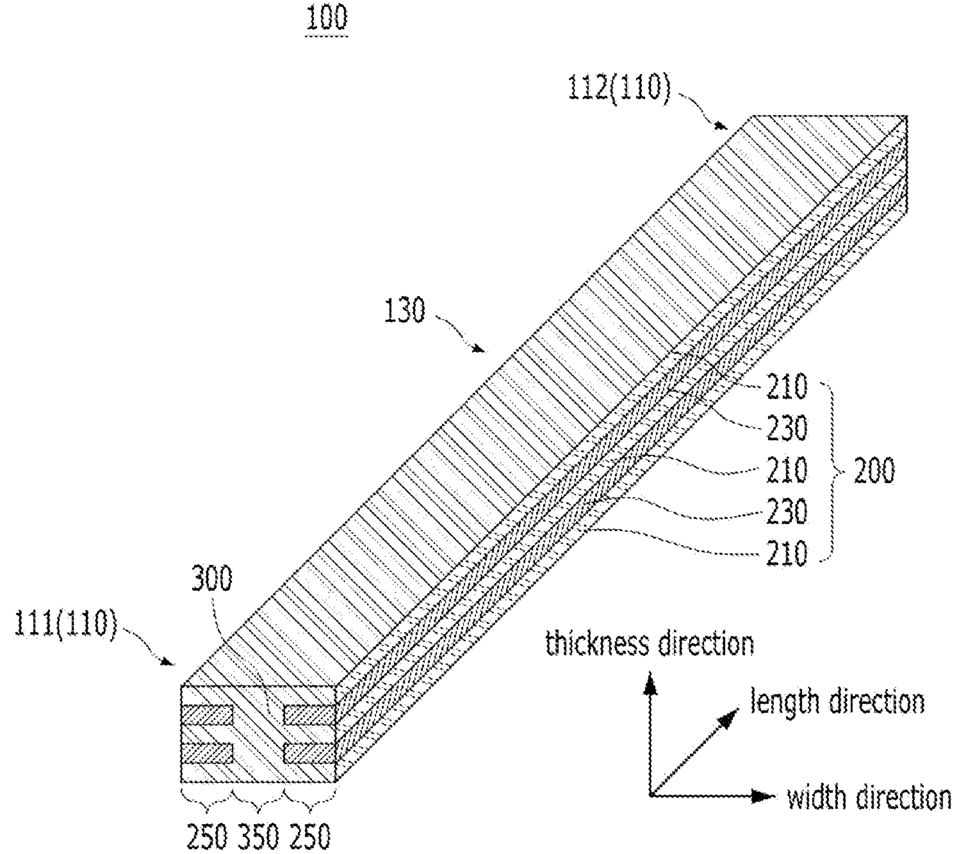
FIG. 1 is a perspective view illustrating an electrically conductive contact pin according to a first embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses of films and regions in the figures may be exaggerated. Therefore, variations from the shapes of the illustrations as a result, for example, of manufacturing techniques and/or tolerances, are to be expected. In addition, a limited number of electrically conductive contact pins are illustrated in the drawings by way of example. Thus, the embodiments should not be construed as limited to the particular shapes of regions illustrated herein but are to include deviations in shapes that result, for example, from manufacturing. The technical terms used herein are for the purpose of describing particular embodiments only and should not be construed as limiting the present disclosure. As used herein, the singular forms are intended to include the plural forms as well, unless the context clearly indicates otherwise. It will be further understood that the terms "comprise", "include". "have", etc. when used herein, specify the presence of stated features, integers, steps, operations, elements, components, and/or combinations thereof but do not preclude the presence or addition of one or more other features, integers, steps, operations, elements, components, and/or combinations thereof.

An electrically conductive contact pin 100 according to an embodiment of the present disclosure is provided in an inspection apparatus and is used to transmit electrical signals by making electrical and physical contact with an inspection object. The inspection apparatus may be an inspection apparatus used in a semiconductor manufacturing process, for example, a probe card or a test socket. However, the inspection apparatus according to the embodiment of the present disclosure is not limited thereto and includes any apparatus for checking whether the inspection object is defective by applying electricity. Hereinafter, a probe card will be described as an example of the inspection apparatus. A test for electrical characteristics of a semiconductor device is performed by approaching a wafer W to a probe card having a plurality of electrically conductive contact pins 100 and then bringing the respective electrically conductive contact pins 100 into contact with corresponding electrode pads WP on the wafer W. After the electrically conductive contact pins 100 reach positions where they are brought into contact with the electrode pads WP, the wafer W may be further lifted by a predetermined height toward the probe card. The electrically conductive contact pins 100 have a structure elastically deformable between an upper guide plate and a lower guide plate. These electrically conductive contact pins 100 are adopted to constitute a vertical probe card. As an embodiment of the present disclosure, the electrically conductive contact pin 100 has a pre-deformed structure, that is, a cobra pin shape, or a structure for deforming a straight pin by moving an upper, lower, or additional guide plate.

An electrically conductive contact pin 100 according to an embodiment of the present disclosure has a multi-layer structure in which a plurality of horizontal metal layers 200 are stacked. Since the electrically conductive contact pin 100 sends current while being elastically deformed by an external force, the horizontal metal layers 200 include metals of different materials, such as a metal having high electrical conductivity and a metal having high elasticity. At least one end portion 110 of the electrically conductive contact pin 100 includes a vertical metal layer 300 formed in a direction in which the horizontal metal layers 200 are stacked (thickness direction of the electrically conductive contact pin 100). The vertical metal layer 300 may be made of the same metal as the material of at least one of the horizontal metal layers made of different materials or a metal different from the materials of the horizontal metal layers made of different materials. The vertical metal layer 300 is continuously formed from a lower surface to an upper surface of the electrically conductive contact pin 100 in the thickness direction of the electrically conductive contact pin 100.

The end portion 110 of the electrically conductive contact pin 100 is a part that is brought into contact with an object. With the configuration of the vertical metal layer 300 provided at the end portion 110, the physical or electrical characteristics of the end portion 110 can be improved. In addition, by increasing the content of a metal having high wear resistance or high hardness in the end portion 110 of the electrically conductive contact pin 100, the content of a metal having high electrical conductivity can be increased in a body portion 130 of the electrically conductive contact pin 100. Thus, it is possible to improve the overall current carrying capacity.

Hereinafter, exemplary embodiments of the present disclosure will be described in detail with reference to the accompanying drawings. Wherever possible, the same reference numerals will be used throughout different embodiments and the description to refer to the same or like elements or parts. In addition, the configuration and operation already described in other embodiments will be omitted for convenience.

First Embodiment

Hereinafter, an electrically conductive contact pin 100 according to the first embodiment of the present disclosure will be described with reference to FIGS. 1 to 7B. FIG. 1 is a perspective view illustrating the electrically conductive contact pin 100 according to the first embodiment of the present disclosure. FIGS. 2A to 6E are views illustrating a manufacturing method for the electrically conductive contact pin 100 according to the first embodiment of the present disclosure. FIGS. 7A and 7B are perspective views illustrating a first end portion 111 (FIG. 7A) are and a second end portion 112 (FIG. 7B of the electrically conductive contact pin 100 according to the first embodiment of the present disclosure.

The electrically conductive contact pin 100 according to the first embodiment of the present disclosure includes an end portion 110 including the first end portion 111 and the second end portion 112, and a body portion 130 provided between the first and second end portions 111 and 112. The first end portion 111 is a part that is brought into contact with an inspection object, and the second end portion 112 is a part that is brought into contact with or connected to a part of components of an inspection apparatus. Alternatively, the second end portion 112 may be a part that is brought into contact with an inspection object, and the first end portion 111 may be a part that is brought into contact with or connected to a part of components of an inspection apparatus.

The electrically conductive contact pin 100 according to the first embodiment of the present disclosure is formed by stacking a plurality of horizontal metal layers 200. The first end portion 111 of the electrically conductive contact pin 100 includes a vertical metal layer 300 formed in a direction in which the horizontal metal layers 200 are stacked. The vertical metal layer 300 is continuously formed from a lower surface to an upper surface of the electrically conductive contact pin 100 in the thickness direction of the electrically conductive contact pin 100. In addition, the vertical metal layer 300 is located at a center of the first end portion 111 of the electrically conductive contact pin 100 in the width direction of the electrically conductive contact pin 100.

The horizontal metal layers 200 may include a first metal 210 and a second metal 230. The first metal 210 may be a metal having relatively high wear resistance or hardness compared to the second metal 230, and the second metal 230 may be a metal having relatively high electrical conductivity compared to the first metal 210. The first metal 210 may be a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. The second metal 230 may be a metal selected from the group consisting of copper (Cu), silver (Ag), and gold (Au). Here, the first and second metals 210 and 230 may include other metals or alloys in addition to the above-described metals or alloys, and are not limited to the above-described exemplary materials.

In order to improve wear resistance of the electrically conductive contact pin 100, the lowermost and uppermost layers among the horizontal metal layers 200 are formed by the first metal 210. The horizontal metal layers 200 may be formed by alternately stacking the first metal 210, the second metal 230, and the first metal 210 sequentially from the bottom. The horizontal metal layers 200 may be provided as at least three layers, and may be provided as three or more odd-numbered layers. However, the number of the horizontal metal layers 200 is not limited thereto.

The first end portion 111 of the electrically conductive contact pin 100 includes the vertical metal layer 300 formed in the stacking direction of the horizontal metal layers 200. Since the stacking direction of the horizontal metal layers 200 corresponds to the thickness direction of the electrically conductive contact pin 100, the vertical metal layer 300 is formed in the thickness direction of the electrically conductive contact pin 100.

The vertical metal layer 300 is made of the same metal as at least one of the metals constituting the horizontal metal layers 200. The vertical metal layer 300 may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. Preferably, the vertical metal layer 300 may be made of the same material as the material of the first metal 210.

The first end portion 111 of the electrically conductive contact pin 100 includes opposite first regions 250 and a second region 350 in the width direction of the first end portion 111 of the electrically conductive contact pin 100. The first regions 250 and the second region 350 mean regions dividing the first end portion 111 of the electrically conductive contact pin 100 in the width direction. The first regions 250 are regions in which the horizontal metal layers 200 including the first metal 210 and the second metal 230 are stacked. The second region 350 is a region in which the vertical metal layer 300 made of a single material is formed. The first regions 250 and the second region 350 are formed to have the same thickness.

The second region 350 is provided between the first regions 250 so that the vertical metal layer 300 is located at the center of the first end portion 111 of the electrically conductive contact pin 100. With the configuration in which second metals 230 are spaced apart in the width direction at the first end portion 111 of the electrically conductive contact pin 100 and the first metal 210 is provided between the spaced second metals 230, the second region 350 has relatively high wear resistance or hardness compared to the first regions 250. In other words, the second region 350 has a higher hardness than the average hardness of the first regions 250 or has higher wear resistance than that of the first regions 250. By increasing the content of a metal having high wear resistance or high hardness in the end portion 110 of the electrically conductive contact pin 100, the content of a metal having high electrical conductivity can be increased in the body portion 130 of the electrically conductive contact pin 100. Thus, it is possible to improve the overall current carrying capacity of the electrically conductive contact pin 100. As described above, not only the wear resistance of the first end portion 111 can be improved, but also the current carrying capacity of the electrically conductive contact pin 100 can be improved.

The vertical metal layer 300 includes an inner extension portion 310 extending in the length direction of the electrically conductive contact pin 100 to the inside of the electrically conductive contact pin 100. Since the vertical metal layer 300 is made of the same material as the material of the first metal 210, it is not easy to visually distinguish the vertical metal layer 300 from the horizontal metal layers 200. However, with the configuration of the inner extension portion 310, the region with the inner extension portion 310 is defined as the vertical metal layer 300, and the region without the inner extension portion 310 is defined as the horizontal metal layers 200.

The inner extension portion 310 has a length in the range of 100 μm to 400 μm. The electrically conductive contact pin 100 may be used by being inserted into a guide plate of a probe card. In this case, the first end portion 111 of the electrically conductive contact pin 100 protrudes from the bottom of the guide plate (lower guide plate). When the electrically conductive contact pin 100 is used for a long period of time and a number of times in this state, foreign substances stick to the first end portion 111. To remove the foreign substances, a process of grinding the first end portion 111 is performed. Due to the process of grinding the first end portion 111, the length of the electrically conductive contact pin 100 is shortened. A protruding length of the electrically conductive contact pin 100 from the bottom the guide plate (lower guide plate) is preferably in the range of 100 μm to 400 μm. When the protruding length becomes less than 100 μm as a result of the grinding process, the electrically conductive contact pin 100 is replaced with a new one. With the configuration in which the length of the inner extension portion 310 ranges from 100 μm to 400 μm, even when the first end portion 111 is ground in the range of 100 μm to 400 μm, it is possible to make the vertical metal layer 300 exist at the first end portion 111. Thus, the cross-sectional shape of the electrically conductive contact pin 100 can be maintained in an initial state.

In performing the grinding process, when the inner extension portion 310 no longer exists, it is preferable to replace the electrically conductive contact pin 100 with a new one.

Meanwhile, hundreds to thousands of guide holes are formed in the guide plate. The electrically conductive contact pin 100 is inserted into each of the guide holes. The vertical metal layer 300 has a width in the range of 10 μm to 40 μm in consideration of manufacturing tolerance of the guide holes of the guide plate and alignment error between the electrically conductive contact pin 100 and the inspection object. With this range, it is possible to enable the vertical metal layer 300 of the second region 350 to make contact with the inspection object even when a horizontal position error occurs between the first end portion 111 of the electrically conductive contact pin 100 and the inspection object.

The electrically conductive contact pin 100 has a structure in which at least the end portion 110 includes the first regions 250 in which the horizontal metal layers 200 are stacked and the second region 350 in which the vertical metal layer 300 is formed in the stacking direction of the horizontal metal layers 200. In a manufacturing method for the electrically conductive contact pin, each of the first regions 250 and the second region 350 is formed by plating using a mold.

Hereinafter, a manufacturing method for the electrically conductive contact pin 100 according to the first embodiment of the present disclosure will be described with reference to FIGS. 2A to 6E.

Figure 2A:
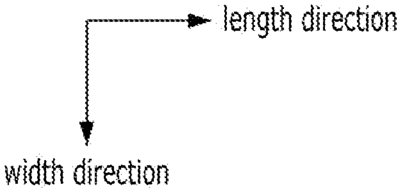
FIGS. 2A to 6E are views illustrating a manufacturing method for the electrically conductive contact pin according to the first embodiment of the present disclosure.
Figure 2A:
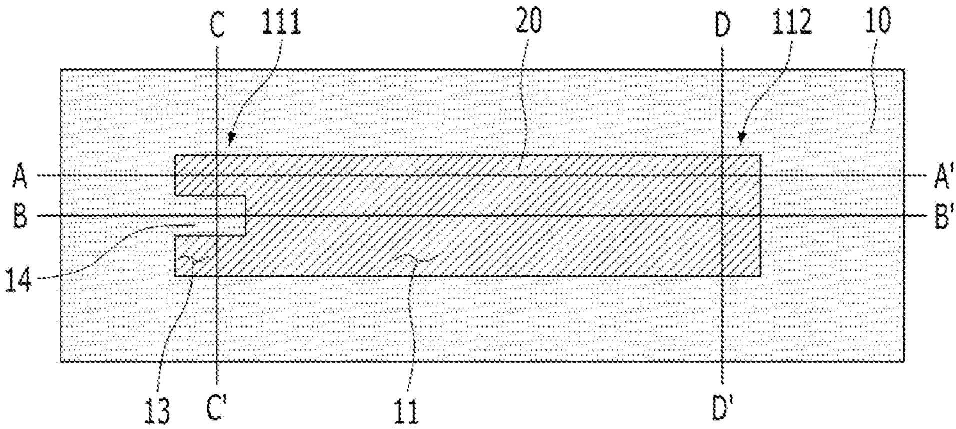
Figure 2B:
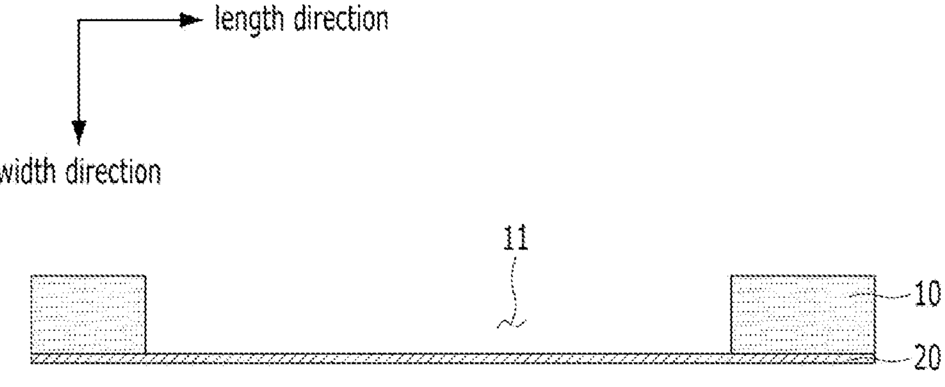
Figure 2C:
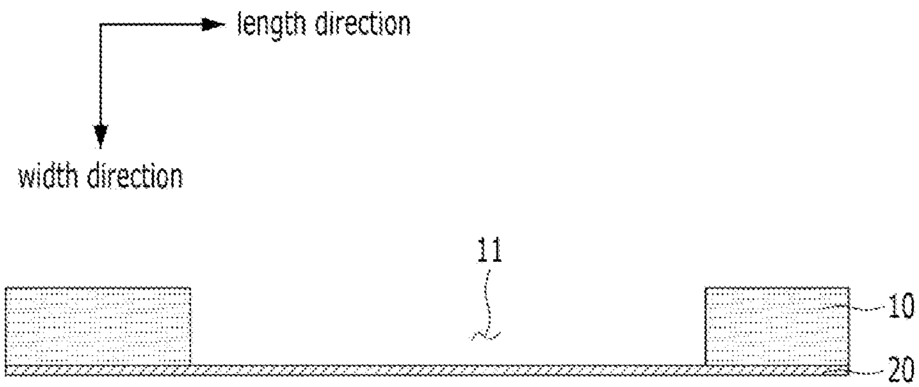
Figure 2D:
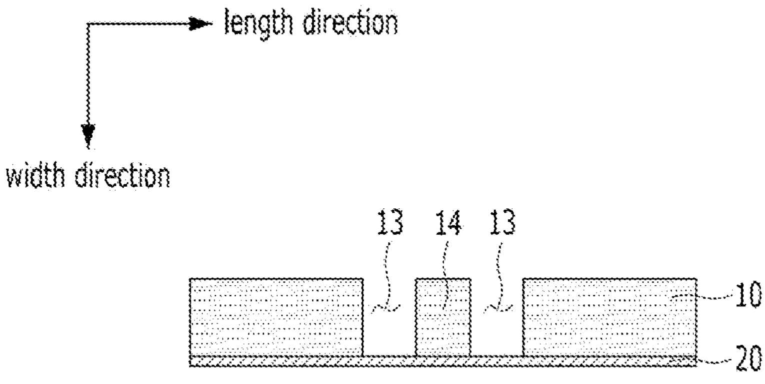
Figure 2E:
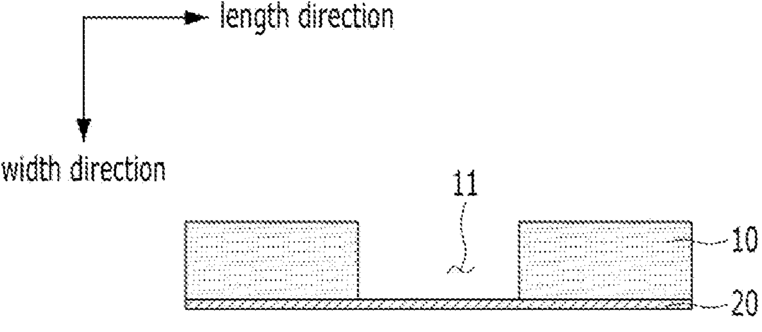

Referring to FIGS. 2A, 2B, 2C, 2D, and 2E, FIG. 2A is a plan view illustrating a mold 10 in which an inner space 11 is formed, FIG. 2B is a sectional view taken along line A-A' of FIG. 2A, FIG. 2C is a sectional view taken along line B-B' of FIG. 2A. FIG. 2D is a sectional view taken along line C-C' of FIG. 2A, and FIG. 2E is a sectional view taken along line D-D' of FIG. 2A.

The manufacturing method for the electrically conductive contact pin 100 described below includes the steps of: forming a plurality of horizontal metal layers 200 in the inner space 11 by plating using the mold 10 having the inner space 11 formed therein; and forming an additional space 15 by removing a part of the mold 10 in a region corresponding to at least one end portion of the electrically conductive contact pin 100 and forming a vertical metal layer 300 in the additional space 15 by plating.

Referring to FIGS. 2A, 2B, 2C, 2D, and 2E, the inner space 11 is formed in the mold 10, and a seed layer 20 is provided under the mold 10.

The mold 10 may be made of an anodic aluminum oxide film, a photoresist, a silicon wafer, or a material similar thereto. However, a preferred material for the mold 10 is the anodic aluminum oxide film. The anodic aluminum oxide film means a film formed by anodizing a metal as a base material, and pores mean holes formed in the process of forming the anodic aluminum oxide film by anodizing the metal. For example, when the metal as the base material is aluminum (Al) or an aluminum alloy, the anodization of the base material forms the anodic aluminum oxide film consisting of anodized aluminum ($Al_2O_3$) on a surface of the base material. The resulting anodic aluminum oxide film includes a barrier layer in which no pores are formed therein vertically, and a porous layer in which pores are formed therein. After removing the base material on which the anodic aluminum oxide film having the barrier layer and the porous layer is formed, only the anodic aluminum oxide film consisting of anodized aluminum ($Al_2O_3$) remains. The anodic aluminum oxide film may have a structure in which the barrier layer formed during the anodization is removed to expose the top and bottom of the pores, or a structure in which the barrier layer formed during the anodization remains to close one of the top and bottom of the pores.

The anodic aluminum oxide film has a coefficient of thermal expansion of 2 to 3 ppm/° C. With this range, the anodic aluminum oxide film only undergoes a small amount of thermal deformation due to temperature when exposed to a high temperature environment. Thus, even when the electrically conductive contact pin 100 is manufactured in a high temperature environment, a precise electrically conductive contact pin 100 can be manufactured without thermal deformation.

Since the electrically conductive contact pin 100 according to the embodiment of the present disclosure is manufactured using the mold 10 made of the anodic aluminum oxide film instead of a photoresist mold, there is an effect of realizing shape precision and a fine shape, which were limited in realization with the photoresist mold.

The seed layer 20 is provided on a lower surface of the mold 10. The seed layer 20 may be provided on the lower surface of the mold 10 before the inner space 11 is formed in the mold 10. Meanwhile, a support substrate (not illustrated) is formed under the mold 10 to improve handling of the mold 10. In this case, the seed layer 20 may be formed on an upper surface of the support substrate, and then the mold 10 having the inner space 11 may be coupled to the support substrate. The seed layer 20 may be made of copper (Cu), and may be formed by a deposition method. The seed layer 20 is used to improve the plating quality of the horizontal metal layers 200 when the horizontal metal layers 200 are formed using an electroplating method.

The inner space 11 may be formed by wet-etching the mold 10 made of the anodic aluminum oxide film. To this end, a photoresist may be provided on the upper surface of the mold 10 and patterned, and then the anodic aluminum oxide film in a patterned and open area may react with an etchant to form the inner space 11. In detail, after a photosensitive material is provided on the upper surface of the mold 10 in a state before the inner space 11 is formed, exposure and development processes may be performed. At least a portion of the photosensitive material may be patterned and removed to form an open area through the exposure and development processes. As a result of etching the mold 10 made of the anodic aluminum oxide film through the open area where the photosensitive material is removed by the patterning process, a part of the anodic aluminum oxide film at a position corresponding to the inner space 11 is removed by the etchant to form the inner space 11.

The inner space 11 formed in the mold 10 includes an end extension space 13 at a position corresponding to a first end portion 111 of the electrically conductive contact pin 100. Two end extension spaces 13 are formed in the width direction of the electrically conductive contact pin 100. A sacrificial mold portion 14 to be removed later is located between the two end extension spaces 13. The sacrificial mold portion 14 is a part of the mold 10 that is removed after the horizontal metal layers 200 are formed.

Figure 3A:
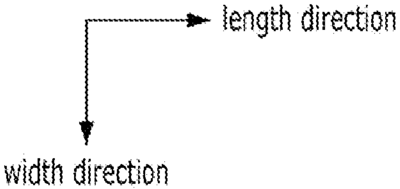
Figure 3A:
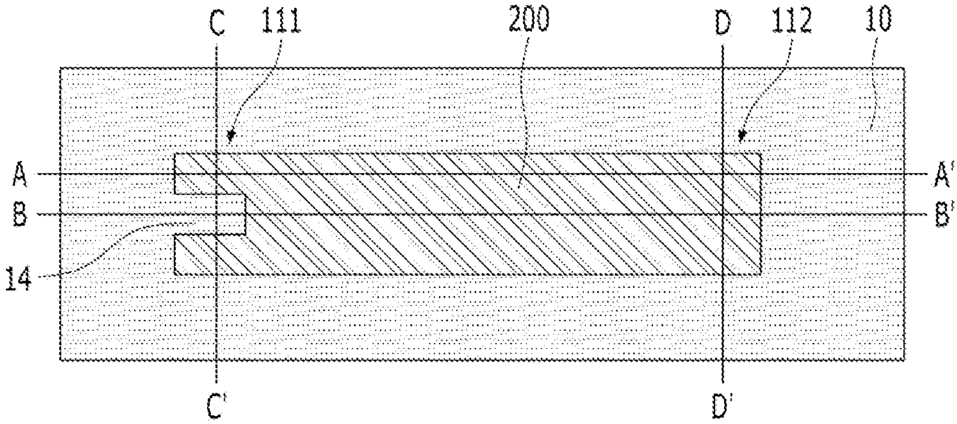
Figure 3B:
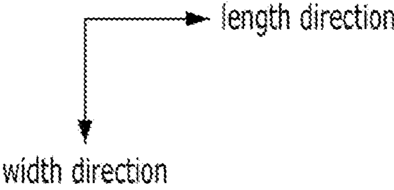
Figure 3B:
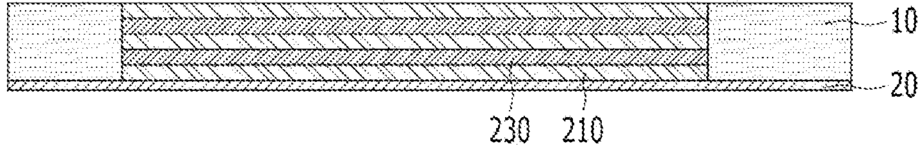
Figure 3C:
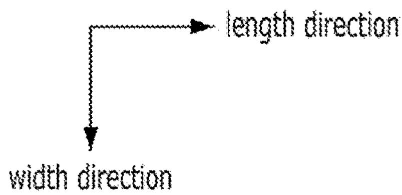
Figure 3C:
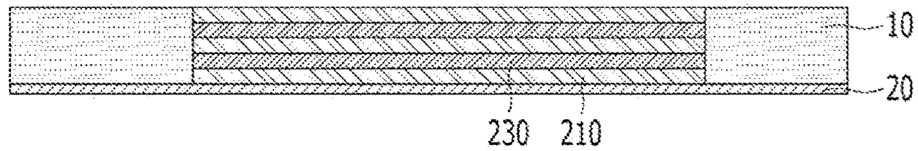
Figure 3D:
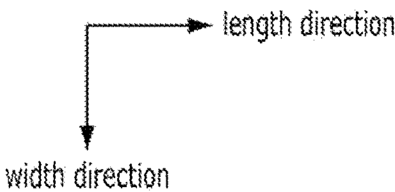
Figure 3D:
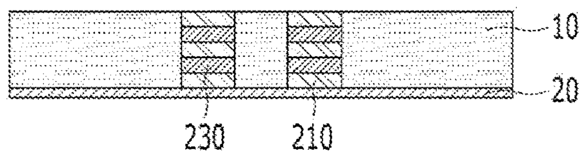
Figure 3E:
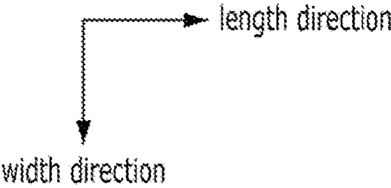
Figure 3E:
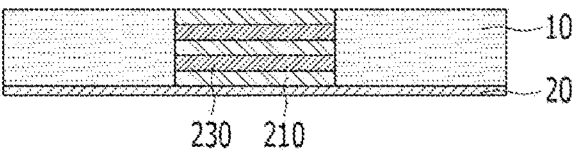

Next, referring to FIGS. 3A, 3B, 3C, 3D, and 3E, FIG. 3A is a plan view illustrating the mold 10 in which the horizontal metal layers 200 are formed in the inner space 11. FIG. 3B is a sectional view taken along line A-A' of FIG. 3A, FIG. 3C is a sectional view taken along line B-B' of FIG. 3A. FIG. 3D is a sectional view taken along line C-C' of FIG. 3A, and FIG. 3E is a sectional view taken along line D-D' of FIG. 3A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au). For example, a first metal 210 made of a palladium-cobalt (PdCo) alloy and a second metal 230 made of copper (Cu) may be alternately stacked. Here, the first metal 210 enables the electrically conductive contact pin 100 to be elastically deformed, and the second metal 230 improves the current carrying capacity (CCC) of the electrically conductive contact pin 100.

After the plating process is completed, a planarization process may be performed. The metal protruding from the upper surface of the mold 10 is removed and planarized through a chemical mechanical polishing (CMP) process.

Figure 4A:
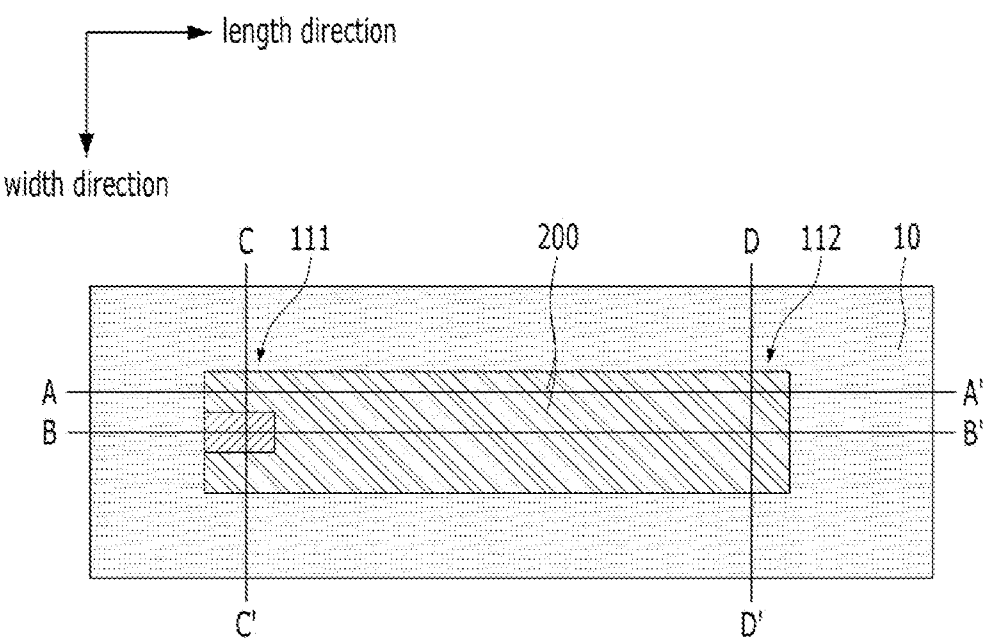
Figure 4B:
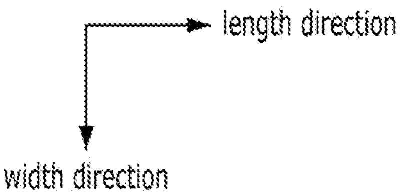
Figure 4B:
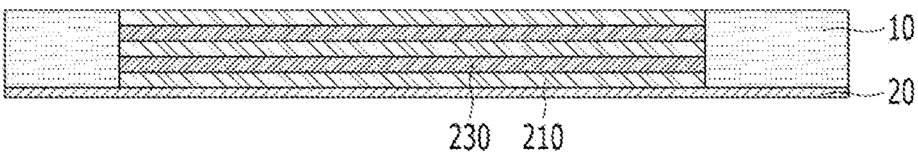
Figure 4C:
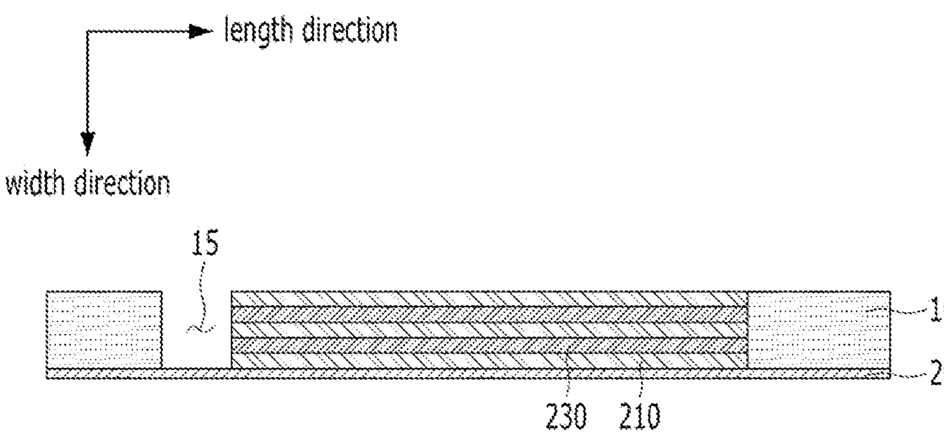
Figure 4D:
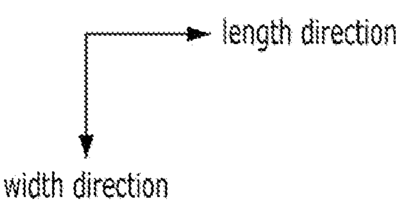
Figure 4D:
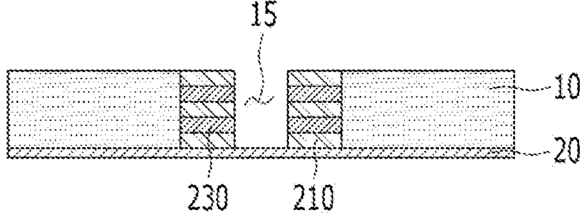
Figure 4E:
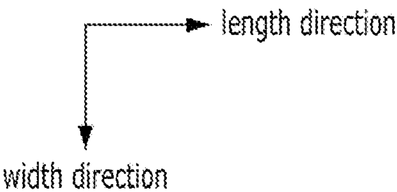
Figure 4E:
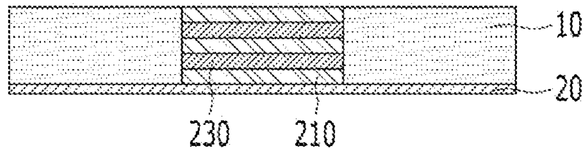

Next, referring to FIGS. 4A, 4B, 4C, 4D, and 4E, FIG. 4A is a plan view illustrating the mold 10 in which the additional space 15 is formed by removing the sacrificial mold portion 14. FIG. 4B is a sectional view taken along line A-A' of FIG. 4A, FIG. 4C is a sectional view taken along line B-B' of FIG. 4A. FIG. 4D is a sectional view taken along line C-C' of FIG. 4A, and FIG. 4E is a sectional view taken along line D-D' of FIG. 4A.

The step of removing the sacrificial mold portion 14 is performed. The additional space 15 is formed in the mold 10 by removing the sacrificial mold portion 14. In detail, after a photosensitive material is provided on the upper surface of the mold 10, exposure and development processes may be performed. At least a portion of the photosensitive material may be patterned and removed to form an open area through the exposure and development processes. As a result of etching through the open area where the photosensitive material is removed by the patterning process, the sacrificial mold portion 14 is removed by an etchant to form the additional space 15.

The stacked horizontal metal layers 200 are exposed through three side surfaces of the additional space 15, and the mold 10 is exposed through one side surface of the additional space.

Figure 5A:
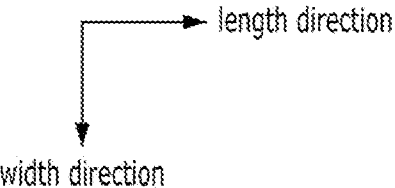
Figure 5A:
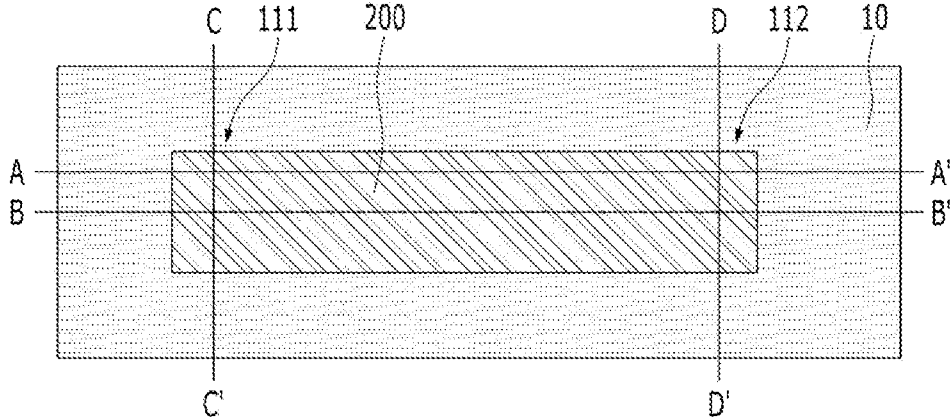
Figure 5B:
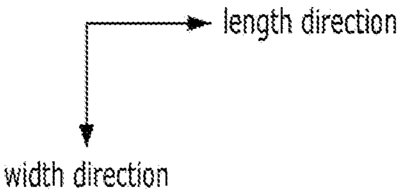
Figure 5B:
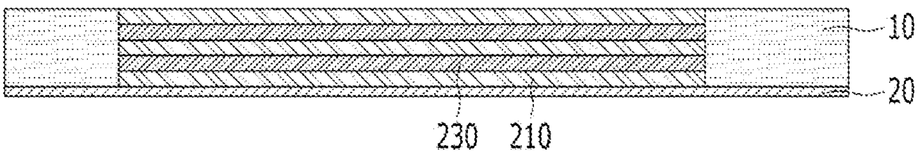
Figure 5C:
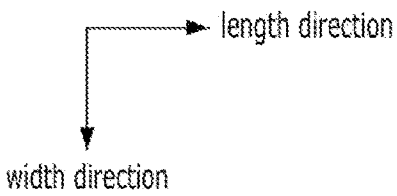
Figure 5C:
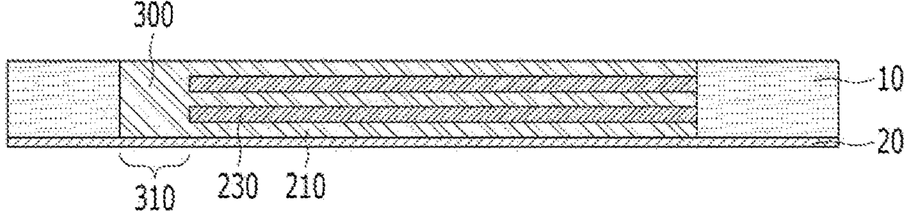
Figure 5D:
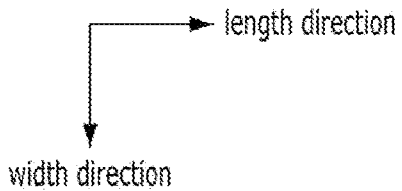
Figure 5D:
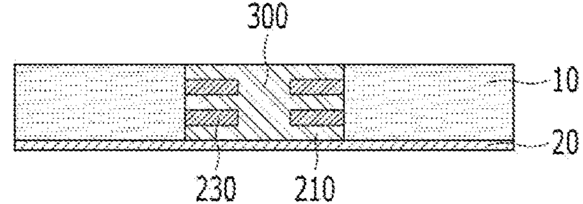
Figure 5E:
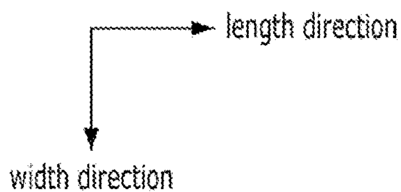
Figure 5E:
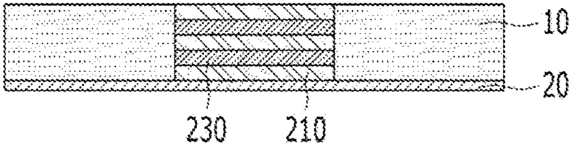

Next, referring to FIGS. 5A, 5B, 5C, 5D, and 5E, FIG. 5A is a plan view illustrating the mold 10 in which the vertical metal layer 300 is formed at the first end portion 111. FIG. 5B is a sectional view taken along line A-A' of FIG. 5A, FIG. 5C is a sectional view taken along line B-B' of FIG. 5A, FIG. 5D is a sectional view taken along line C-C' of FIG. 5A, and FIG. 5E is a sectional view taken along line D-D' of FIG. 5A.

The step of forming the vertical metal layer 300 is performed. The vertical metal layer 300 is formed in the additional space 15 formed in the previous step by electroplating.

The vertical metal layer 300 is integrated with the horizontal metal layers 200 formed in the previous step. As described above, the horizontal metal layers 200 are exposed through three side surfaces of the additional space 15. The vertical metal layer 300 is integrated with the stacked horizontal metal layers 200 on these side surfaces.

The vertical metal layer 300 may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. Preferably, the vertical metal layer may be made of the same material as the material of the first metal 210. For example, when the first metal 210 is made of a palladium-cobalt (PdCo) alloy, the vertical metal layer 300 may also be made of a palladium-cobalt (PdCo) alloy.

Figure 6A:
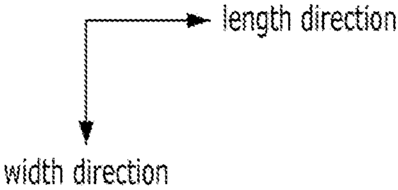
Figure 6A:
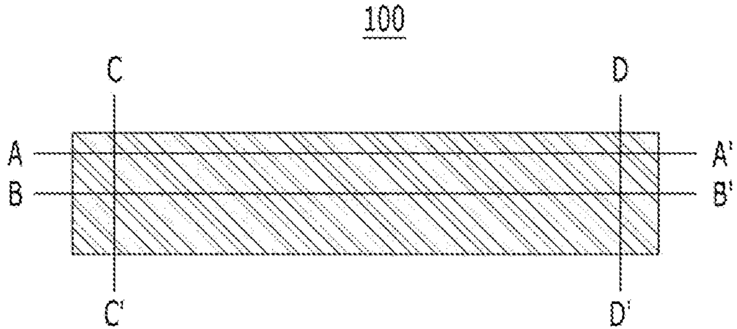
Figure 6B:
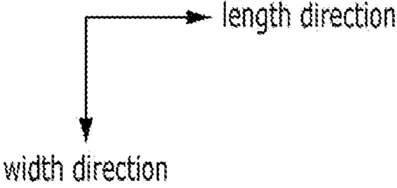
Figure 6B:
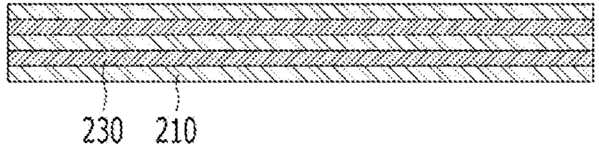
Figure 6C:
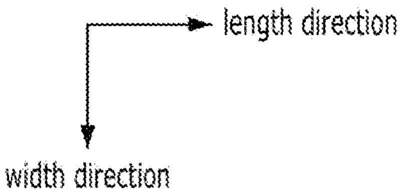
Figure 6C:
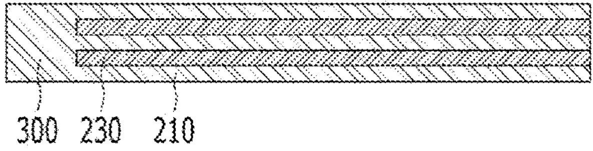
Figure 6D:
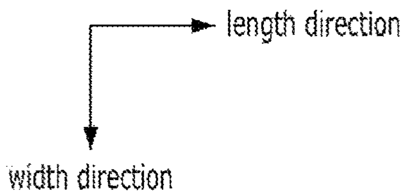
Figure 6D:
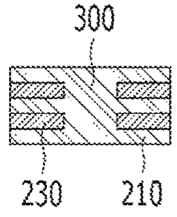
Figure 6E:
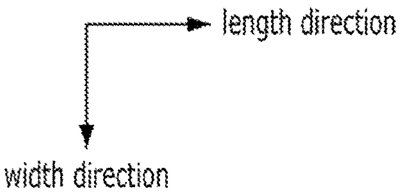
Figure 6E:
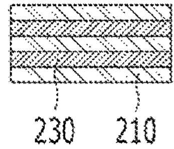
Figure 7A:
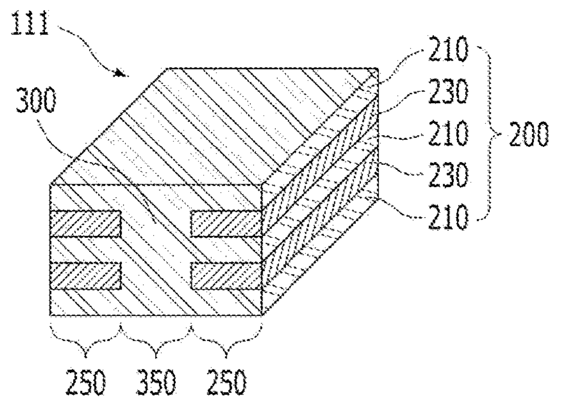
FIG. 7A is a perspective view illustrating a first end portion of the electrically conductive contact pin according to the first embodiment of the present disclosure.
Figure 7B:
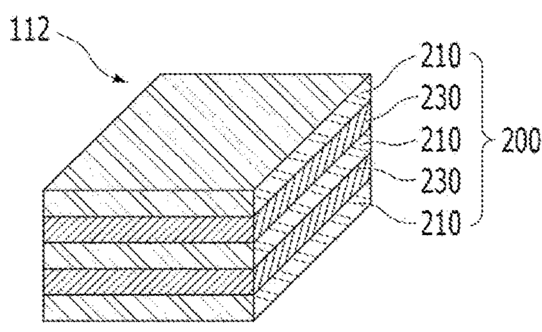
FIG. 7B is a perspective view illustrating a second end portion of the electrically conductive contact pin according to the first embodiment of the present disclosure.

Next, referring to FIGS. 6A, 6B, 6C. 6D, and 6E, FIG. 6A is a plan view illustrating the electrically conductive contact pin 100, FIG. 6B is a sectional view taken along line A-A' of FIG. 6A. FIG. 6C is a sectional view taken along line B-B' of FIG. 6A, FIG. 6D is a sectional view taken along line C-C' of FIG. 6A, and FIG. 6E is a sectional view taken along line D-D' of FIG. 6A.

The step of removing the mold 10 and the seed layer 20 is performed after the previous step. When the mold 10 is made of the anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

In the above description, it has been described that the step of forming the horizontal metal layers 200 in the inner space 11 by plating using the mold 10 having the inner space 11 formed therein is performed first, and then the step of forming the additional space 15 by removing the part of the mold 10 in the region corresponding to at least one end portion of the electrically conductive contact pin 100 and forming the vertical metal layer 300 in the additional space 15 by plating is performed. However, the manufacturing method for the electrically conductive contact pin according to the first embodiment of the present disclosure is not limited to the above order. For example, the step of forming the additional space 15 by removing the part of the mold 10 in the region corresponding to at least one end portion of the electrically conductive contact pin 100 and forming the vertical metal layer 300 in the additional space 15 by plating may be performed first, and then the step of forming the horizontal metal layers 200 in the inner space 11 by plating using the mold 10 having the inner space 11 formed therein may be performed.

FIG. 7A is a perspective view illustrating a front surface, that is, the first end portion 111, of the electrically conductive contact pin 100 according to the first embodiment of the present disclosure, and FIG. 7B is a perspective view illustrating a rear surface, that is, a second end portion 112, of the electrically conductive contact pin 100 according to the first embodiment of the present disclosure.

While the second end portion 112 is composed of only the horizontal metal layers 200, the first end portion 111 is composed of both the horizontal metal layers 200 and the vertical metal layer 300 unlike the second end portion 112.

The horizontal metal layers 200 are formed by stacking the first metal 210 and the second metal 230. The first metal may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. The second metal 230 may be selected from the group consisting of copper (Cu), silver (Ag), and gold (Au). The vertical metal layer 300 may be made of the same material as the material of the first metal 210. In this case, the second end portion 112 has a configuration in which the first metal 210 and the second metal 230 are alternately spaced apart from each other only in the thickness direction of the electrically conductive contact pin 100, and the first end portion 111 has a configuration in which second metals 230 are spaced apart from each other not only in the thickness direction of the electrically conductive contact pin 100 but also in the width direction of the electrically conductive contact pin 100 and the first metal 210 exists at a position where the second metals 230 are spaced apart from each other in the width direction. At the first end portion 111, the first metal 210 is continuous not only in the thickness direction of the electrically conductive contact pin 100 but also in the width direction of the electrically conductive contact pin 100.

The vertical metal layer 300 includes an inner extension portion 310 extending inside the first end portion 111 in the length direction of the electrically conductive contact pin 100 by a length of 100 μm to 400 μm. The second metals 230 are spaced apart from each other in the width direction by the width (10 μm to 40 μm) of the inner extension portion 310 within the length (100 μm to 400 μm) of the inner extension portion 310.

By increasing the content of a metal having high wear resistance or high hardness in the first end portion 111 of the electrically conductive contact pin 100 with the configuration of the vertical metal layer 300, it is possible to improve the wear resistance or hardness characteristics of the first end portion 111 and at the same time increase the content of a metal having high electrical conductivity in a body portion 130 of the electrically conductive contact pin 100, thereby improving the current carrying capacity.

In addition, since the first end portion 111 is not composed only of the metal having high wear resistance or high hardness, but also the metal having high electrical conductivity, it is possible to lower the contact resistance compared to configuring a tip portion only with a metal having high wear resistance or high hardness.

In addition, since the vertical metal layer 300 having a length of 100 μm to 400 μm exists in the electrically conductive contact pin 100 in the length direction thereof, it is possible to implement the same cross-sectional structure even when the first end portion 111 is shortened to the length of 100 μm to 400 μm. With this configuration, it is possible to reuse the first end portion 111 by grinding it within the range of 100 μm to 400 μm.

Second Embodiment

Next, a second embodiment according to the present disclosure will be described. However, the embodiments described below will be mainly described in terms of characteristic elements in comparison with the first embodiment, and descriptions of the same or similar elements to the first embodiment will be omitted.

Hereinafter, an electrically conductive contact pin 100 according to the second embodiment of the present disclosure will be described with reference to FIGS. 8 to 14B.

Figure 8:
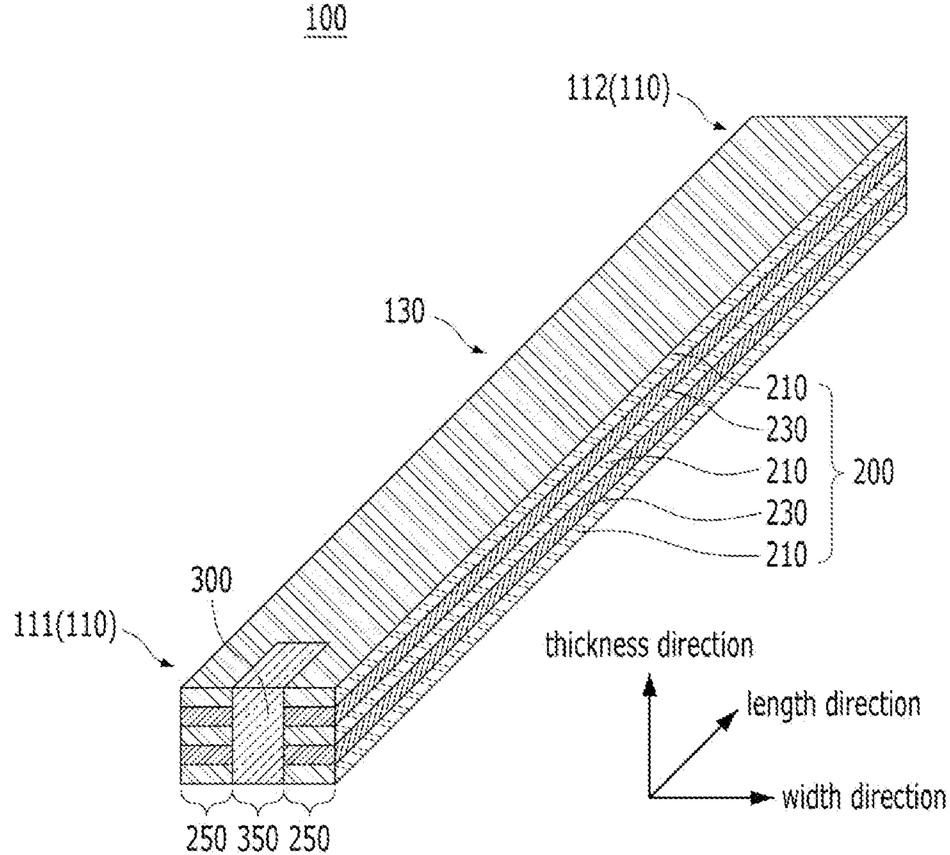
FIG. 8 is a perspective view illustrating an electrically conductive contact pin according to a second embodiment of the present disclosure.

FIG. 8 is a perspective view illustrating the electrically conductive contact pin 100 according to the second embodiment of the present disclosure. FIGS. 9A to 13E are views illustrating a manufacturing method for the electrically conductive contact pin 100 according to the second embodiment of the present disclosure. FIGS. 14A and 14B are perspective views illustrating a first end portion 111 (FIG. 14A) and a second end portion 112 (FIG. 14B) of the electrically conductive contact pin 100 according to the second embodiment of the present disclosure.

The electrically conductive contact pin 100 according to the second embodiment of the present disclosure is different from the electrically conductive contact pin 100 according to the first embodiment in that a vertical metal layer 300 is made of a metal different from the materials of a plurality of horizontal metal layers 200.

The horizontal metal layers 200 are formed by stacking a first metal 210 and a second metal 230. The first metal may be selected from the group consisting of platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. The second metal may be selected from the group consisting of copper (Cu), silver (Ag), and gold (Au).

The vertical metal layer 300 according to the second embodiment includes a third metal 330 made of a material different from the materials of the horizontal metal layers 200, and may be made of a metal having excellent wear resistance or hardness. For example, the third metal 330 constituting the vertical metal layer 300 may be made of rhodium (Rh). With this configuration, it is possible to further improve the wear resistance or hardness characteristics of the first end portion 111.

The first end portion 111 of the electrically conductive contact pin 100 includes opposite first regions 250 and a second region 350 in the width direction of the first end portion 111 of the electrically conductive contact pin 100. The first regions are regions in which the horizontal metal layers 200 are stacked, and the second region is a region in which the vertical metal layer 300 is formed. The first regions 250 and the second region 350 mean regions dividing the first end portion 111 of the electrically conductive contact pin 100 in the width direction. The first regions 250 and the second region 350 are formed to have the same thickness.

The second region 350 is provided between the first regions 250 so that the vertical metal layer 300 is located at the center of the first end portion 111 of the electrically conductive contact pin 100. The second region 350 is a region having relatively high wear resistance or hardness compared to the first regions 250. In other words, the second region 350 has a higher hardness than the average hardness of the first regions 250 or has higher wear resistance than that of the first regions 250. By increasing the content of a metal having high wear resistance or high hardness in the end portion 110 of the electrically conductive contact pin 100, the content of a metal having high electrical conductivity can be increased in a body portion 130 of the electrically conductive contact pin 100. Thus, it is possible to improve the overall current carrying capacity of the electrically conductive contact pin 100.

Hereinafter, a manufacturing method for the electrically conductive contact pin 100 according to the second embodiment of the present disclosure will be described with reference to FIGS. 9A to 13E.

Figure 9A:
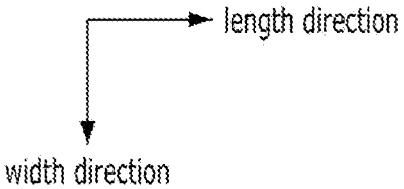
FIGS. 9A to 13E are views illustrating a manufacturing method for the electrically conductive contact pin according to the second embodiment of the present disclosure.
Figure 9A:
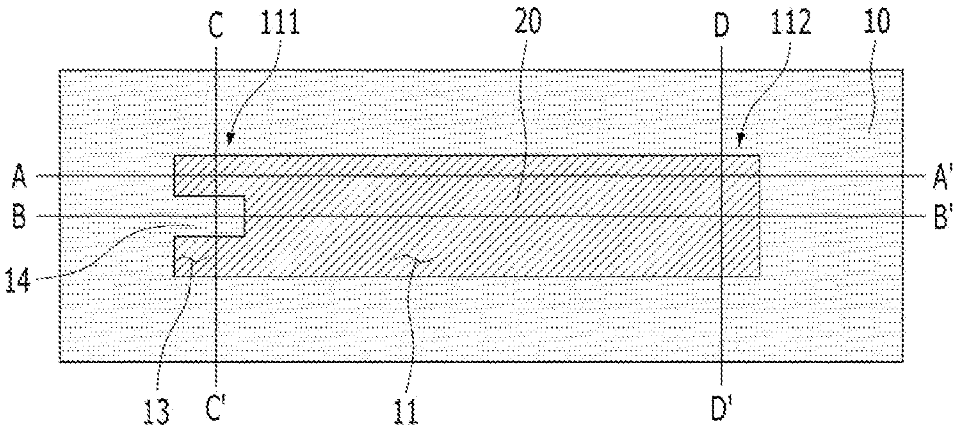
Figure 9B:
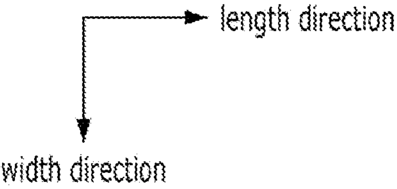
Figure 9B:
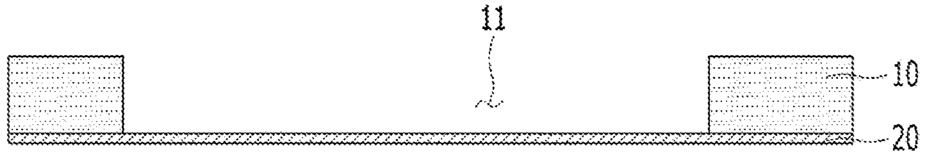
Figure 9C:
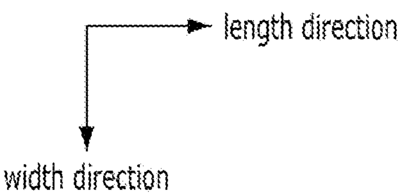
Figure 9C:
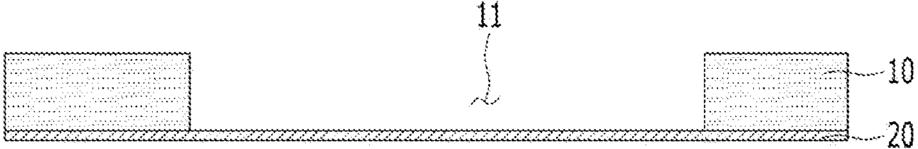
Figure 9D:
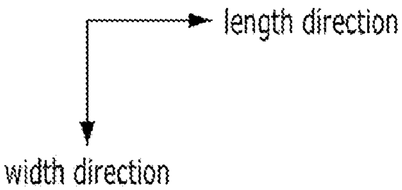
Figure 9D:
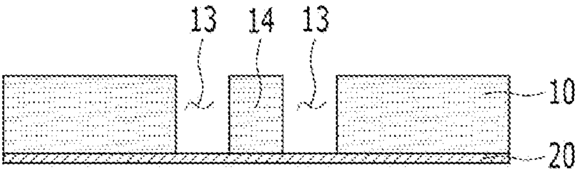
Figure 9E:
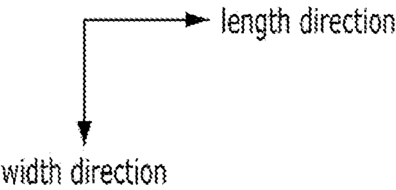
Figure 9E:
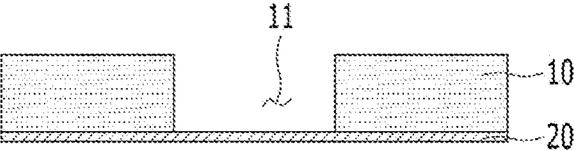

Referring to FIGS. 9A, 9B, 9C. 9D, and 9E. FIG. 9A is a plan view illustrating a mold 10 in which an inner space 11 is formed, FIG. 9B is a sectional view taken along line A-A' of FIG. 9A. FIG. 9C is a sectional view taken along line B-B' of FIG. 9A, FIG. 9D is a sectional view taken along line C-C' of FIG. 9A, and FIG. 9E is a sectional view taken along line D-D' of FIG. 9A.

Referring to FIGS. 9A, 9B. 9C, 9D, and 9E, the inner space 11 is formed in the mold 10, and a seed layer 20 is provided under the mold 10. The inner space 11 formed in the mold 10 includes an end extension space 13 at a position corresponding to a first end portion 111 of the electrically conductive contact pin 100. Two end extension spaces 13 are formed in the width direction of the electrically conductive contact pin 100. A sacrificial mold portion 14 to be removed later is located between the two end extension spaces 13. The sacrificial mold portion 14 is a part of the mold 10 that is removed after a plurality of horizontal metal layers 200 are formed.

Figure 10A:
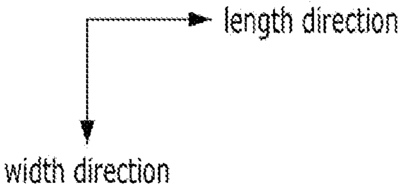
Figure 10A:
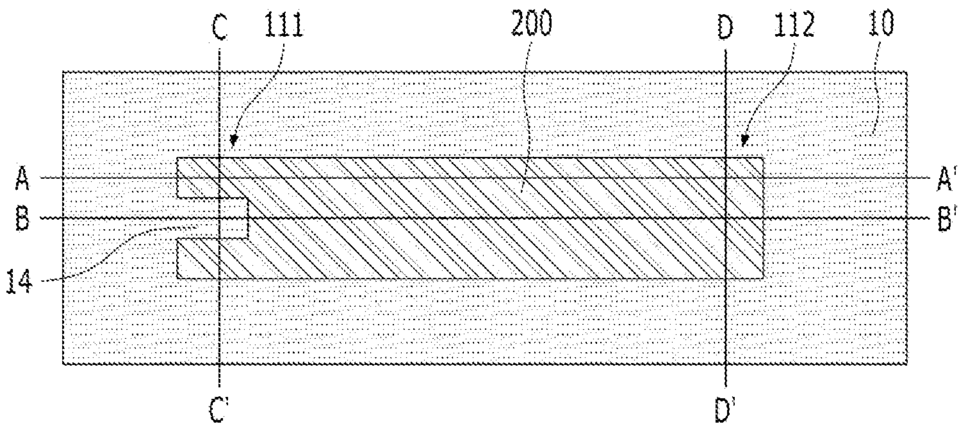
Figure 10B:
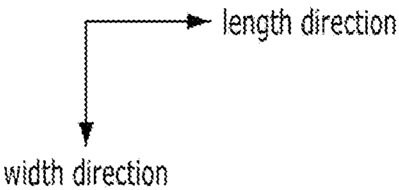
Figure 10B:
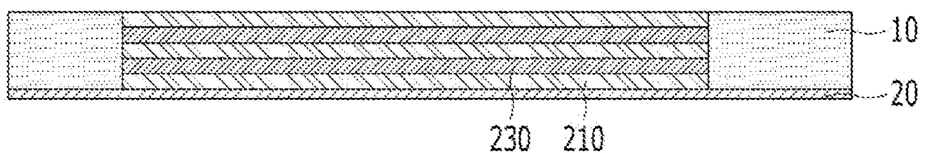
Figure 10C:
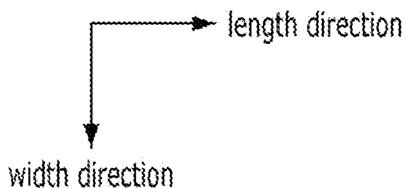
Figure 10C:
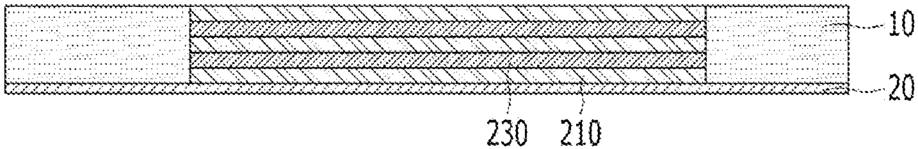
Figure 10D:
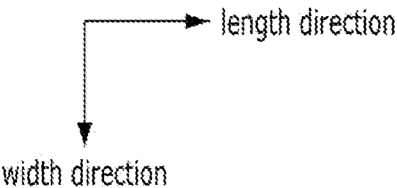
Figure 10D:
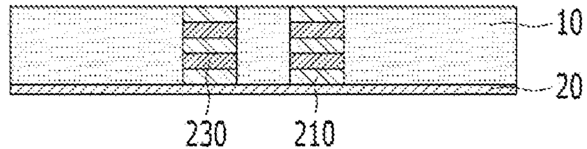
Figure 10E:
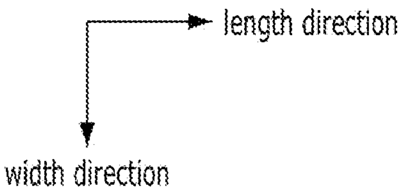
Figure 10E:
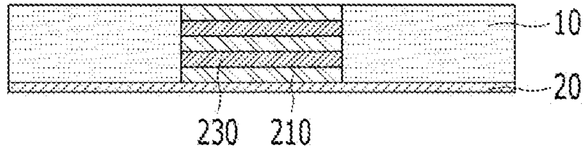

Next, referring to FIGS. 10A, 10B, 10C, 10D, and 10E, FIG. 10A is a plan view illustrating the mold 10 in which the horizontal metal layers 200 are formed in the inner space 11. FIG. 10B is a sectional view taken along line A-A' of FIG. 10A, FIG. 10C is a sectional view taken along line B-B' of FIG. 10A. FIG. 10D is a sectional view taken along line C-C' of FIG. 10A, and FIG. 10E is a sectional view taken along line D-D' of FIG. 10A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au).

Figure 11A:
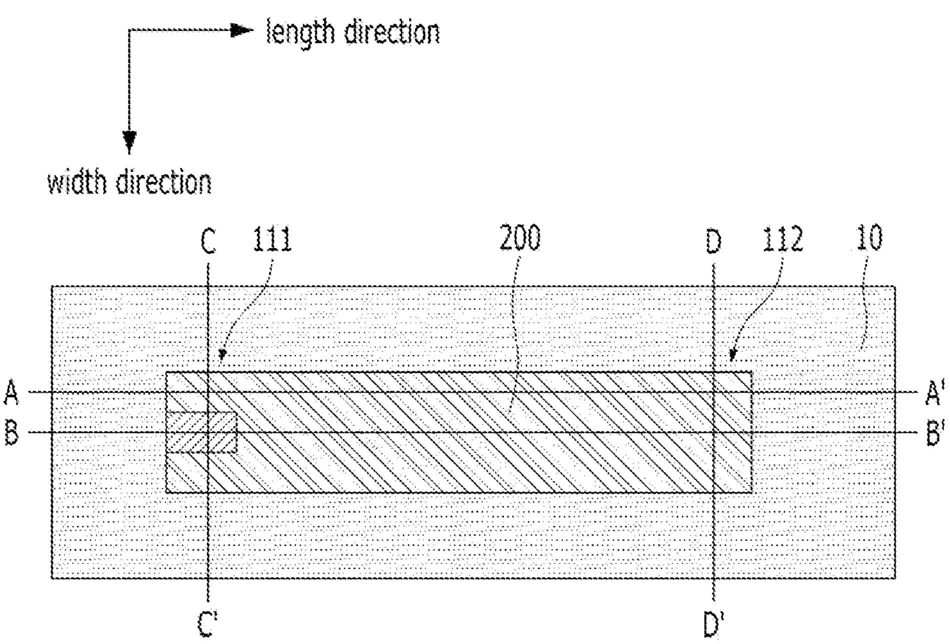
Figure 11B:
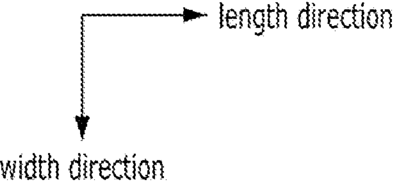
Figure 11B:
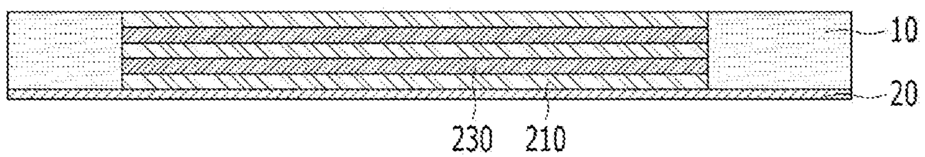
Figure 11C:
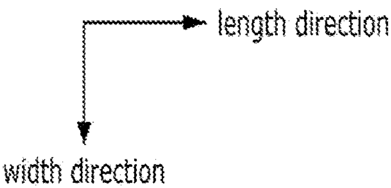
Figure 11C:
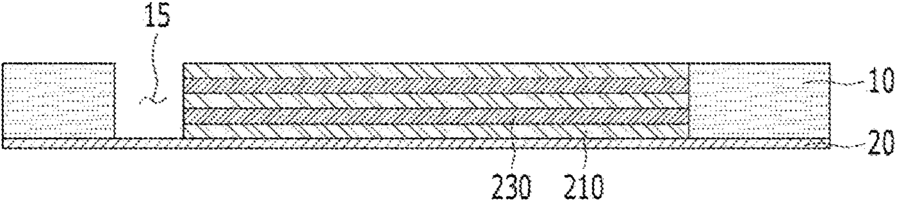
Figure 11D:
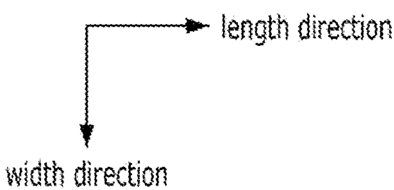
Figure 11D:
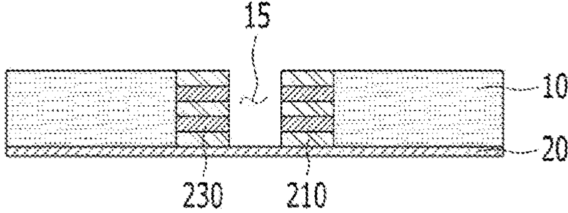
Figure 11E:
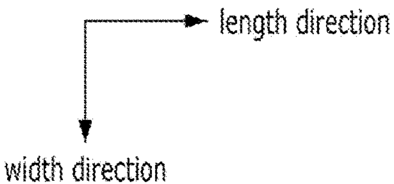
Figure 11E:
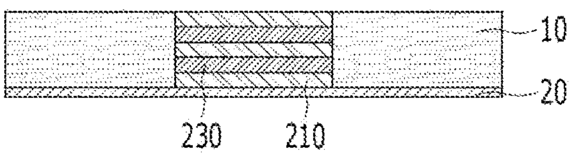

Next, referring to FIGS. 11A, 11B, 11C, 11D, and 11E, FIG. 11A is a plan view illustrating the mold 10 in which an additional space 15 is formed by removing the sacrificial mold portion 14, FIG. 11B is a sectional view taken along line A-A' of FIG. 11A. FIG. 11C is a sectional view taken along line B-B' of FIG. 11A. FIG. 11D is a sectional view taken along line C-C' of FIG. 11A, and FIG. 11E is a sectional view taken along line D-D' of FIG. 11A.

The step of removing the sacrificial mold portion 14 is performed. The additional space 15 is formed in the mold 10 by removing the sacrificial mold portion 14. The stacked horizontal metal layers 200 are exposed through three side surfaces of the additional space 15, and the mold 10 is exposed through one side surface of the additional space.

Figure 12A:
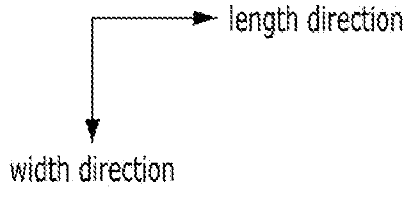
Figure 12A:
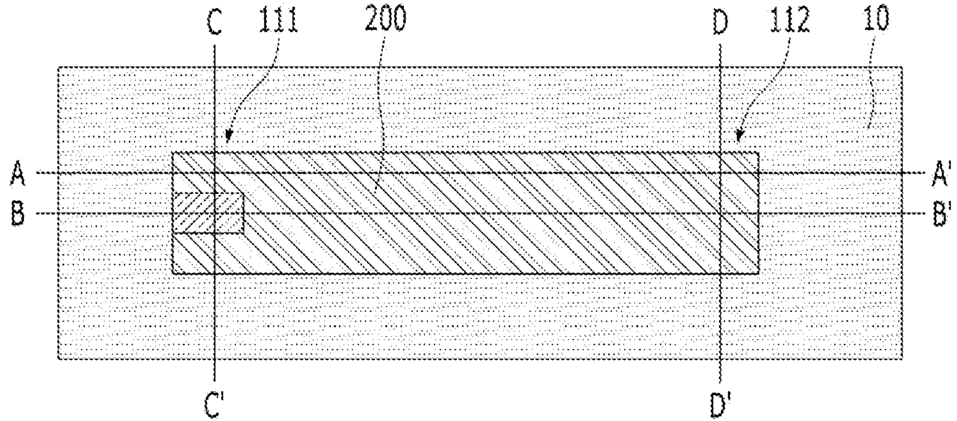
Figure 12B:
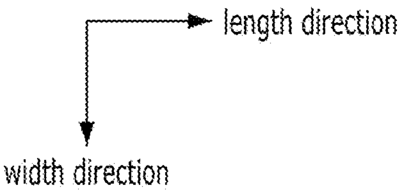
Figure 12B:
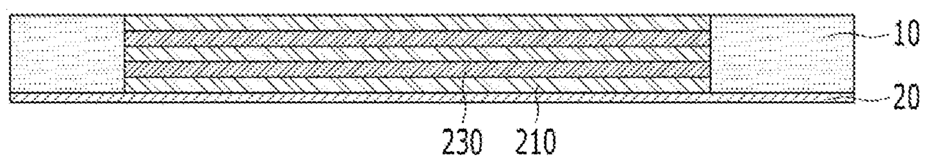
Figure 12C:
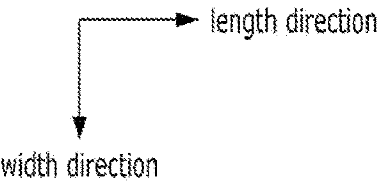
Figure 12C:
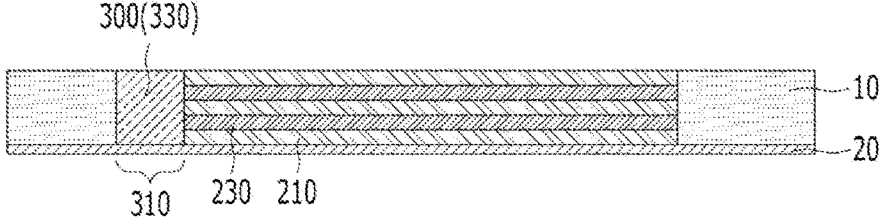
Figure 12D:
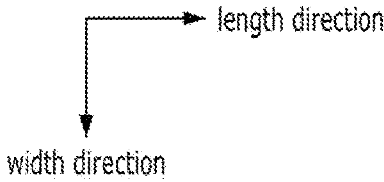
Figure 12D:
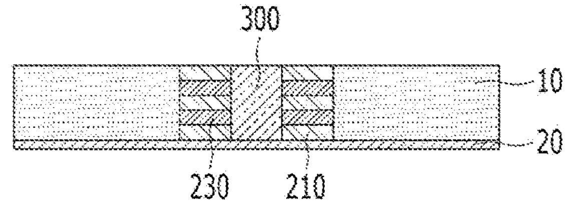
Figure 12E:
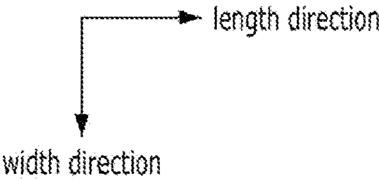
Figure 12E:
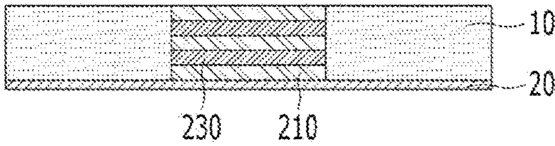

Next, referring to FIGS. 12A, 12B, 12C, 12D, and 12E, FIG. 12A is a plan view illustrating the mold 10 in which a vertical metal layer 300 is formed at the first end portion 111. FIG. 12B is a sectional view taken along line A-A' of FIG. 12A. FIG. 12C is a sectional view taken along line B-B' of FIG. 12A. FIG. 12D is a sectional view taken along line C-C' of FIG. 12A, and FIG. 12E is a sectional view taken along line D-D' of FIG. 12A.

The step of forming the vertical metal layer 300 is performed. The vertical metal layer 300 is formed in the additional space 15 formed in the previous step by electroplating. As described above, the horizontal metal layers 200 are exposed through three side surfaces of the additional space 15. The vertical metal layer 300 is integrated with the stacked horizontal metal layers 200 on these side surfaces.

The vertical metal layer 300 includes a third metal 330 made of a material different from the materials of the horizontal metal layers 200, and may be made of a metal having excellent wear resistance or hardness. The third metal 330 constituting the vertical metal layer 300 may be made of rhodium (Rh).

Figure 13A:
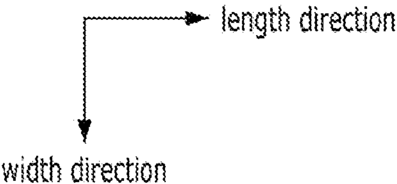
Figure 13A:
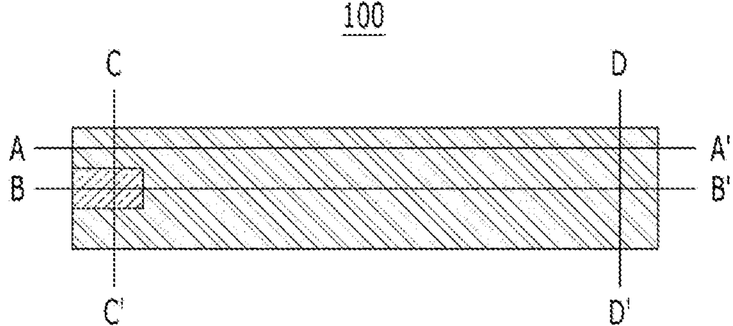
Figure 13B:
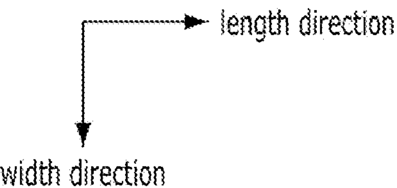
Figure 13B:
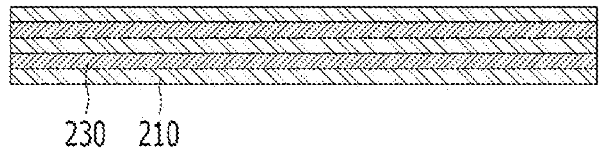
Figure 13C:
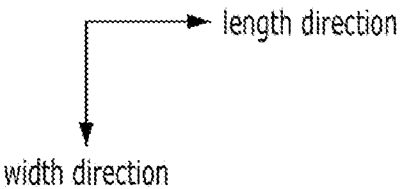
Figure 13C:
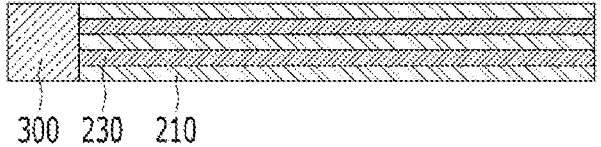
Figure 13D:
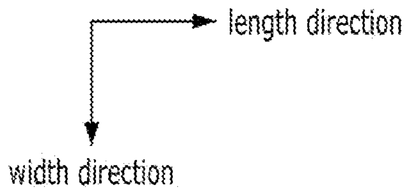
Figure 13D:
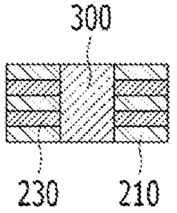
Figure 13E:
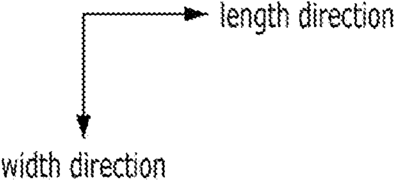
Figure 13E:
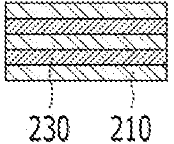
Figures 14A, 14B:
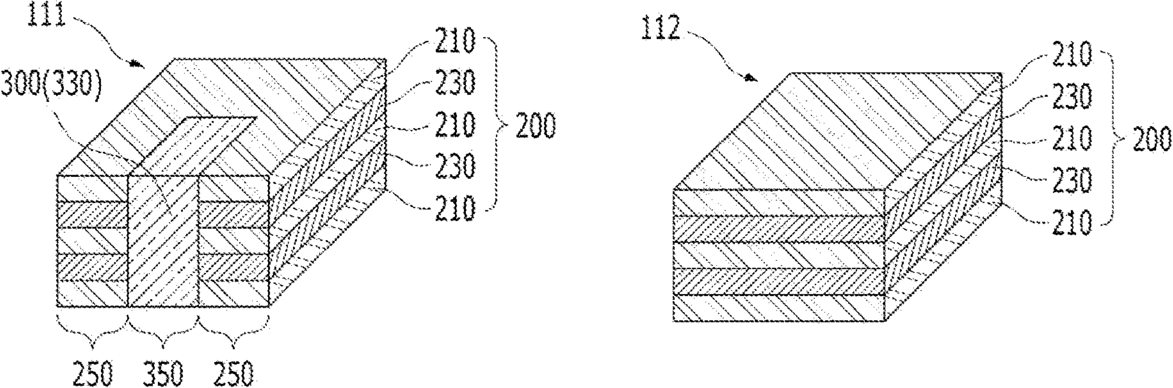
FIG. 14A is a perspective view illustrating a first end portion of the electrically conductive contact pin according to the second embodiment of the present disclosure.
FIG. 14B is a perspective view illustrating a second end portion of the electrically conductive contact pin according to the second embodiment of the present disclosure.

Next, referring to FIGS. 13A, 13B, 13C, 13D, and 13E, FIG. 13A is a plan view illustrating the electrically conductive contact pin 100, FIG. 13B is a sectional view taken along line A-A' of FIG. 13A. FIG. 13C is a sectional view taken along line B-B' of FIG. 13A, FIG. 13D is a sectional view taken along line C-C' of FIG. 13A, and FIG. 13E is a sectional view taken along line D-D' of FIG. 13A.

The step of removing the mold 10 and the seed layer 20 is performed after the previous step. When the mold 10 is made of an anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

FIG. 14A is a perspective view illustrating a front surface, that is, the first end portion 111, of the electrically conductive contact pin 100 according to the second embodiment of the present disclosure, and FIG. 14B is a perspective view illustrating a rear surface, that is, a second end portion 112, of the electrically conductive contact pin 100 according to the second embodiment of the present disclosure.

While the second end portion 112 is composed of only the horizontal metal layers 200, the first end portion 111 is composed of both the horizontal metal layers 200 and the vertical metal layer 300 unlike the second end portion 112.

The horizontal metal layers 200 are formed by stacking a first metal 210 and a second metal 230. The first metal may be selected from the group consisting of platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. The second metal may be selected from the group consisting of copper (Cu), silver (Ag), and gold (Au). The vertical metal layer 300 may be made of a material different from the materials of the first metal 210 and the second metal 230. For example, the first metal 210 may be made of a palladium-cobalt (PdCo) alloy, the second metal 230 may be made of copper (Cu), and the vertical metal layer 300 may be made of rhodium. Rd).

The first end portion 111 has a configuration in which the first metal 210 and the second metal 230 are alternately spaced apart from each other not only in the thickness direction of the electrically conductive contact pin 100 but also in the width direction of the electrically conductive contact pin 100, and the vertical metal layer 300 made of a material different from the materials of the first metal 210 and the second metal 230 exists at a position where the first metal 210 and the second metal 230 are spaced apart from each other in the width direction.

The vertical metal layer 300 includes an inner extension portion 310 extending in the length direction of the electrically conductive contact pin 100 to the inside of the electrically conductive contact pin 100 by a length of 100 μm to 400 μm. The first metal 210 and the second metal 230 are spaced apart from each other in the width direction by the width (10 μm to 40 μm) of the inner extension portion 310 within the length (100 μm to 400 μm) of the inner extension portion 310.

By increasing the content of a metal having high wear resistance or high hardness in the first end portion 111 of the electrically conductive contact pin 100 with the configuration of the vertical metal layer 300, it is possible to improve the wear resistance or hardness characteristics of the first end portion 111 and at the same time increase the content of a metal having high electrical conductivity in a body portion 130 of the electrically conductive contact pin 100, thereby improving the current carrying capacity.

In addition, since the first end portion 111 is not composed only of the metal having high wear resistance or high hardness, but also the metal having high electrical conductivity, it is possible to lower the contact resistance compared to configuring a tip portion only with a metal having high wear resistance or high hardness.

In addition, since the vertical metal layer 300 having a length of 100 μm to 400 μm exists in the electrically conductive contact pin 100 in the length direction thereof, it is possible to implement the same cross-sectional structure even when the first end portion 111 is shortened to the length of 100 μm to 400 μm. With this configuration, it is possible to reuse the first end portion 111 by grinding it within the range of 100 μm to 400 μm.

Third Embodiment

Next, a third embodiment according to the present disclosure will be described. However, the embodiments described below will be mainly described in terms of characteristic elements in comparison with the first embodiment, and descriptions of the same or similar elements to the first embodiment will be omitted.

Hereinafter, an electrically conductive contact pin 100 according to the third embodiment of the present disclosure will be described with reference to FIGS. 15 to 21B.

Figure 15:
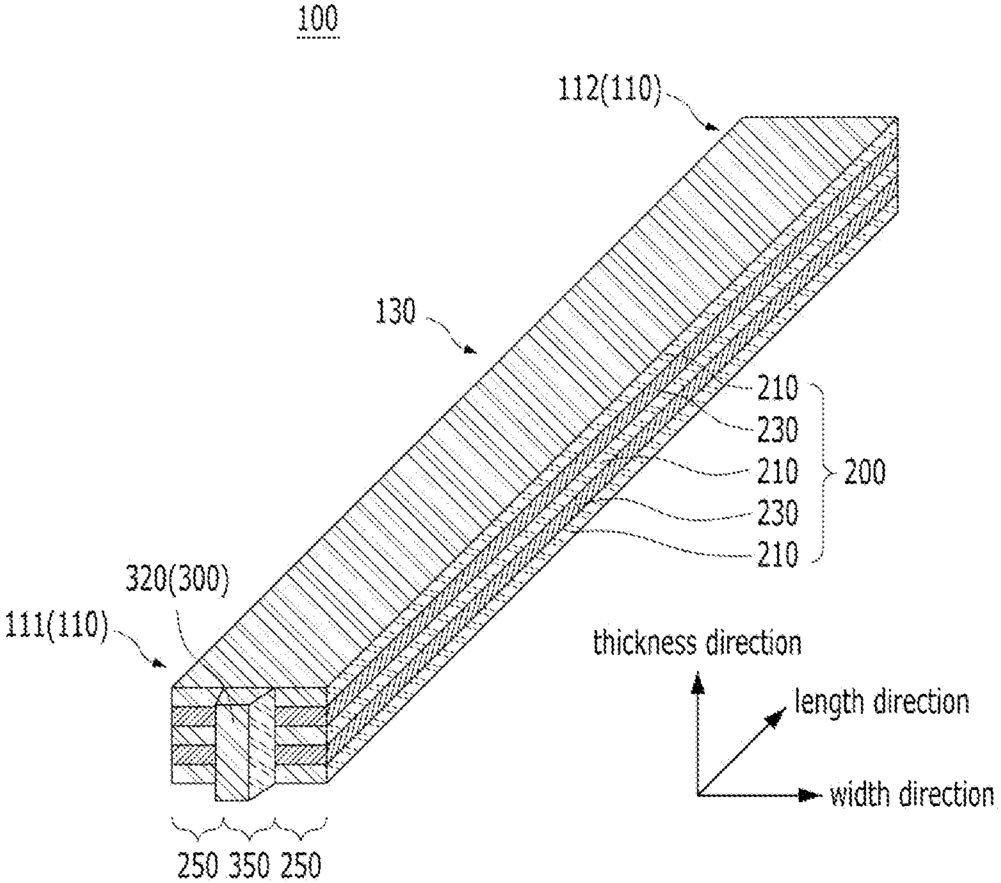
FIG. 15 is a perspective view illustrating an electrically conductive contact pin according to a third embodiment of the present disclosure.

FIG. 15 is a perspective view illustrating the electrically conductive contact pin 100 according to the third embodiment of the present disclosure. FIGS. 16A to 20E are views illustrating a manufacturing method for the electrically conductive contact pin 100 according to the third embodiment of the present disclosure. FIGS. 21A and 21B are perspective views illustrating a first end portion 111 (FIG. 21A) and a second end portion 112 (FIG. 21B) of the electrically conductive contact pin 100 according to the third embodiment of the present disclosure.

The electrically conductive contact pin 100 according to the third embodiment of the present disclosure is different from the electrically conductive contact pin 100 according to the first embodiment in that a vertical metal layer 300 includes an outer extension portion 320 extending in the length direction of the electrically conductive contact pin 100 to the outside of the electrically conductive contact pin 100 and protruding from an end portion of the electrically conductive contact pin 100.

The vertical metal layer 300 according to the third embodiment includes an inner extension portion 310 extending in the length direction of the electrically conductive contact pin 100 to the inside of the electrically conductive contact pin 100, and the outer extension portion 320 extending in the length direction of the electrically conductive contact pin 100 to the outside of the electrically conductive contact pin 100 and protruding from the end portion of the electrically conductive contact pin 100.

Hereinafter, a manufacturing method for the electrically conductive contact pin 100 according to the third embodiment of the present disclosure will be described with reference to FIGS. 16 to 20.

Figure 16A:
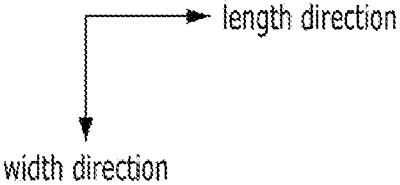
FIGS. 16A to 20E are views illustrating a manufacturing method for the electrically conductive contact pin according to the third embodiment of the present disclosure.
Figure 16A:
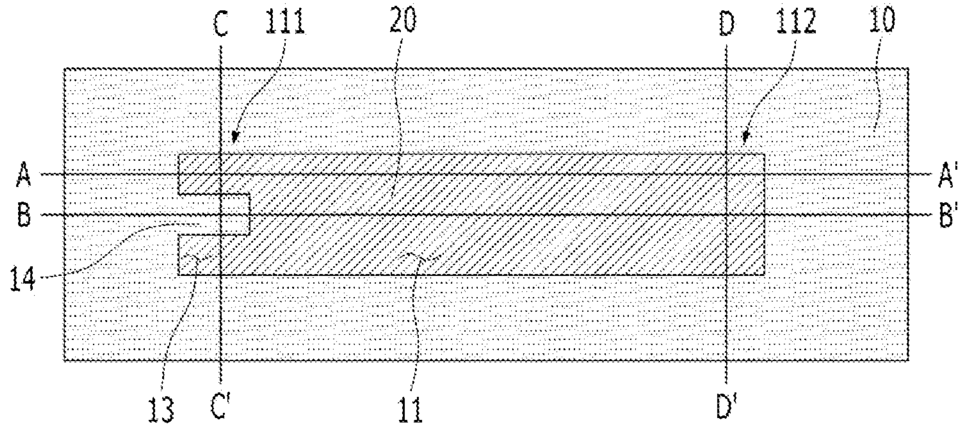
Figure 16B:
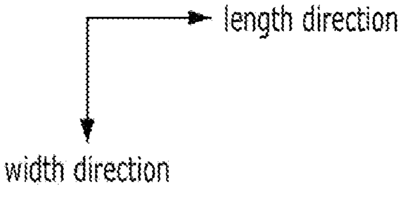
Figure 16B:
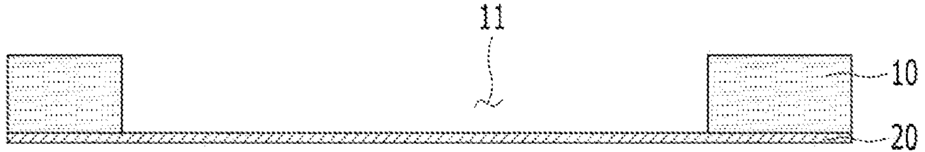
Figure 16C:
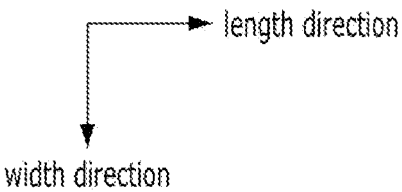
Figure 16C:
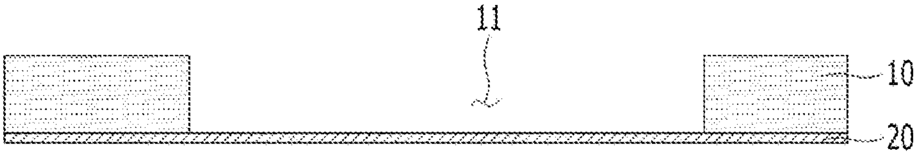
Figure 16D:
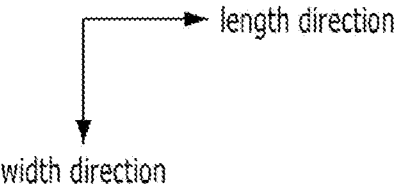
Figure 16D:
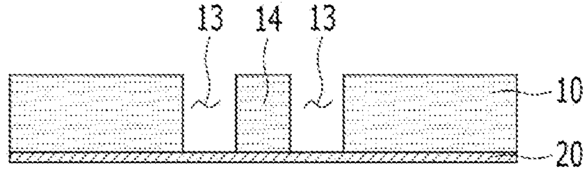
Figure 16E:
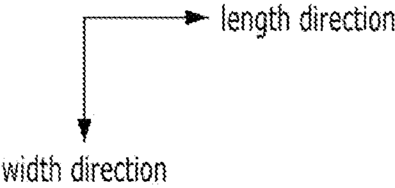
Figure 16E:
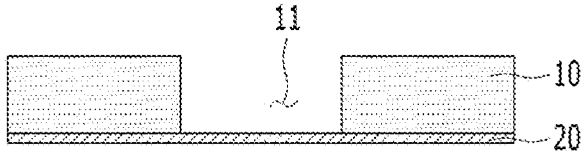

Referring to FIGS. 16A, 16B, 16C, 16D, and 16E. FIG. 16A is a plan view illustrating a mold 10 in which an inner space 11 is formed, FIG. 16B is a sectional view taken along line A-A' of FIG. 16A, FIG. 16C is a sectional view taken along line B-B' of FIG. 16A. FIG. 16D is a sectional view taken along line C-C' of FIG. 16A, and FIG. 16E is a sectional view taken along line D-D' of FIG. 16A.

Referring to FIGS. 16A to 16E, the inner space 11 is formed in the mold 10, and a seed layer 20 is provided under the mold 10. The inner space 11 formed in the mold 10 includes an end extension space 13 at a position corresponding to a first end portion 111 of the electrically conductive contact pin 100. Two end extension spaces 13 are formed in the width direction of the electrically conductive contact pin 100. A sacrificial mold portion 14 to be removed later is located between the two end extension spaces 13. The sacrificial mold portion 14 is a part of the mold 10 that is removed after a plurality of horizontal metal layers 200 are formed.

Figure 17A:
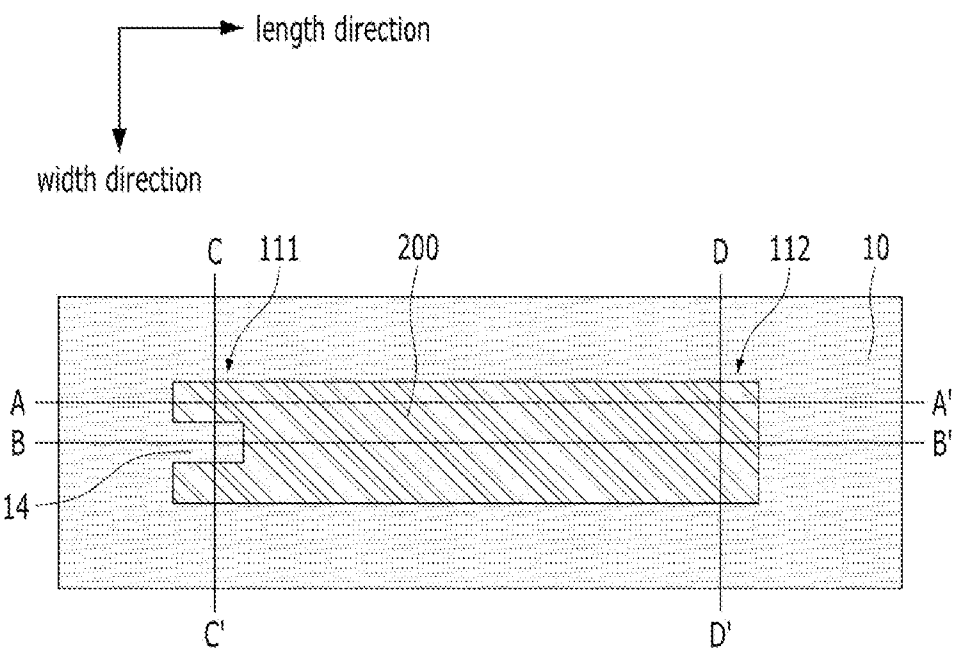
Figure 17B:
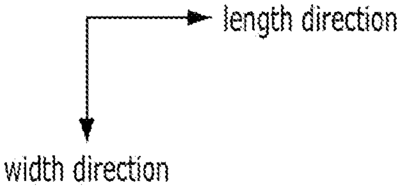
Figure 17B:
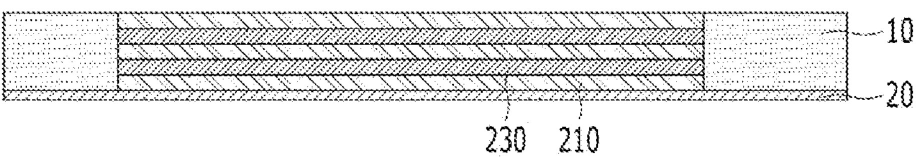
Figure 17C:
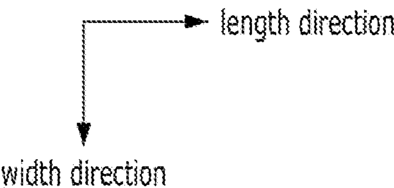
Figure 17C:
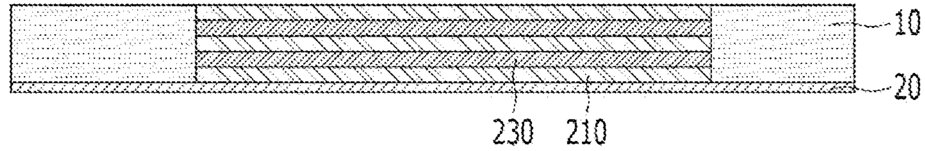
Figure 17D:
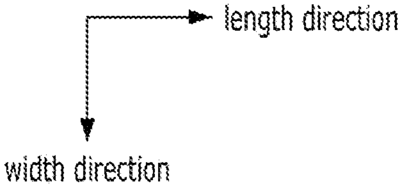
Figure 17D:
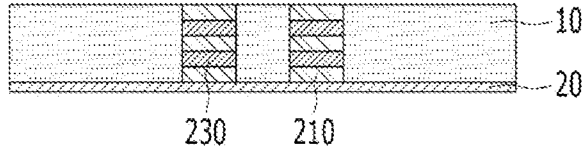
Figure 17E:
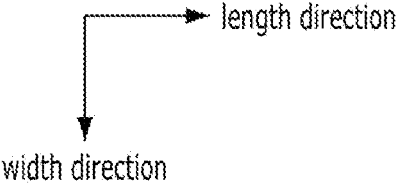
Figure 17E:
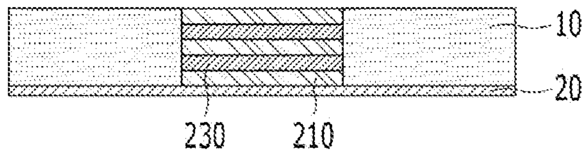

Next, referring to FIGS. 17A, 17B, 17C, 17D, and 17E, FIG. 17A is a plan view illustrating the mold 10 in which the horizontal metal layers 200 are formed in the inner space 11. FIG. 17B is a sectional view taken along line A-A' of FIG. 17A, FIG. 17C is a sectional view taken along line B-B' of FIG. 17A. FIG. 17D is a sectional view taken along line C-C' of FIG. 17A, and FIG. 17E is a sectional view taken along line D-D' of FIG. 17A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au).

Figure 18A:
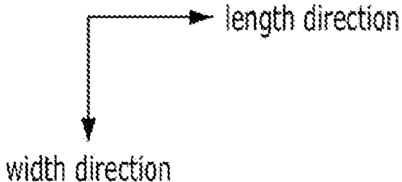
Figure 18A:
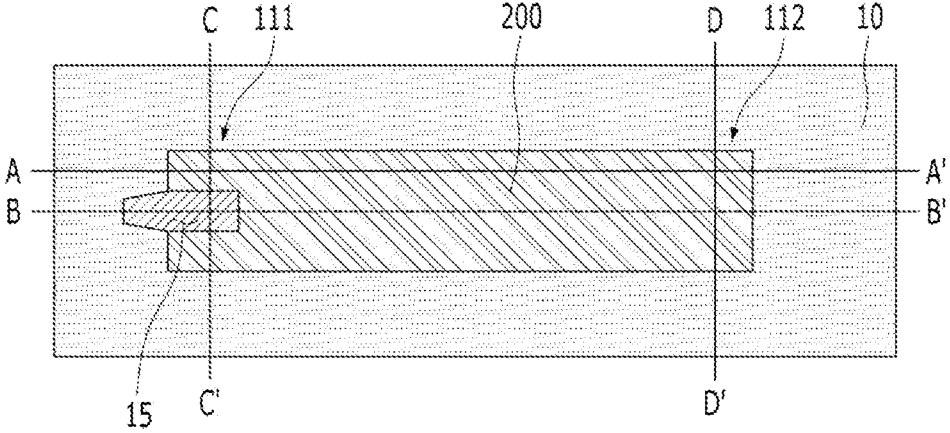
Figure 18B:
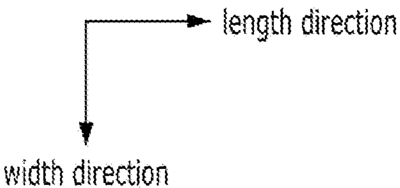
Figure 18B:
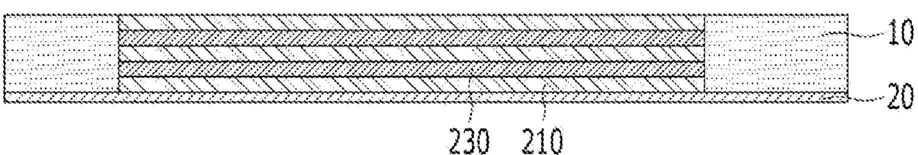
Figure 18C:
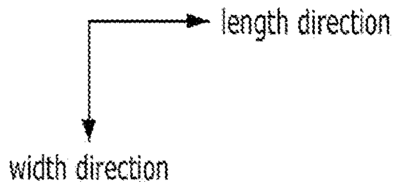
Figure 18C:
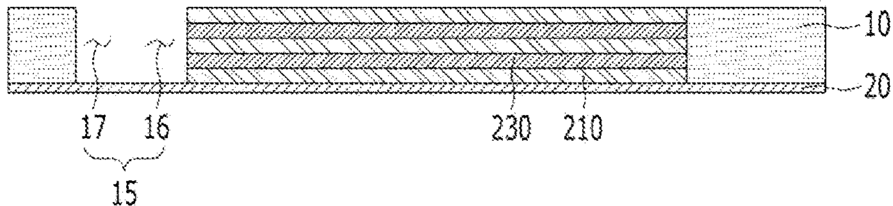
Figure 18D:
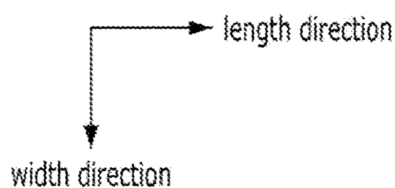
Figure 18D:
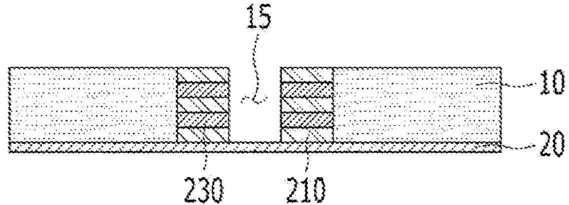
Figure 18E:
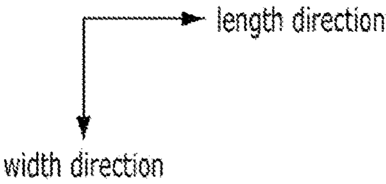
Figure 18E:
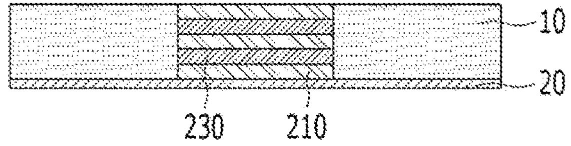

Next, referring to FIGS. 18A, 18B, 18C, 18D, and 18E. FIG. 18A is a plan view illustrating the mold 10 in which an additional space 15 is formed by removing the sacrificial mold portion 14. FIG. 18B is a sectional view taken along line A-A' of FIG. 18A. FIG. 18C is a sectional view taken along line B-B' of FIG. 18A. FIG. 18D is a sectional view taken along line C-C' of FIG. 18A, and FIG. 18E is a sectional view taken along line D-D' of FIG. 18A.

The step of removing the sacrificial mold portion 14 is performed. The additional space 15 is formed in the mold 10 by removing the sacrificial mold portion 14. The additional space 15 includes an inner additional space 16 in which the horizontal metal layers 200 exist in the width direction and an outer additional space 17 in which the mold 10 exists in the width direction. The outer additional space 17 is continuously formed in communication with the inner additional space 16. The inner additional space 16 is formed inside ends of the horizontal metal layers 200, and the outer additional space 17 is formed outside the ends of the horizontal metal layers 200.

The inner additional space 16 becomes later a region in which an inner extension portion 310 is formed, and the outer additional space 17 becomes later a region in which an outer extension portion 320 is formed.

Figure 19A:
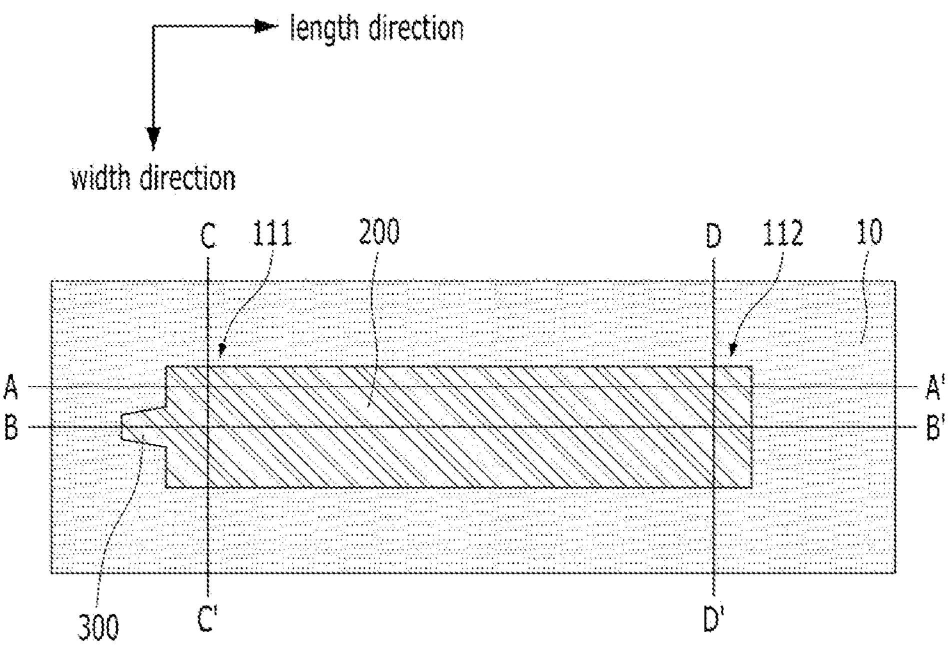
Figure 19B:
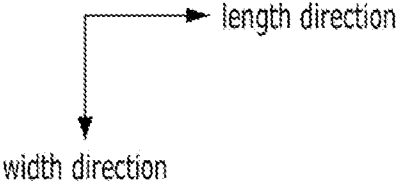
Figure 19B:
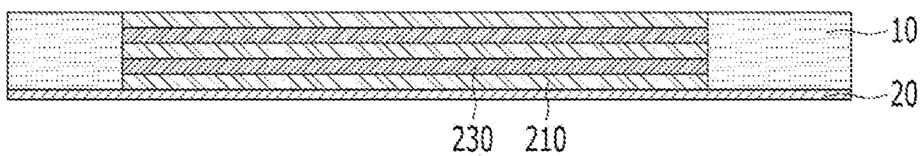
Figure 19C:
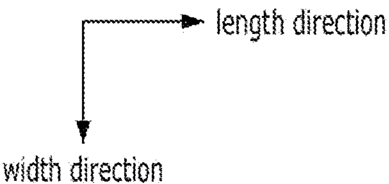
Figure 19C:
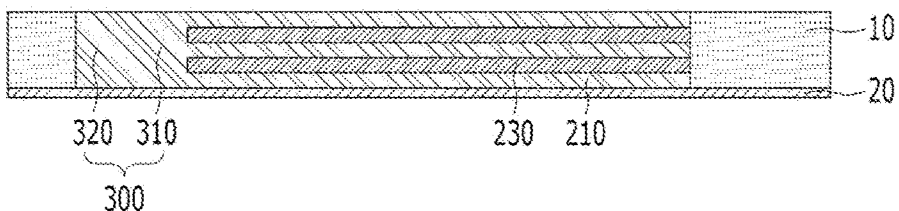
Figure 19D:
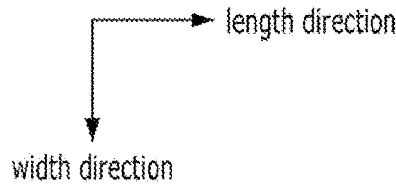
Figure 19D:
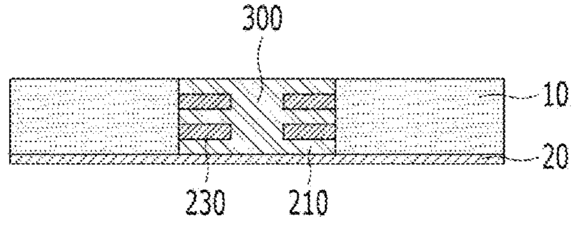
Figure 19E:
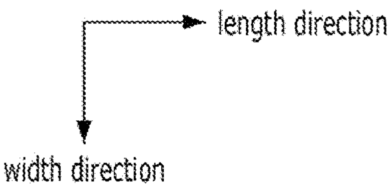
Figure 19E:
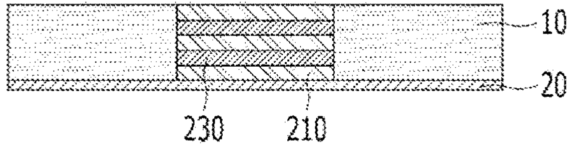

Next, referring to FIGS. 19A, 19B, 19C, 19D, and 19E, FIG. 19A is a plan view illustrating the mold 10 in which a vertical metal layer 300 is formed at the first end portion 111. FIG. 19B is a sectional view taken along line A-A' of FIG. 19A. FIG. 19C is a sectional view taken along line B-B' of FIG. 19A. FIG. 19D is a sectional view taken along line C-C' of FIG. 19A, and FIG. 19E is a sectional view taken along line D-D' of FIG. 19A.

The step of forming the vertical metal layer 300 is performed. The vertical metal layer 300 is formed in the additional space 15 formed in the previous step by electroplating. The inner extension portion 310 is formed in the inner additional space 16, and the outer extension portion 320 is formed in the outer additional space 17.

The vertical metal layer 300 is made of the same metal as the material of at least one of the horizontal metal layers 200. The vertical metal layer 300 may be made of the same material as the material of a first metal 210 selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. For example, when the first metal 210 is made of a palladium-cobalt (PdCo) alloy, the vertical metal layer 300 may also be made of a palladium-cobalt (PdCo) alloy.

Figure 20A:
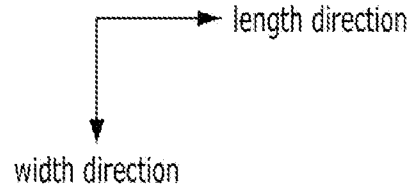
Figure 20A:
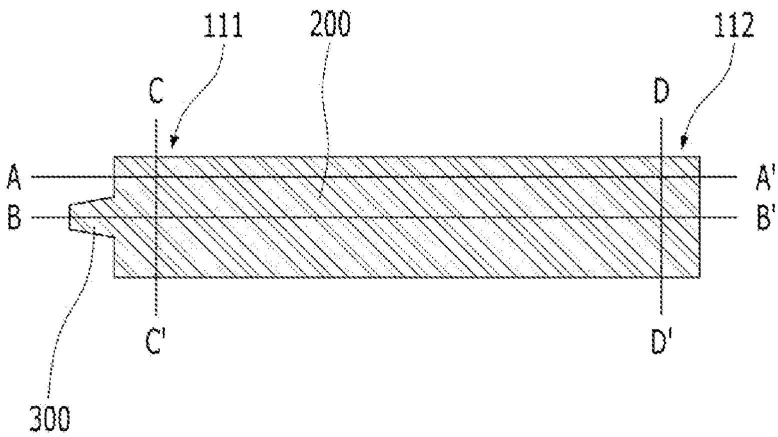
Figure 20B:
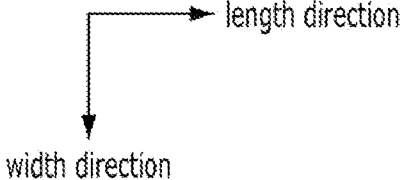
Figure 20B:
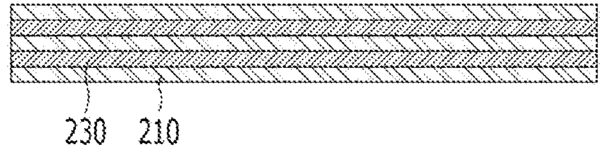
Figure 20C:
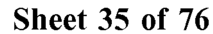
Figure 20C:
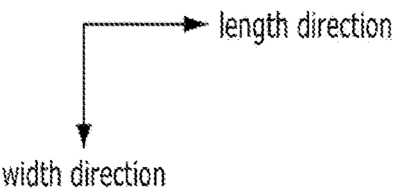
Figure 20C:
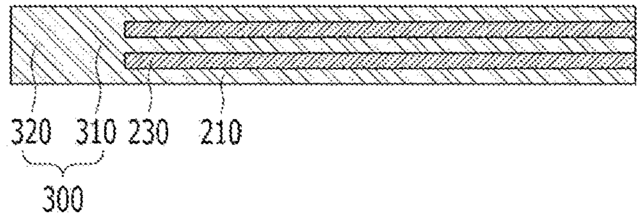
Figure 20D:
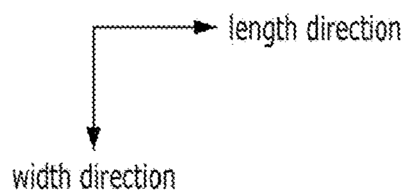
Figure 20D:
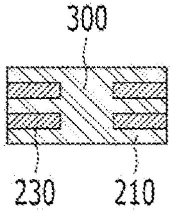
Figure 20E:
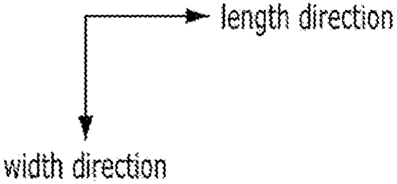
Figure 20E:
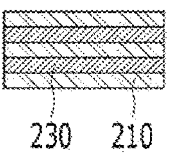
Figures 21A, 21B:
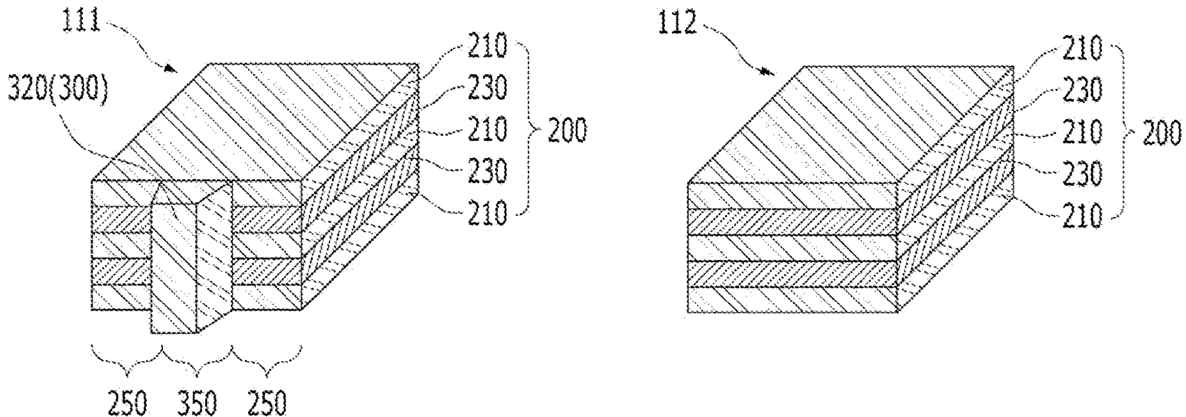
FIG. 21A is a perspective view illustrating a first end portion of the electrically conductive contact pin according to the third embodiment of the present disclosure.
FIG. 21B is a perspective view illustrating a second end portion of the electrically conductive contact pin according to the third embodiment of the present disclosure.

Next, referring to FIGS. 20A, 20B, 20C, 20D, and 20E, FIG. 20A is a plan view illustrating the electrically conductive contact pin 100. FIG. 20B is a sectional view taken along line A-A' of FIG. 20A. FIG. 20C is a sectional view taken along line B-B' of FIG. 20A. FIG. 20D is a sectional view taken along line C-C' of FIG. 20A, and FIG. 20E is a sectional view taken along line D-D' of FIG. 20A.

The step of removing the mold 10 and the seed layer 20 is performed after the previous step. When the mold 10 is made of an anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

FIG. 21A is a perspective view illustrating a front surface, that is, the first end portion 111, of the electrically conductive contact pin 100 according to the third embodiment of the present disclosure, and FIG. 21B is a perspective view illustrating a rear surface, that is, a second end portion 112, of the electrically conductive contact pin 100 according to the third embodiment of the present disclosure.

While the second end portion 112 is composed of only the horizontal metal layers 200, the first end portion 111 is composed of both the horizontal metal layers 200 and the vertical metal layer 300 unlike the second end portion 112. In particular, the vertical metal layer 300 includes the inner extension portion 310 extending in the length direction of the electrically conductive contact pin 100 to the inside of the electrically conductive contact pin 100, and the outer extension portion 320 extending in the length direction of the electrically conductive contact pin 100 to the outside of the electrically conductive contact pin 100 and protruding from the end portion of the electrically conductive contact pin 100.

Since the vertical metal layer 300 includes the inner extension portion 310 and the outer extension portion 320, even when the outer extension portion 320 is protrudingly formed, it is possible to improve the rigidity of the outer extension portion 320 with the configuration of the inner extension portion 310 integrally formed with the outer extension portion.

By increasing the content of a metal having high wear resistance or high hardness in the first end portion 111 of the electrically conductive contact pin 100 with the configuration of the vertical metal layer 300, it is possible to improve the wear resistance or hardness characteristics of the first end portion 111 and at the same time increase the content of a metal having high electrical conductivity in a body portion 130 of the electrically conductive contact pin 100, thereby improving the current carrying capacity.

In addition, since the outer extension portion 320 of the electrically conductive contact pin 100 has a length of 100 μm to 400 μm, it is possible to implement the same cross-sectional structure even when the first end portion 111 is shortened to the length of 100 μm to 400 μm. With this configuration, it is possible to reuse the first end portion 111 by grinding it within the range of 100 μm to 400 μm.

Fourth Embodiment

Next, a fourth embodiment according to the present disclosure will be described. However, the embodiments described below will be mainly described in terms of characteristic elements in comparison with the first embodiment, and descriptions of the same or similar elements to the first embodiment will be omitted.

Hereinafter, an electrically conductive contact pin 100 according to the fourth embodiment of the present disclosure will be described with reference to FIGS. 22 to 28B.

Figure 22:
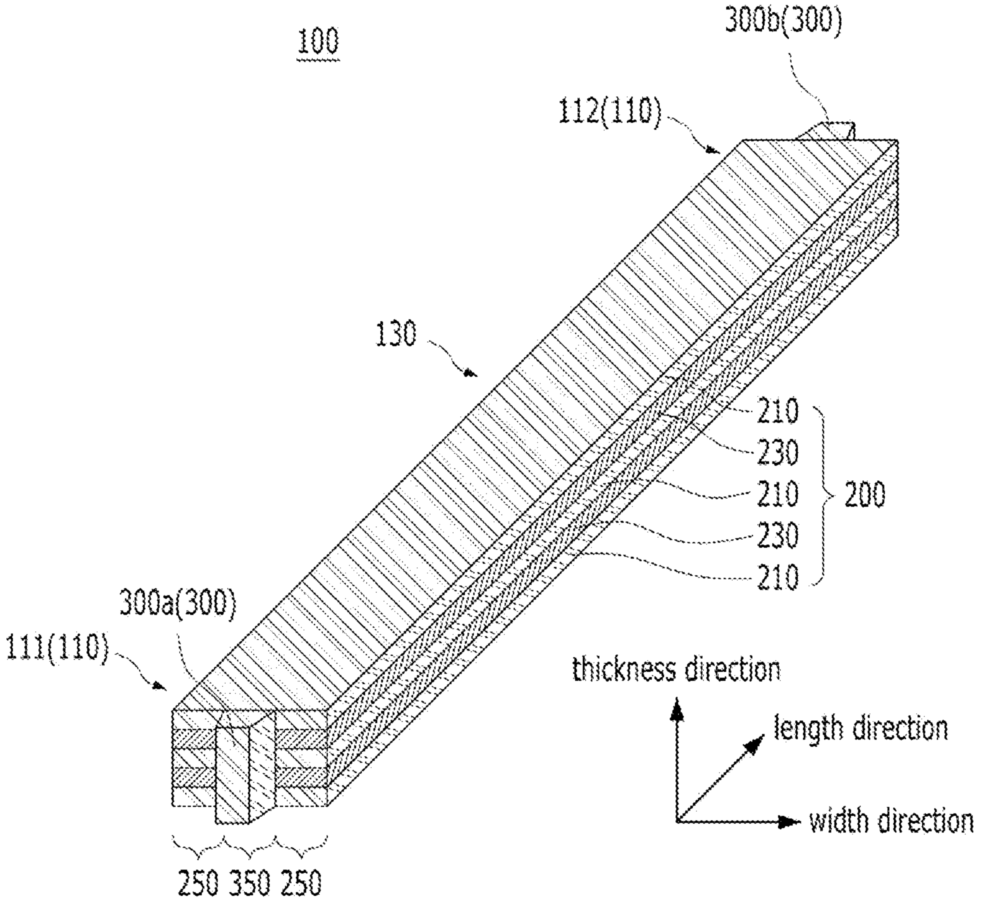
FIG. 22 is a perspective view illustrating an electrically conductive contact pin according to a fourth embodiment of the present disclosure.

FIG. 22 is a perspective view illustrating the electrically conductive contact pin 100 according to the fourth embodiment of the present disclosure. FIGS. 23A to 27E are views illustrating a manufacturing method for the electrically conductive contact pin 100 according to the fourth embodiment of the present disclosure. FIGS. 28A and 28B are perspective views illustrating a first end portion 111 (FIG. 28A) and a second end portion 112 (FIG. 28B) of the electrically conductive contact pin 100 according to the fourth embodiment of the present disclosure.

The electrically conductive contact pin 100 according to the fourth embodiment of the present disclosure is different from the electrically conductive contact pin 100 according to the first embodiment in that a vertical metal layer 300 includes an outer extension portion 320 extending in the length direction of the electrically conductive contact pin 100 to the outside of the electrically conductive contact pin 100 and protruding from each of the first and second end portions 111 and 112 of the electrically conductive contact pin 100.

At the first end portion 111, the vertical metal layer 300 includes a first inner extension portion 310*a* extending in the length direction of the electrically conductive contact pin 100 to the inside of the electrically conductive contact pin 100, and a first outer extension portion 320*a* extending in the length direction of the electrically conductive contact pin 100 to the outside of the electrically conductive contact pin 100 and protruding from the end portion of the electrically conductive contact pin 100.

At the second end portion 112, the vertical metal layer 300 includes a second inner extension portion 310*b* extending in the length direction of the electrically conductive contact pin 100 to the inside of the electrically conductive contact pin 100, and a second outer extension portion 320*b* extending in the length direction of the electrically conductive contact pin 100 to the outside of the electrically conductive contact pin 100 and protruding from the end portion of the electrically conductive contact pin 100.

In addition, the vertical metal layer 300 of the second end portion 112 is made of the same material as the material of the vertical metal layer 300 of the first end portion 111.

Hereinafter, a manufacturing method for the electrically conductive contact pin 100 according to the fourth embodiment of the present disclosure will be described with reference to FIGS. 23A to 27E.

Figure 23A:
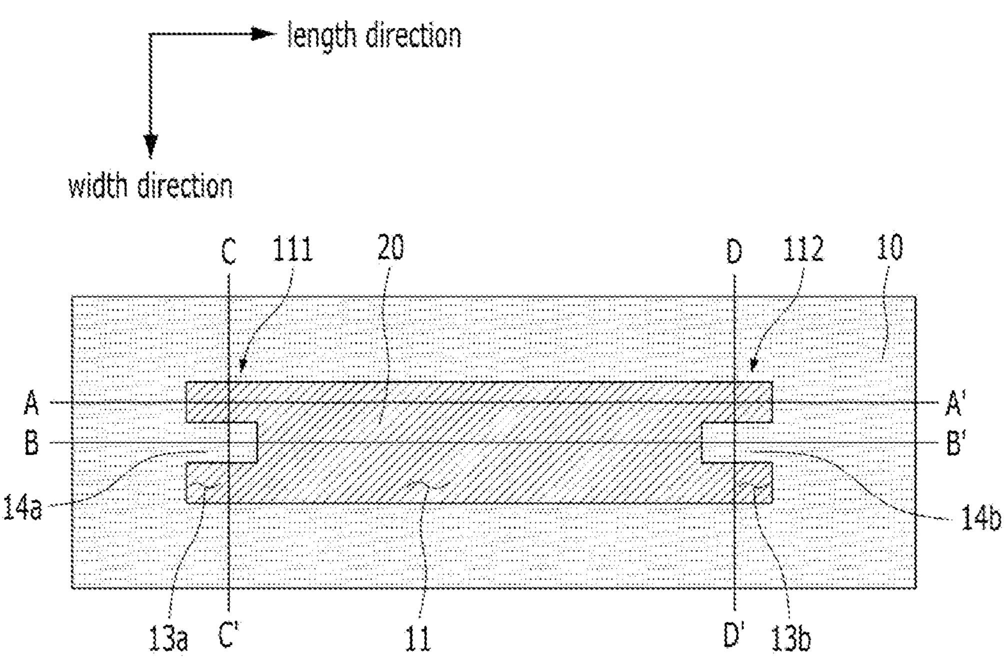
FIGS. 23A to 27E are views illustrating a manufacturing method for the electrically conductive contact pin according to the fourth embodiment of the present disclosure.
Figure 23B:
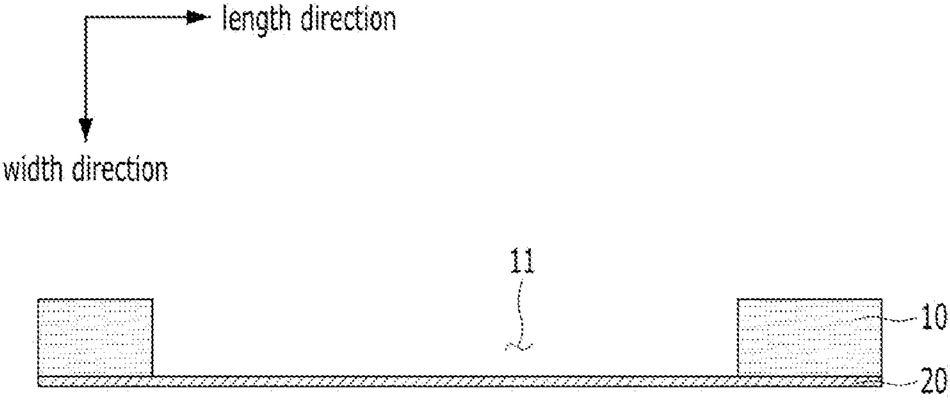
Figure 23C:
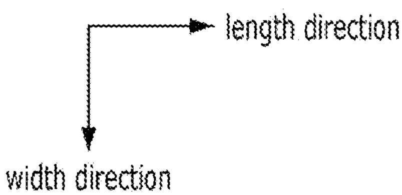
Figure 23C:
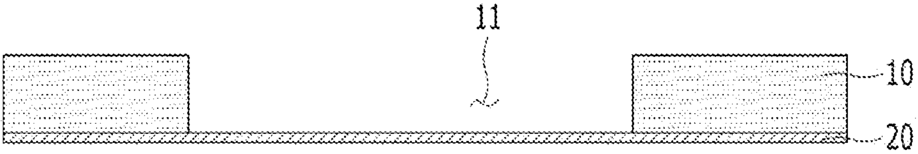
Figure 23D:
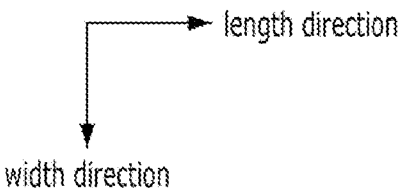
Figure 23D:
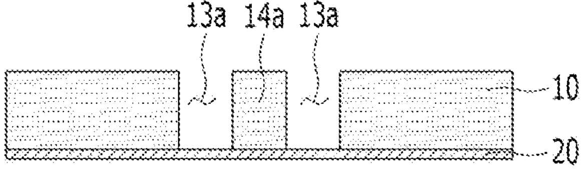
Figure 23E:
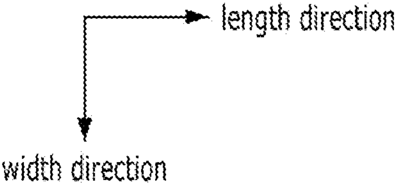
Figure 23E:
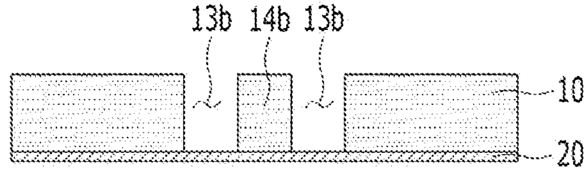

Referring to FIGS. 23A, 23B. 23C, 23D, and 23E, FIG. 23A is a plan view illustrating a mold 10 in which an inner space 11 is formed, FIG. 23B is a sectional view taken along line A-A' of FIG. 23A. FIG. 23C is a sectional view taken along line B-B' of FIG. 23A. FIG. 23D is a sectional view taken along line C-C' of FIG. 23A, and FIG. 23E is a sectional view taken along line D-D' of FIG. 23A.

Referring to FIGS. 23A, 23B, 23C, 23D, and 23E, the inner space 11 is formed in the mold 10, and a seed layer 20 is provided under the mold 10. The inner space 11 formed in the mold 10 includes a first end extension space 13*a* at a position corresponding to a first end portion 111 of the electrically conductive contact pin 100 and a second end extension space 13*b* at a position corresponding to a second end portion 112 of the electrically conductive contact pin. Two first end extension spaces 13*a* and two second end extension spaces 13*b* are formed in the width direction of the electrically conductive contact pin 100. First and second sacrificial mold portions 14*a* and 14*b* to be removed later are located between the two first end extension spaces 13*a* and the two second end extension spaces 13*b*. The first and second sacrificial mold portions 14*a* and 14*b* are parts of the mold 10 that are removed after a plurality of horizontal metal layers 200 are formed.

Figure 24A:
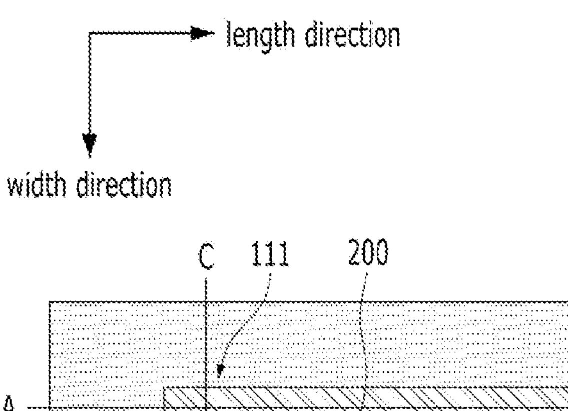
Figure 24B:
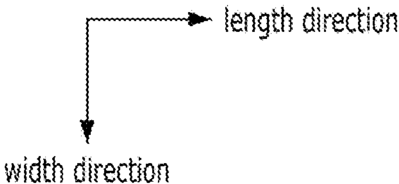
Figure 24B:
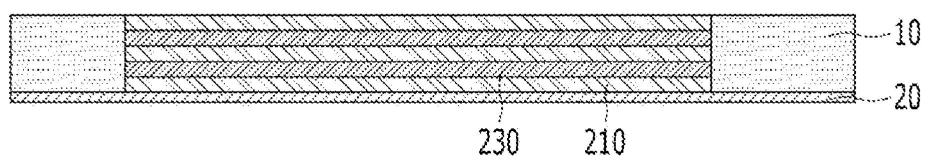
Figure 24C:
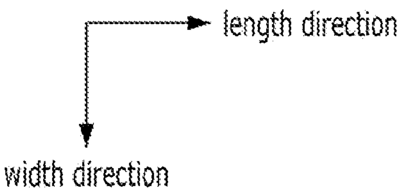
Figure 24C:
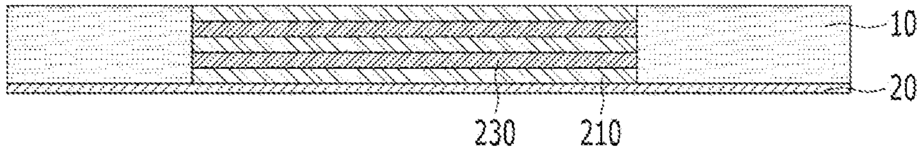
Figure 24D:
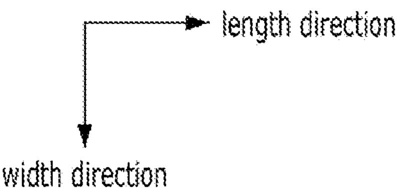
Figure 24D:
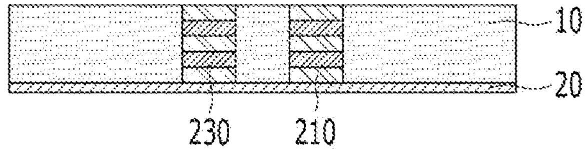
Figure 24E:
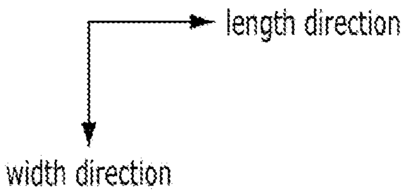
Figure 24E:
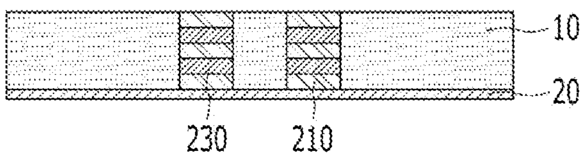

Next, referring to FIGS. 24A, 24B, 24C, 24D, and 24E, FIG. 24A is a plan view illustrating the mold 10 in which the horizontal metal layers 200 are formed in the inner space 11. FIG. 24B is a sectional view taken along line A-A' of FIG. 24A, FIG. 24C is a sectional view taken along line B-B' of FIG. 24A. FIG. 24D is a sectional view taken along line C-C' of FIG. 24A, and FIG. 24E is a sectional view taken along line D-D' of FIG. 24A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au).

Figure 25A:
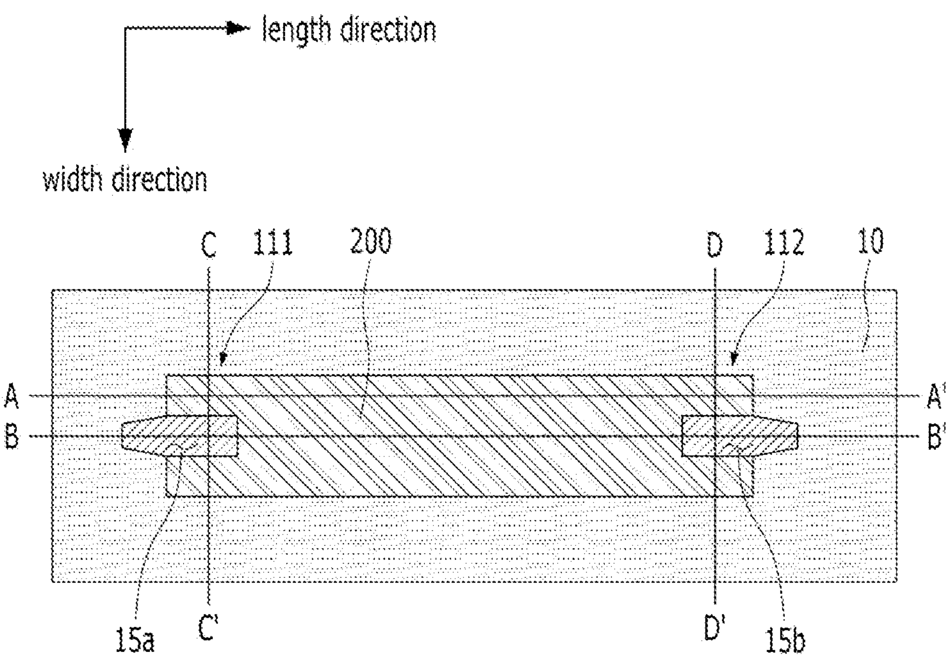
Figure 25B:
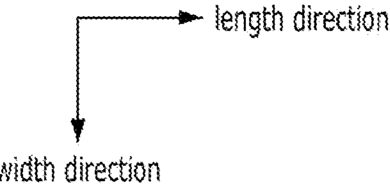
Figure 25B:
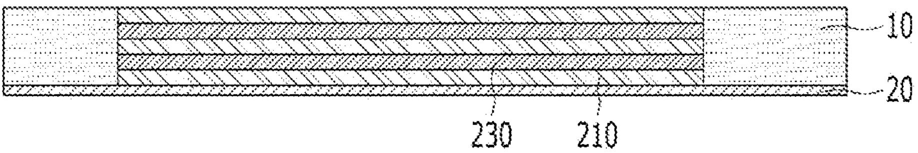
Figure 25C:
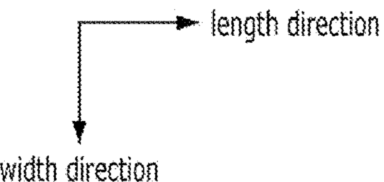
Figure 25C:
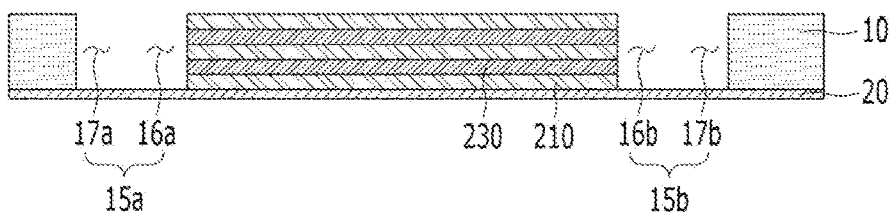
Figure 25D:
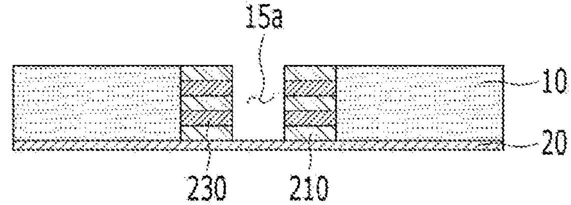
Figure 25E:
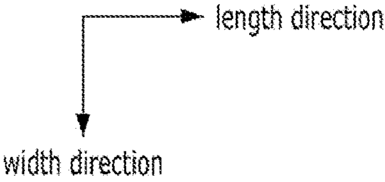
Figure 25E:
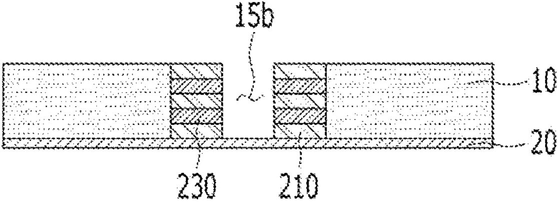

Next, referring to FIGS. 25A, 25B, 25C, 25D, and 25E, FIG. 25A is a plan view illustrating the mold 10 in which first and second additional spaces 15*a* and 15*b* are formed by removing the first and second sacrificial mold portions 14*a* and 14*b*, FIG. 25B is a sectional view taken along line A-A' of FIG. 25A. FIG. 25C is a sectional view taken along line B-B' of FIG. 25A. FIG. 25D is a sectional view taken along line C-C' of FIG. 25A, and FIG. 25E is a sectional view taken along line D-D' of FIG. 25A.

The step of removing the first and second sacrificial mold portions 14*a* and 14*b* is performed. The first and second additional spaces 15*a* and 15*b* are formed in the mold 10 by removing the first and second sacrificial mold portions 14*a* and 14*b*. The first additional space 15*a* includes a first inner additional space 16*a* in which the horizontal metal layers 200 exist in the width direction and a first outer additional space 17*a* in which the mold 10 exists in the width direction. The second additional space 15*b* includes a second inner additional space 16*b* in which the horizontal metal layers 200 exist in the width direction and a second outer additional space 17*b* in which the mold 10 exists in the width direction.

The first and second outer additional spaces 17*a* and 17*b* are continuously formed in communication with the first and second inner additional spaces 16*a* and 16*b*, respectively. The first and second inner additional spaces 16*a* and 16*b* are formed inside ends of the horizontal metal layers 200, and the first and second outer additional spaces 17*a* and 17*b* are formed outside the ends of the horizontal metal layers 200.

The first and second inner additional spaces 16*a* and 16*b* become later regions in which first and second inner extension portions 310*a* and 310*b* are formed, and the first and second outer additional spaces 17*a* and 17*b* become later regions in which first and second outer extension portions 320*a* and 320*b* are formed.

Figure 26A:
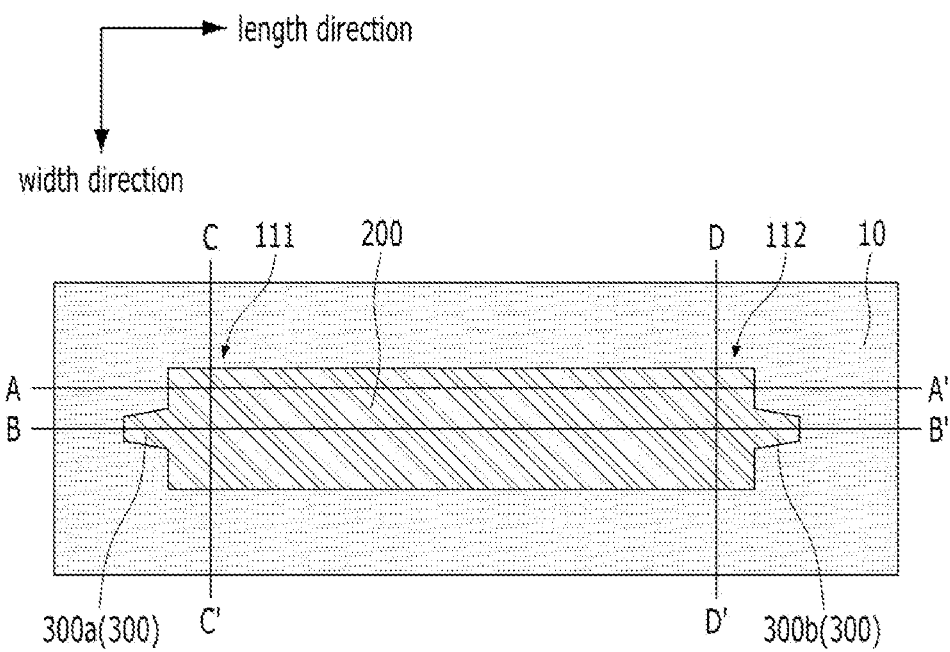
Figure 26B:
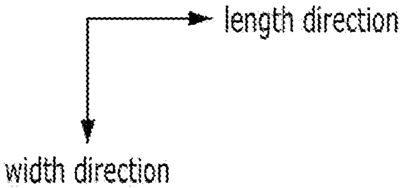
Figure 26B:
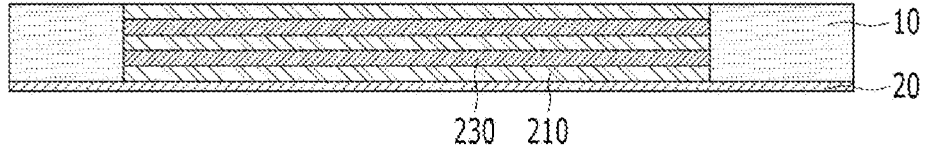
Figure 26C:
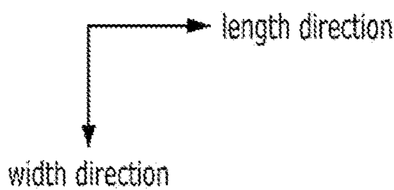
Figure 26C:
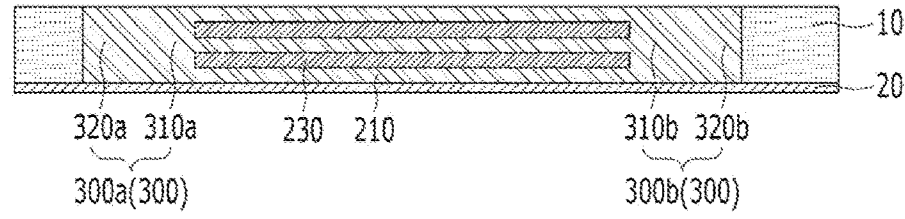
Figure 26D:
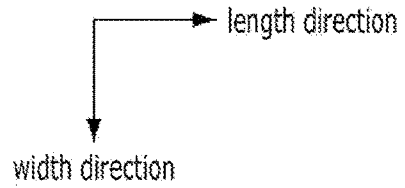
Figure 26D:
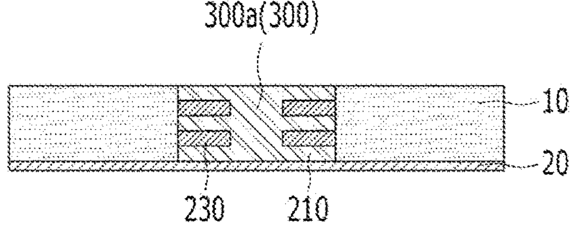
Figure 26E:
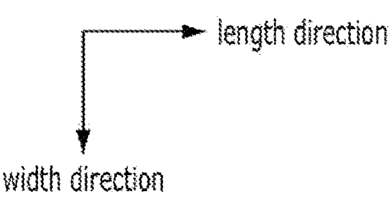
Figure 26E:
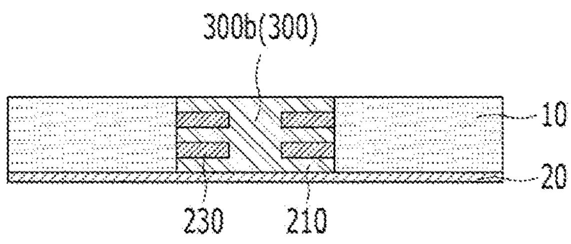

Next, referring to FIGS. 26A, 26B, 26C, 26D, and 26E. FIG. 26A is a plan view illustrating the mold 10 in which a vertical metal layer 300 is formed at each of the first and second end portions 111 and 112. FIG. 26B is a sectional view taken along line A-A' of FIG. 26A, FIG. 26C is a sectional view taken along line B-B' of FIG. 26A, FIG. 26D is a sectional view taken along line C-C' of FIG. 26A, and FIG. 26E is a sectional view taken along line D-D' of FIG. 26A.

The step of forming the vertical metal layer 300 is performed. The vertical metal layer 300 is formed in the first and second additional spaces 15*a* and 15*b* formed in the previous step by electroplating. The first and second inner extension portions 310*a* and 310*b* are formed in the first and second inner additional spaces 16*a* and 16*b*, and first and second outer extension portions 320*a* and 320*b* are formed in the first and second outer additional spaces 17*a* and 17*b*.

The vertical metal layer 300 includes a first vertical metal layer 300*a* provided at the first end portion 111 and a second vertical metal layer 300*b* provided at the second end portion 112. The first vertical metal layer 300*a* includes the first inner extension portion 310*a* and the first outer extension portion 320*a*. The second vertical metal layer 300*b* includes the second inner extension portion 310*b* and the second outer extension portion 320*b*.

The vertical metal layer 300 is integrated with the horizontal metal layers 200 formed in the previous step. The vertical metal layer 300 is made of the same metal as the material of at least one of the horizontal metal layers 200. The vertical metal layer 300 may be made of the same material as the material of a first metal 210 selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. For example, when the first metal 210 is made of a palladium-cobalt (PdCo) alloy, the vertical metal layer 300 may also be made of a palladium-cobalt (PdCo) alloy.

Figure 27A:
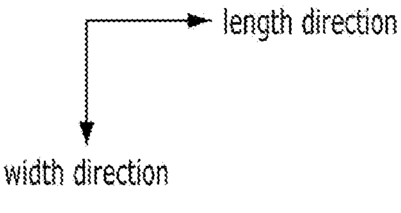
Figure 27A:
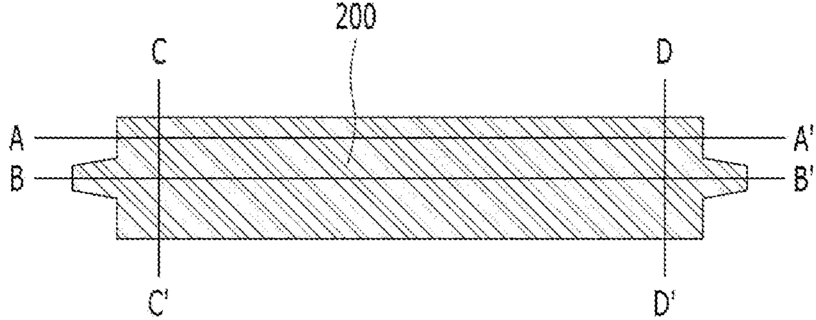
Figure 27B:
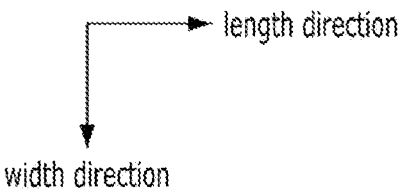
Figure 27B:
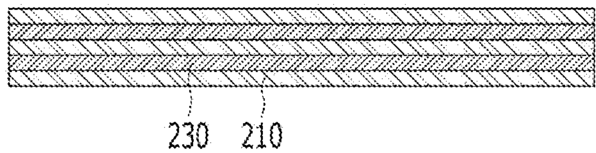
Figure 27C:
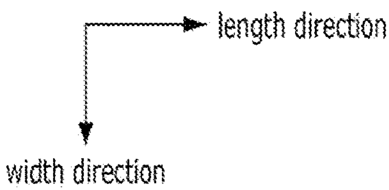
Figure 27C:
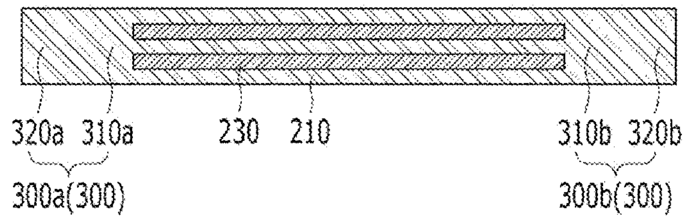
Figure 27D:
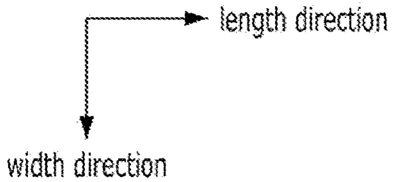
Figure 27D:
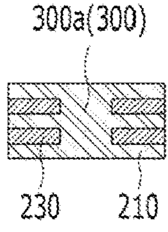
Figure 27E:
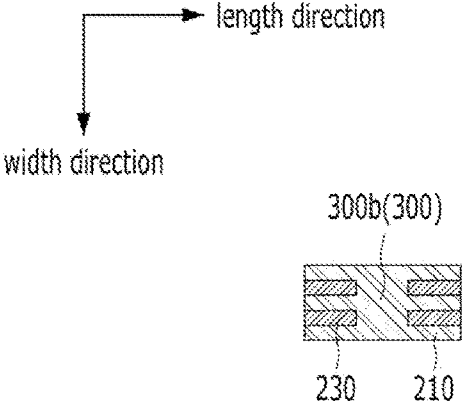
Figures 28A, 28B:
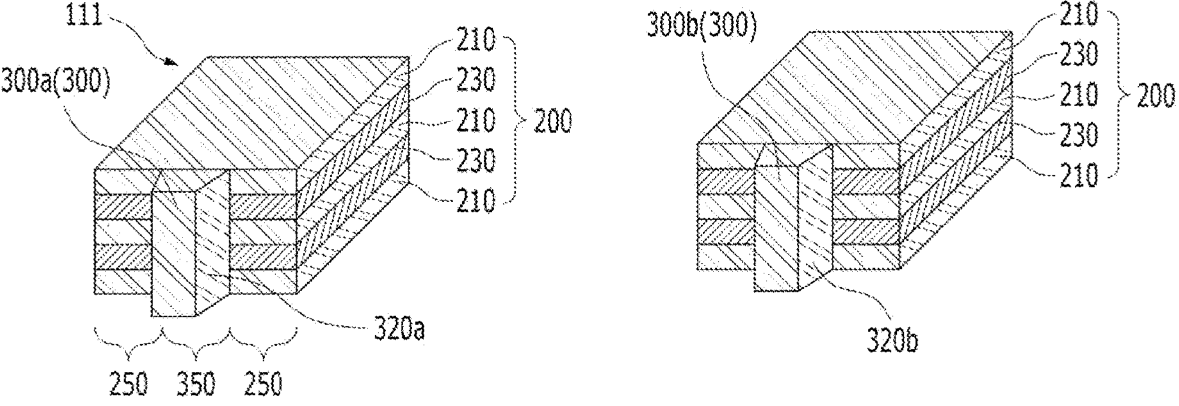
FIG. 28A is a perspective view illustrating a first end portion of the electrically conductive contact pin according to the fourth embodiment of the present disclosure.
FIG. 28B is a perspective view illustrating a second end portion of the electrically conductive contact pin according to the fourth embodiment of the present disclosure.

Next, referring to FIGS. 27A, 27B, 27C. 27D, and 27E, FIG. 27A is a plan view illustrating the electrically conductive contact pin 100, FIG. 27B is a sectional view taken along line A-A' of FIG. 27A. FIG. 27C is a sectional view taken along line B-B' of FIG. 27A, FIG. 27D is a sectional view taken along line C-C' of FIG. 27A, and FIG. 27E is a sectional view taken along line D-D' of FIG. 27A.

The step of removing the mold 10 and the seed layer 20 is performed after the previous step. When the mold 10 is made of an anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

FIG. 28A is a perspective view illustrating a front surface, that is, the first end portion 111, of the electrically conductive contact pin 100 according to the fourth embodiment of the present disclosure, and FIG. 28B is a perspective view illustrating a rear surface, that is, the second end portion 112, of the electrically conductive contact pin 100 according to the fourth embodiment of the present disclosure.

Each of the first end portion 111 and the second end portion 112 is composed of both the horizontal metal layers 200 and the vertical metal layer 300. The vertical metal layer 300 of each end portion includes an inner extension portion 310 extending in the length direction of the electrically conductive contact pin 100 to the inside of the electrically conductive contact pin 100, and an outer extension portion 320 extending in the length direction of the electrically conductive contact pin 100 to the outside of the electrically conductive contact pin 100 and protruding from the end portion of the electrically conductive contact pin 100.

By increasing the content of a metal having high wear resistance or high hardness in the first and second end portions 111 and 112 of the electrically conductive contact pin 100 with the configuration of the vertical metal layer 300, it is possible to improve the wear resistance or hardness characteristics of the first and second end portions 111 and 112 and at the same time increase the content of a metal having high electrical conductivity in a body portion 130 of the electrically conductive contact pin 100, thereby improving the current carrying capacity.

In addition, since the outer extension portion 320 of the electrically conductive contact pin 100 has a length of 100 μm to 400 μm, it is possible to implement the same cross-sectional structure even when the first and second end portions 111 and 112 are shortened to the length of 100 μm to 400 μm. With this configuration, it is possible to reuse the first and second end portions 111 and 112 by grinding them within the range of 100 μm to 400 μm.

Fifth Embodiment

Next, a fifth embodiment according to the present disclosure will be described. However, the embodiments described below will be mainly described in terms of characteristic elements in comparison with the first embodiment, and descriptions of the same or similar elements to the first embodiment will be omitted.

Hereinafter, an electrically conductive contact pin 100 according to the fifth embodiment of the present disclosure will be described with reference to FIGS. 29 to 37B.

Figure 29:
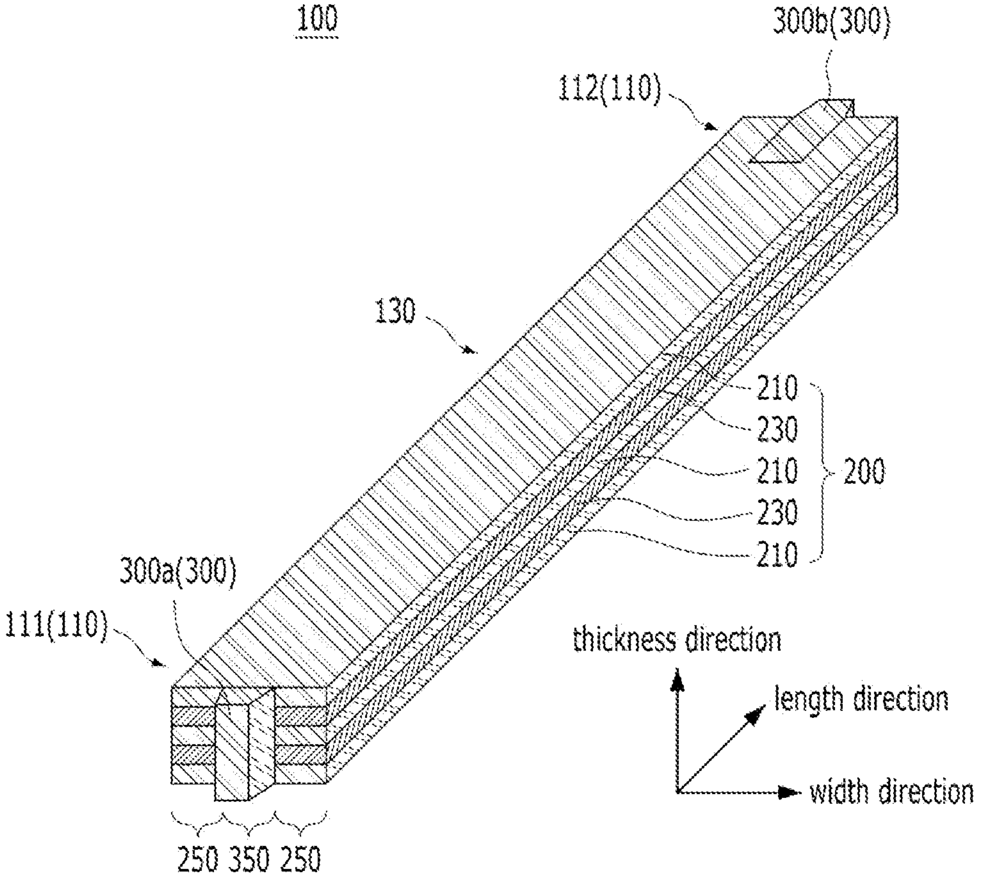
FIG. 29 is a perspective view illustrating an electrically conductive contact pin according to a fifth embodiment of the present disclosure.

FIG. 29 is a perspective view illustrating the electrically conductive contact pin 100 according to the fifth embodiment of the present disclosure. FIGS. 30A to 36E are views illustrating a manufacturing method for the electrically conductive contact pin 100 according to the fifth embodiment of the present disclosure. FIGS. 37A and 37B are perspective views illustrating a first end portion 111 (FIG. 37A) and a second end portion 112 (FIG. 37B) of the electrically conductive contact pin 100 according to the fifth embodiment of the present disclosure. The electrically conductive contact pin 100 according to the fifth embodiment of the present disclosure is different from the electrically conductive contact pin 100 according to the first embodiment in that a vertical metal layer 300 includes an outer extension portion 320 extending in the length direction of the electrically conductive contact pin 100 to the outside of the electrically conductive contact pin 100 and protruding from each of the first and second end portions 111 and 112 of the electrically conductive contact pin 100.

At the first end portion 111, a first vertical metal layer 300*a* includes a first inner extension portion 310*a* extending in the length direction of the electrically conductive contact pin 100 to the inside of the electrically conductive contact pin 100, and a first outer extension portion 320*a* extending in the length direction of the electrically conductive contact pin 100 to the outside of the electrically conductive contact pin 100 and protruding from the end portion of the electrically conductive contact pin 100.

At the second end portion 112, a second vertical metal layer **300*b* includes a second inner extension portion 310*b* extending in the length direction of the electrically conductive contact pin 100 to the inside of the electrically conductive contact pin 100, and a second outer extension portion 320*b* extending in the length direction of the electrically conductive contact pin 100 to the outside of the electrically conductive contact pin 100 and protruding from the end portion of the electrically conductive contact pin 100**.

In addition, the second vertical metal layer **300*b* of the second end portion 112 is made of a material different from the material of the first vertical metal layer 300*a* of the first end portion 111**.

Hereinafter, a manufacturing method for the electrically conductive contact pin 100 according to the fifth embodiment of the present disclosure will be described with reference to FIGS. 30A to 36E.

Figure 30A:
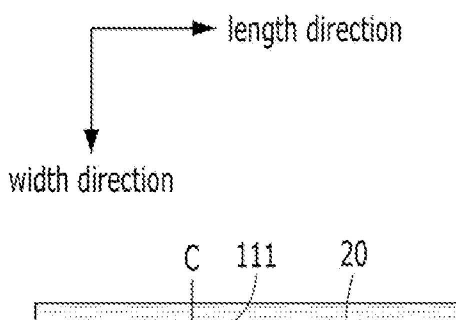
FIGS. 30A to 36E are views illustrating a manufacturing method for the electrically conductive contact pin according to the fifth embodiment of the present disclosure.
Figure 30A:
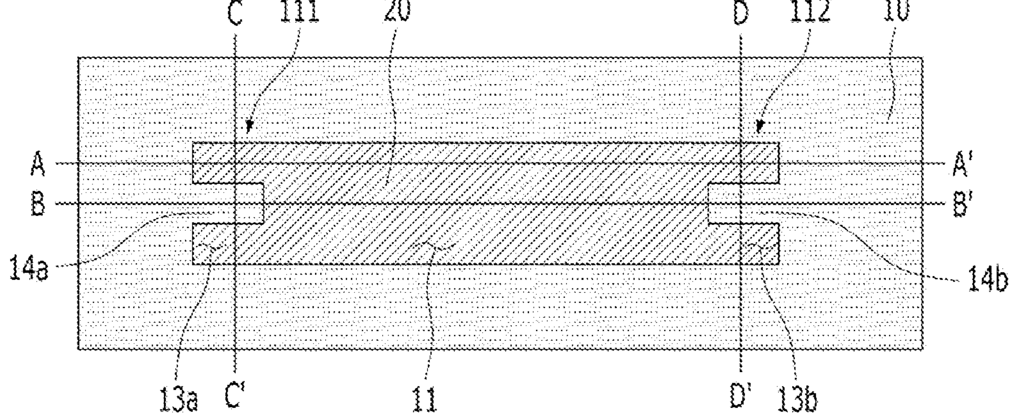
Figure 30B:
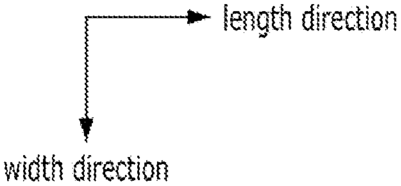
Figure 30B:
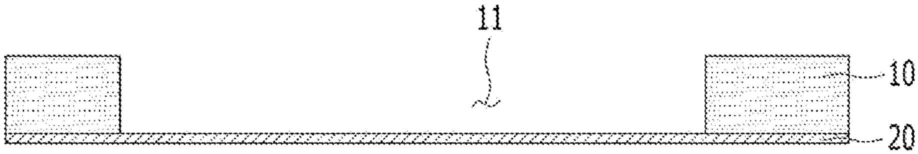
Figure 30C:
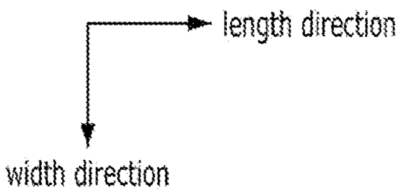
Figure 30C:
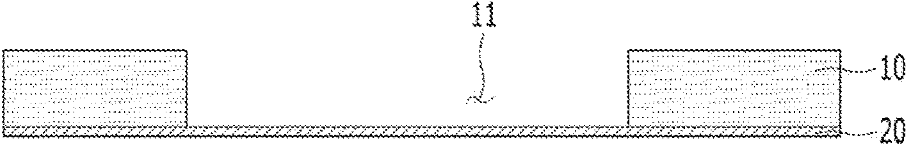
Figure 30D:
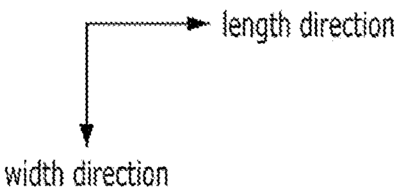
Figure 30D:
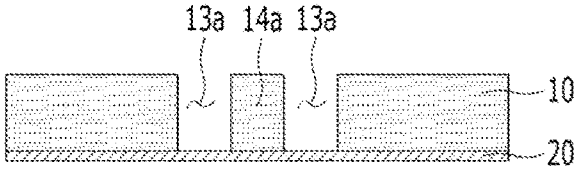
Figure 30E:
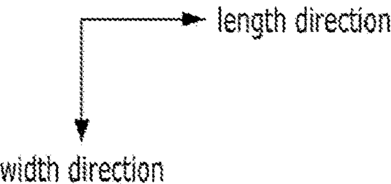
Figure 30E:
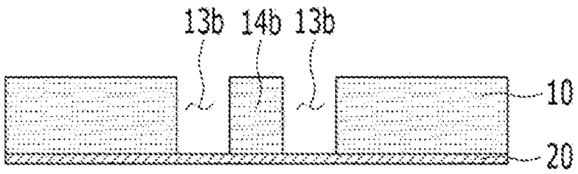

Referring to FIGS. 30A, 30B, 30C, 30D, and 30E, FIG. 30A is a plan view illustrating a mold 10 in which an inner space 11 is formed. FIG. 30B is a sectional view taken along line A-A' of FIG. 30A. FIG. 30C is a sectional view taken along line B-B' of FIG. 30A. FIG. 30D is a sectional view taken along line C-C' of FIG. 30A, and FIG. 30E is a sectional view taken along line D-D' of FIG. 30A.

Referring to FIGS. 30A, 30B, 30C. 30D, and 30E, the inner space 11 is formed in the mold 10, and a seed layer 20 is provided under the mold 10. The inner space 11 formed in the mold 10 includes a first end extension space **13*a* at a position corresponding to a first end portion 111 of the electrically conductive contact pin 100 and a second end extension space 13*b* at a position corresponding to a second end portion 112 of the electrically conductive contact pin. Two first end extension spaces 13*a* and two second end extension spaces 13*b* are formed in the width direction of the electrically conductive contact pin 100. First and second sacrificial mold portions 14*a* and 14*b* to be removed later are located between the two first end extension spaces 13*a* and the two second end extension spaces 13*b*, respectively. The first and second sacrificial mold portions 14*a* and 14*b* are parts of the mold 10 that are removed after a plurality of horizontal metal layers 200** are formed.

Figure 31A:
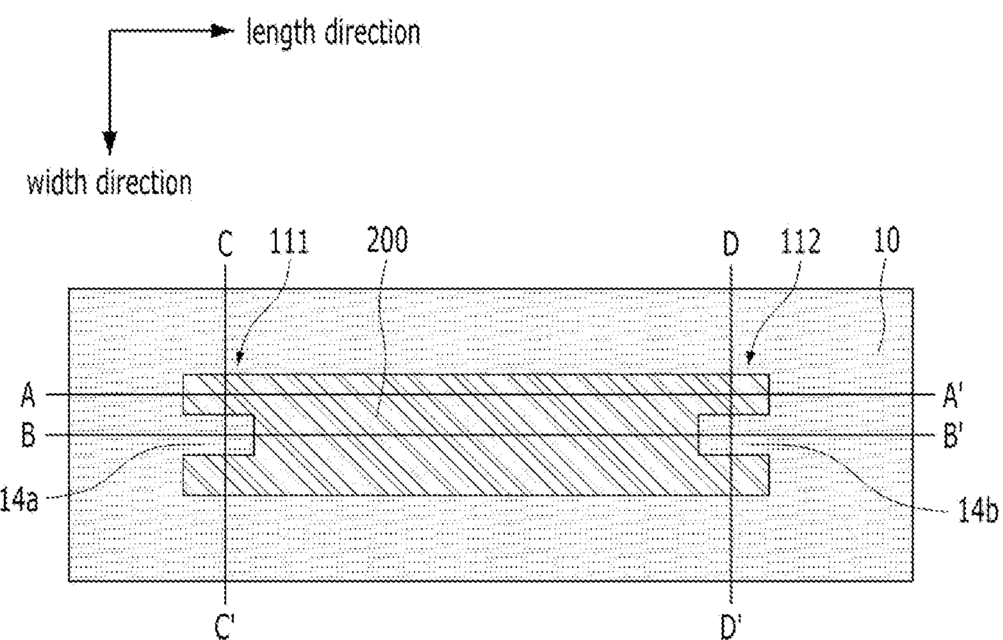
Figure 31B:
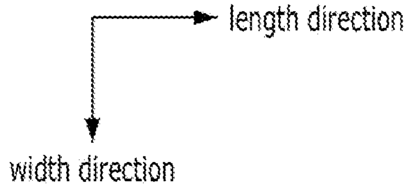
Figure 31B:
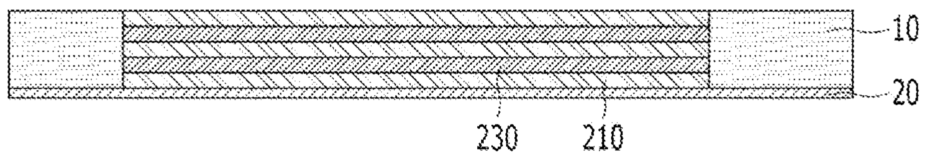
Figure 31C:
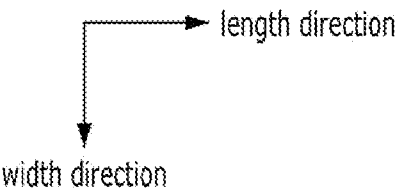
Figure 31C:
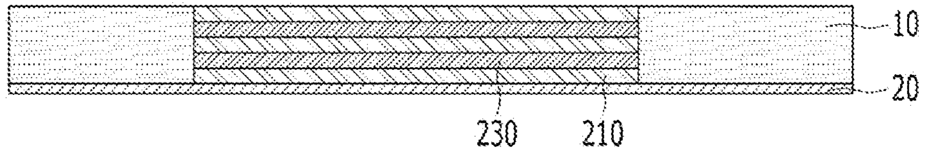
Figure 31D:
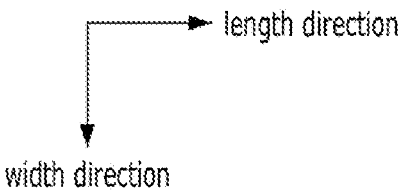
Figure 31D:
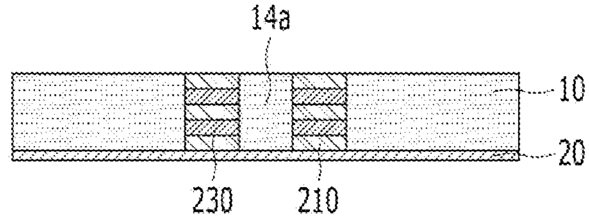
Figure 31E:
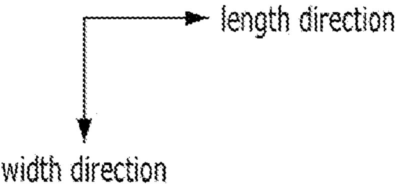
Figure 31E:
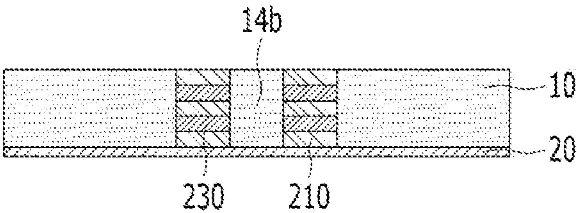

Next, referring to FIGS. 31A, 31B, 31C, 31D, and 31E, FIG. 31A is a plan view illustrating the mold 10 in which the horizontal metal layers 200 are formed in the inner space 11. FIG. 31B is a sectional view taken along line A-A' of FIG. 31A, FIG. 31C is a sectional view taken along line B-B' of FIG. 31A, FIG. 31D is a sectional view taken along line C-C' of FIG. 31A, and FIG. 31E is a sectional view taken along line D-D' of FIG. 31A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au).

Figure 32A:
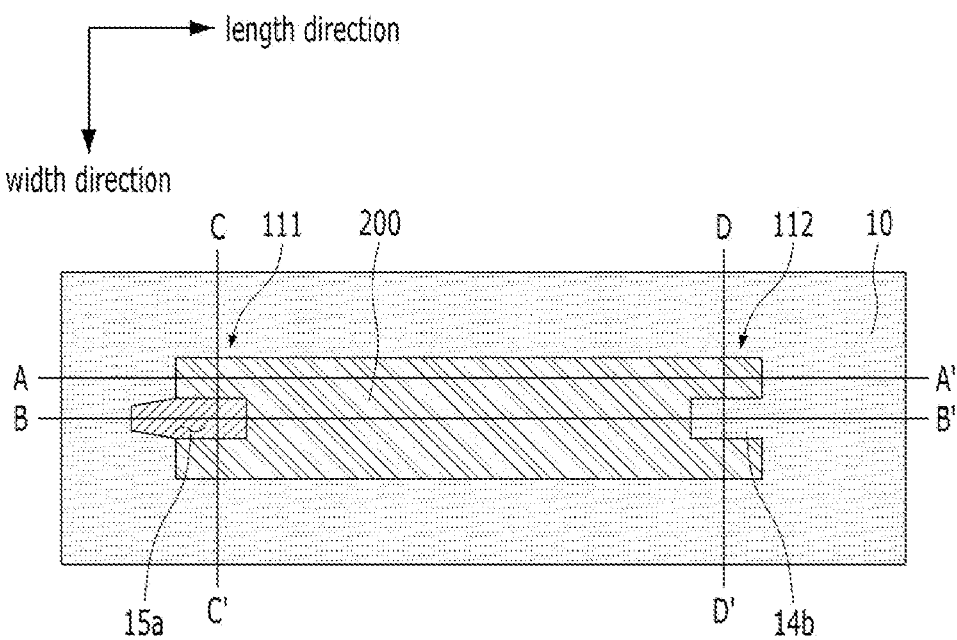
Figure 32B:
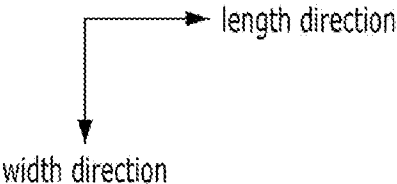
Figure 32B:
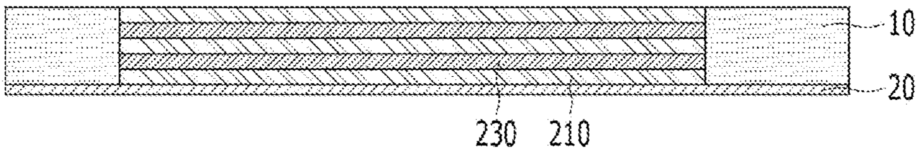
Figure 32C:
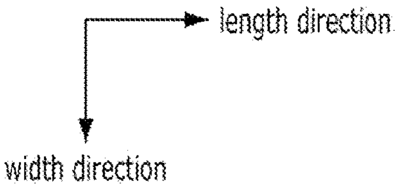
Figure 32C:
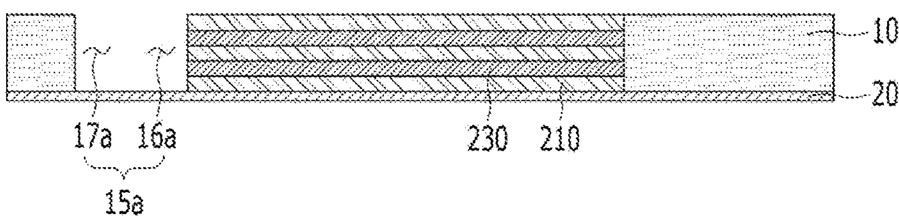
Figure 32D:
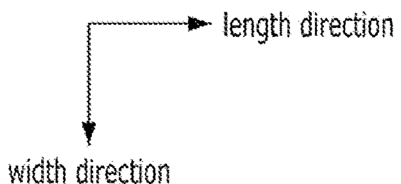
Figure 32D:
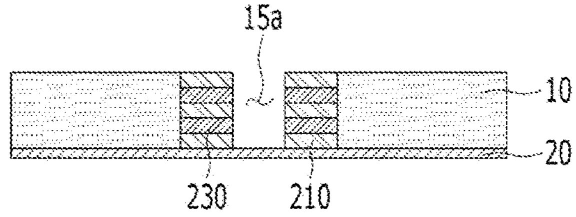
Figure 32E:
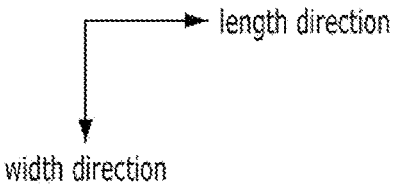
Figure 32E:
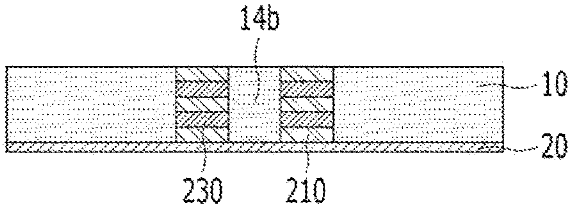

Next, referring to FIGS. 32A, 32B, 32C, 32D, and 32E, FIG. 32A is a plan view illustrating the mold 10 in which a first additional space **15*a* is formed by removing the first sacrificial mold portion 14*a*, FIG. 32B is a sectional view taken along line A-A' of FIG. 32A, FIG. 32C is a sectional view taken along line B-B' of FIG. 32A. FIG. 32D is a sectional view taken along line C-C' of FIG. 32A, and FIG. 32E is a sectional view taken along line D-D' of FIG. 32**A.

The step of removing the first sacrificial mold portion **14*a* is performed. The first additional space 15*a* is formed in the mold 10 by removing the first sacrificial mold portion 14*a*. The first additional space 15*a* includes a first inner additional space 16*a* in which the horizontal metal layers 200 exist in the width direction and a first outer additional space 17*a* in which the mold 10** exists in the width direction.

The first outer additional space **17*a* is continuously formed in communication with the first inner additional space 16*a*. The first inner additional space 16*a* is formed inside ends of the horizontal metal layers 200, and the first outer additional space 17*a* is formed outside the ends of the horizontal metal layers 200**.

The first inner additional space **16*a* becomes later a region in which a first inner extension portion 310*a*** is formed.

Figure 33A:
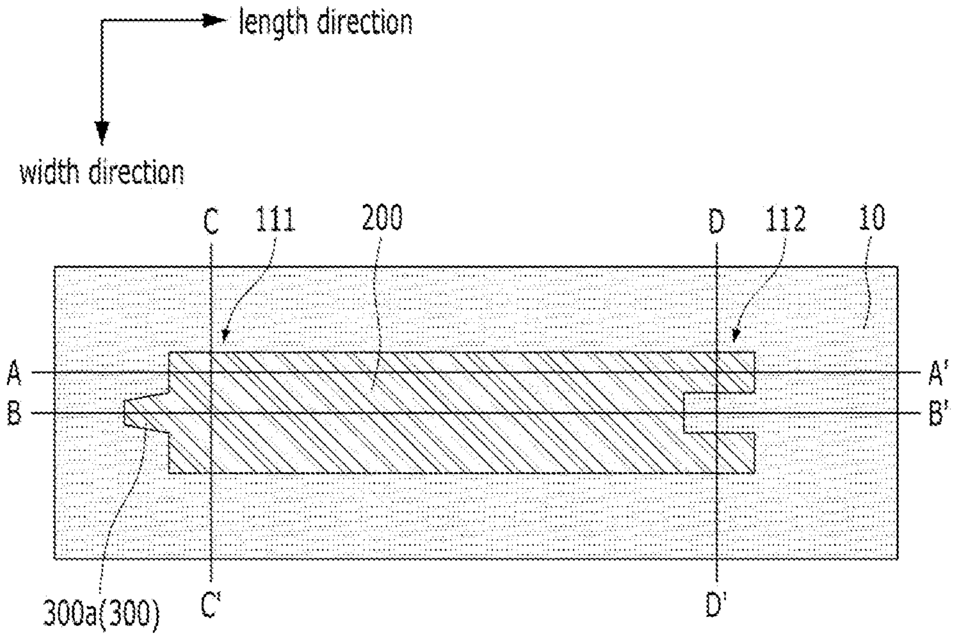
Figure 33B:
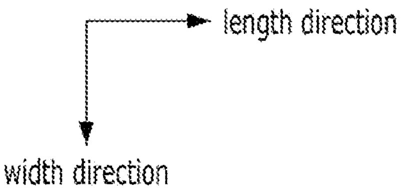
Figure 33B:
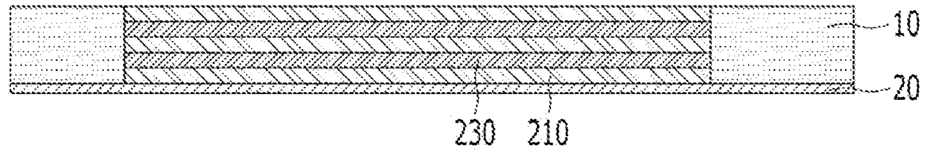
Figure 33C:
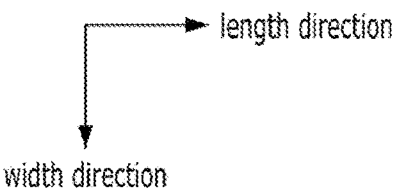
Figure 33C:
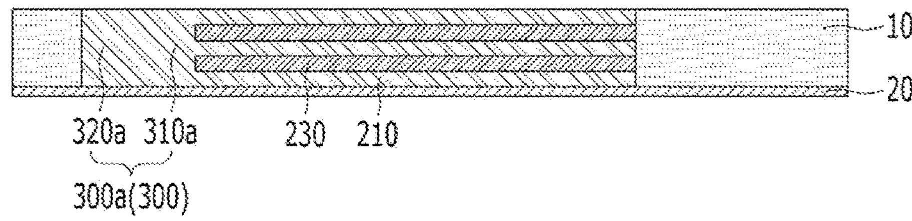
Figure 33D:
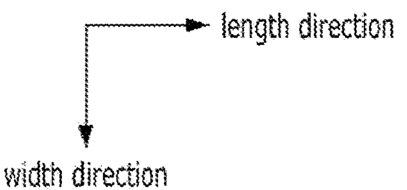
Figure 33D:
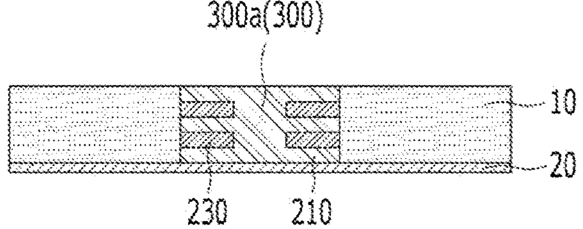
Figure 33E:
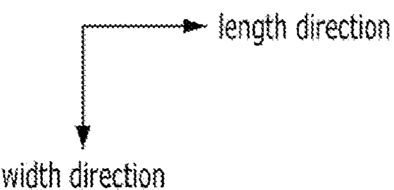
Figure 33E:
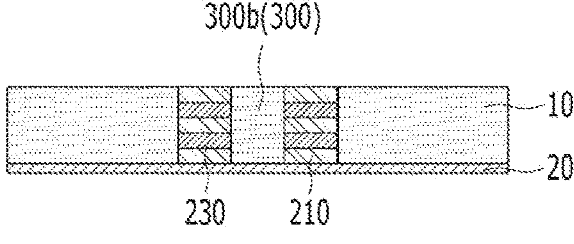

Next, referring to FIGS. 33A, 33B, 33C, 33D, and 33E, FIG. 33A is a plan view illustrating the mold 10 in which a first vertical metal layer **300*a* is formed at the first end portion 111. FIG. 33B is a sectional view taken along line A-A' of FIG. 33A, FIG. 33C is a sectional view taken along line B-B' of FIG. 33A. FIG. 33D is a sectional view taken along line C-C' of FIG. 33A, and FIG. 33E is a sectional view taken along line D-D' of FIG. 33**A.

The step of forming the first vertical metal layer **300*a* is performed. The first vertical metal layer 300*a* is formed in the first additional space 15*a* formed in the previous step by electroplating. The first inner extension portion 310*a* is formed in the first inner additional space 16*a*, and a first outer extension portion 320*a* is formed in the first outer additional space 17*a***.

The first vertical metal layer **300*a*** may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy.

Figure 34A:
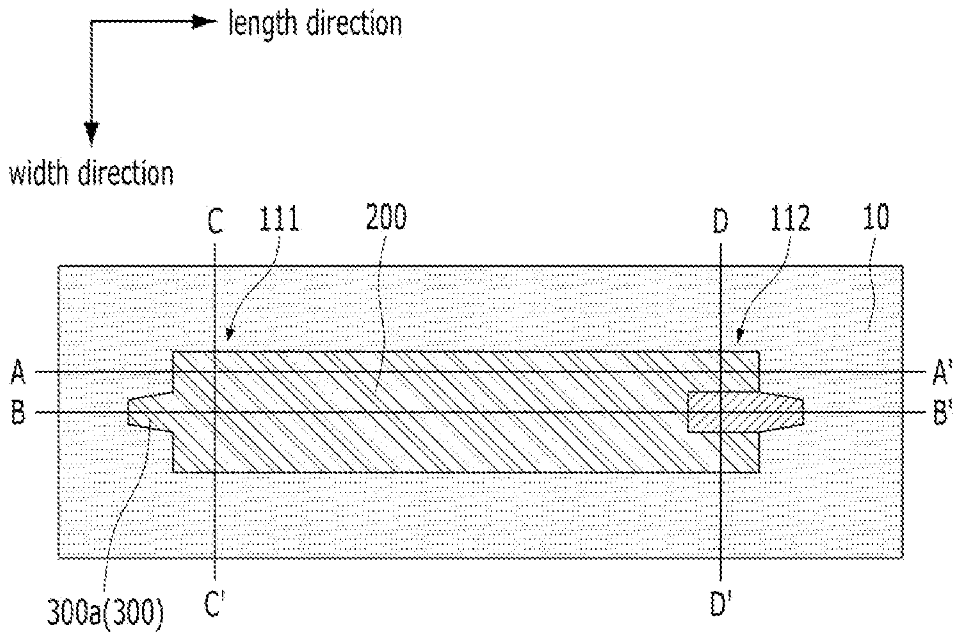
Figure 34B:
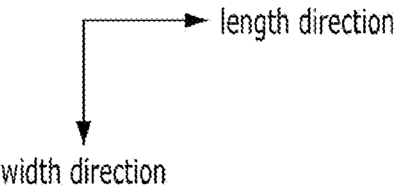
Figure 34B:
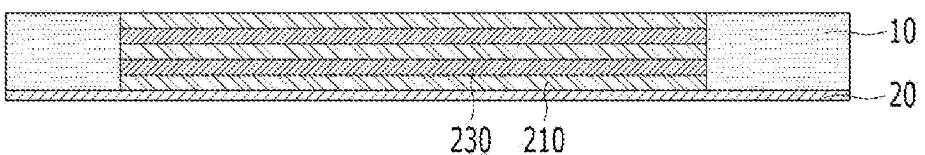
Figure 34C:
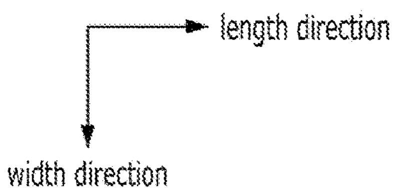
Figure 34C:
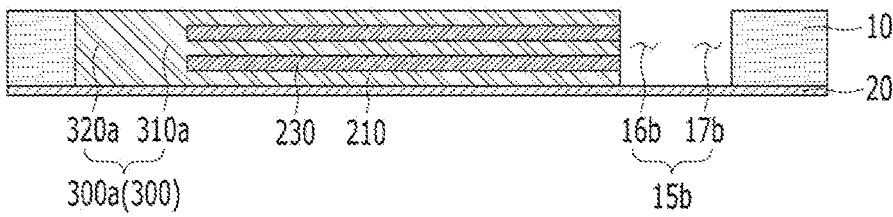
Figure 34D:
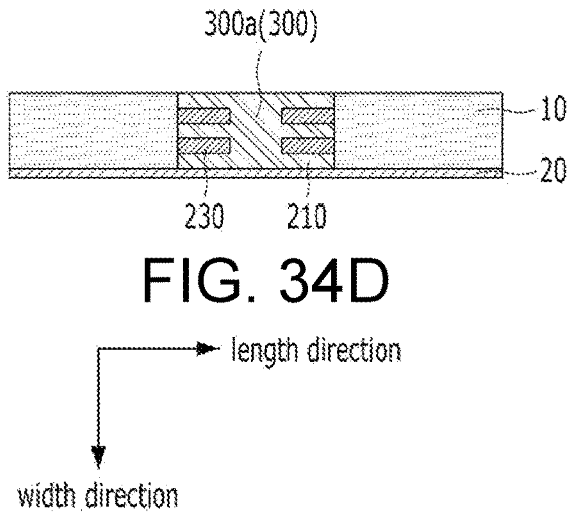
Figure 34E:
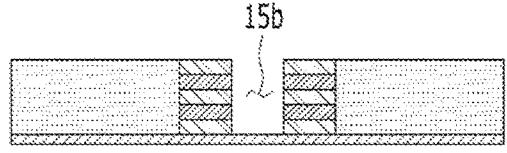

Next, referring to FIGS. 34A, 34B, 34C. 34D, and 34E, FIG. 34A is a plan view illustrating the mold 10 in which a second additional space **15*b* is formed by removing the second sacrificial mold portion 14*b*, FIG. 34B is a sectional view taken along line A-A' of FIG. 34A. FIG. 34C is a sectional view taken along line B-B' of FIG. 34A, FIG. 34D is a sectional view taken along line C-C' of FIG. 34A, and FIG. 34E is a sectional view taken along line D-D' of FIG. 34**A.

The step of removing the second sacrificial mold portion **14*b* is performed. The second additional space 15*b* is formed in the mold 10 by removing the second sacrificial mold portion 14*b*. The second additional space 15*b* includes a second inner additional space 16*b* in which the horizontal metal layers 200 exist in the width direction and a second outer additional space 17*b* in which the mold 10** exists in the width direction.

The second outer additional space **17*b* is continuously formed in communication with the second inner additional space 16*b*. The second inner additional space 16*b* is formed inside ends of the horizontal metal layers 200, and the second outer additional space 17*b* is formed outside the ends of the horizontal metal layers 200**.

The second inner additional space **16*b* becomes later a region in which a second inner extension portion 310*b*** is formed.

Figure 35A:
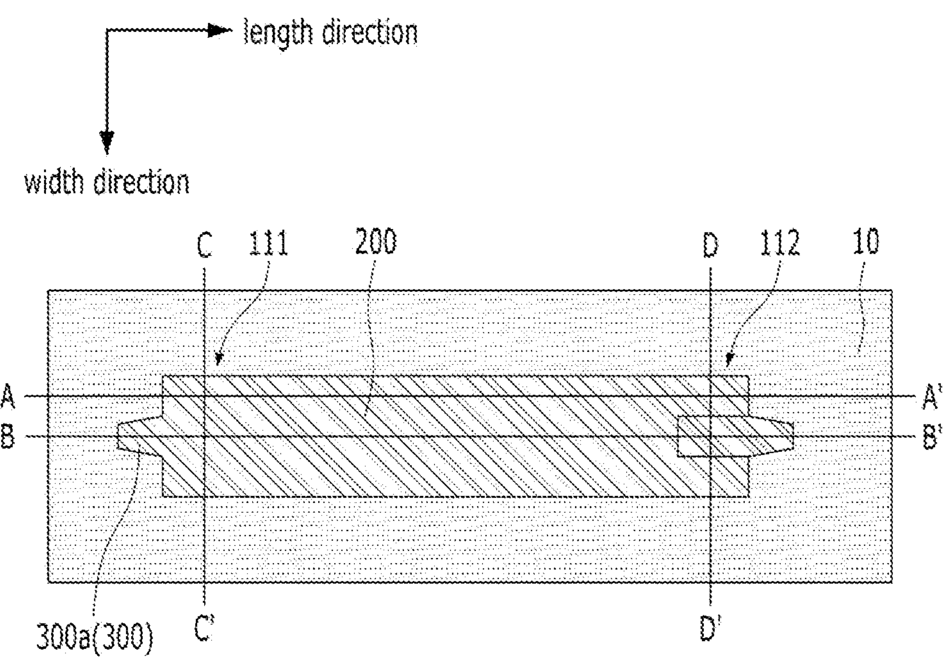
Figure 35B:
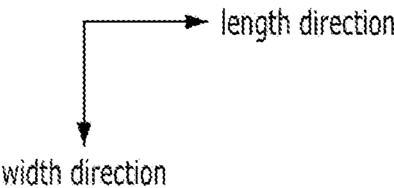
Figure 35B:
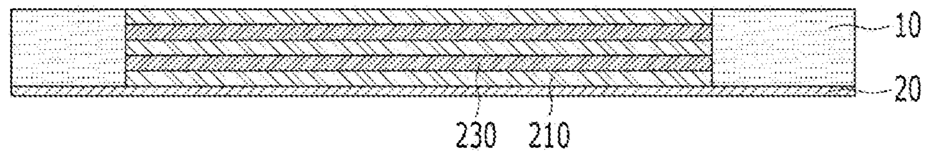
Figure 35C:
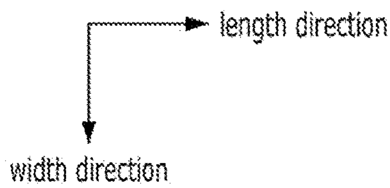
Figure 35C:
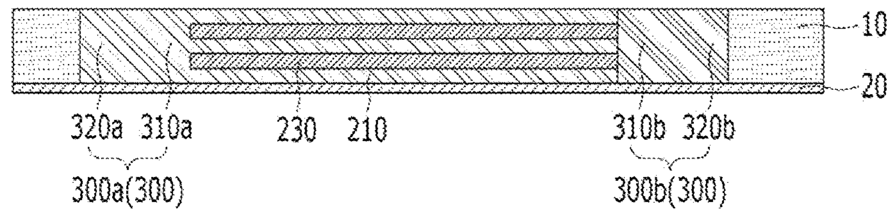
Figure 35D:
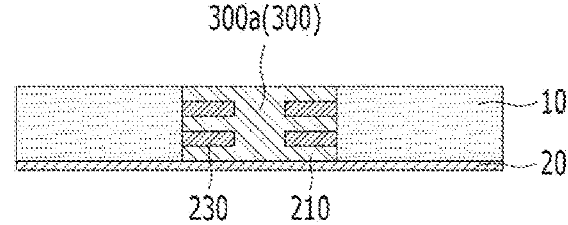
Figure 35E:
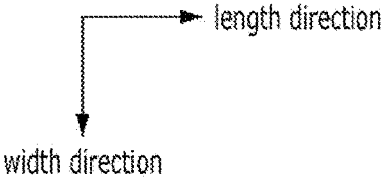
Figure 35E:
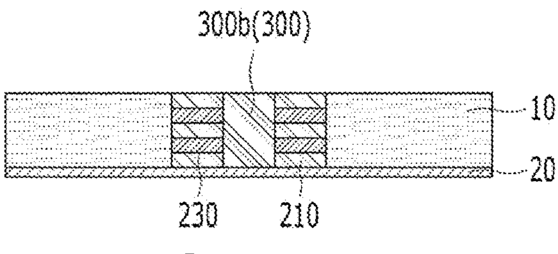

Next, referring to FIGS. 35A, 35B. 35C. 35D, and 35E, FIG. 35A is a plan view illustrating the mold 10 in which a second vertical metal layer 300*b* is formed at the second end portion 112. FIG. 35B is a sectional view taken along line A-A' of FIG. 35A, FIG. 35C is a sectional view taken along line B-B' of FIG. 35A, FIG. 35D is a sectional view taken along line C-C' of FIG. 35A, and FIG. 35E is a sectional view taken along line D-D' of FIG. 35A.

The step of forming the second vertical metal layer 300*b* is performed. The second vertical metal layer 300*b* is formed in the second additional space 15*b* formed in the previous step by electroplating. The second inner extension portion 310*b* is formed in the second inner additional space 16*b*, and a second outer extension portion 320*b* is formed in the second outer additional space 17*b*.

The second vertical metal layer 300 may be selected from the group consisting of copper (Cu), silver (Ag), and gold (Au).

Figure 36A:
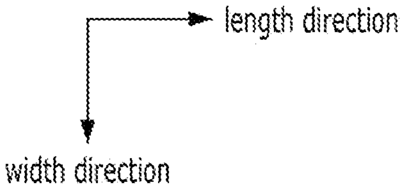
Figure 36A:
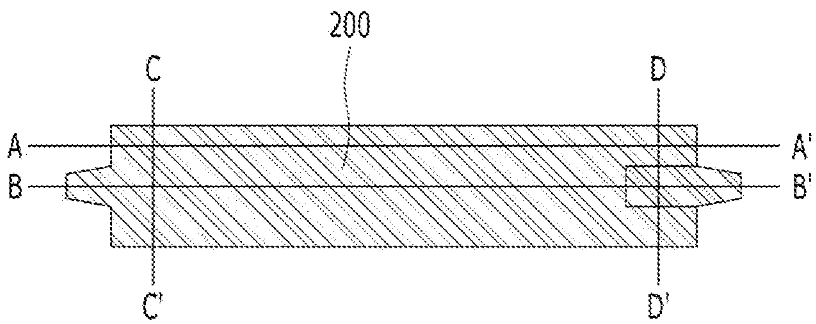
Figure 36B:
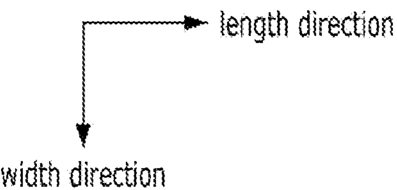
Figure 36B:
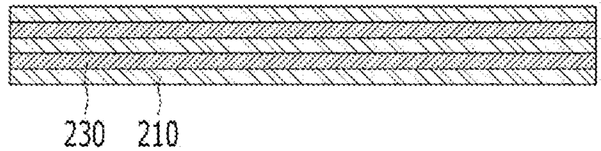
Figure 36C:
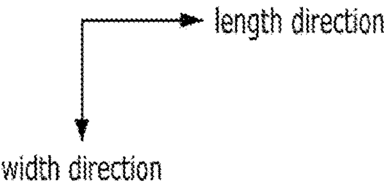
Figure 36C:
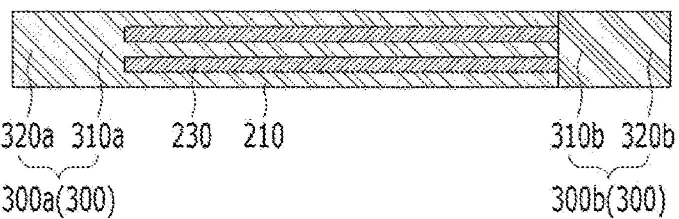
Figure 36D:
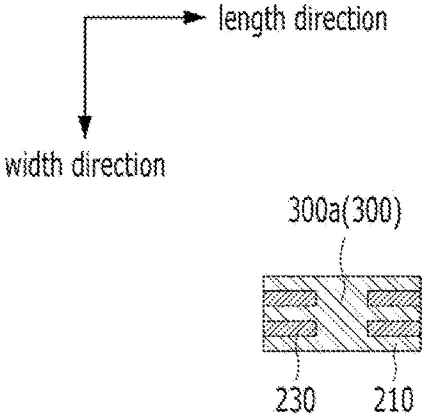
Figure 36E:
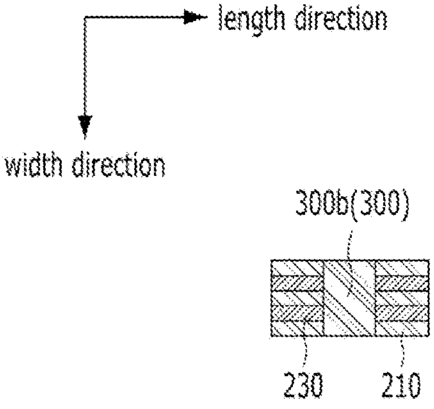
Figures 37A, 37B:
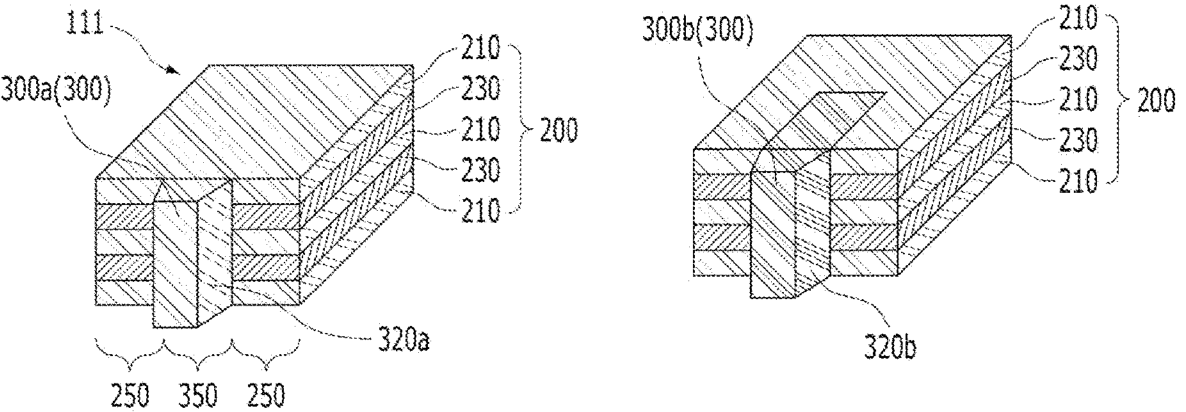
FIG. 37A is a perspective view illustrating a first end portion of the electrically conductive contact pin according to the fifth embodiment of the present disclosure.
FIG. 37B is a perspective view illustrating a second end portion of the electrically conductive contact pin according to the fifth embodiment of the present disclosure.

Next, referring to FIGS. 36A, 36B, 36C, 36D, and 36E, FIG. 36A is a plan view illustrating the electrically conductive contact pin 100. FIG. 36B is a sectional view taken along line A-A' of FIG. 36A. FIG. 36C is a sectional view taken along line B-B' of FIG. 36A, FIG. 36D is a sectional view taken along line C-C' of FIG. 36A, and FIG. 36E is a sectional view taken along line D-D' of FIG. 36A.

The step of removing the mold 10 and the seed layer 20 is performed after the previous step. When the mold 10 is made of an anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

FIG. 37A is a perspective view illustrating a front surface, that is, the first end portion 111, of the electrically conductive contact pin 100 according to the fifth embodiment of the present disclosure, and FIG. 37B is a perspective view illustrating a rear surface, that is, the second end portion 112, of the electrically conductive contact pin 100 according to the fifth embodiment of the present disclosure.

Each of the first end portion 111 and the second end portion 112 is composed of both the horizontal metal layers 200 and the vertical metal layer 300. The vertical metal layer 300 of each end portion includes an inner extension portion 310 extending in the length direction of the electrically conductive contact pin 100 to the inside of the electrically conductive contact pin 100, and an outer extension portion 320 extending in the length direction of the electrically conductive contact pin 100 to the outside of the electrically conductive contact pin 100 and protruding from the end portion of the electrically conductive contact pin 100.

By increasing the content of a metal having high wear resistance or high hardness in the first end portion 111 of the electrically conductive contact pin 100 with the configuration of the first vertical metal layer 300*a*, it is possible to improve the wear resistance or hardness characteristics of the first end portion 111 and at the same time increase the content of a metal having high electrical conductivity in a body portion 130 of the electrically conductive contact pin 100, thereby improving the current carrying capacity. In addition, by increasing the content of a metal having high electrical conductivity in the second end portion 112 of the electrically conductive contact pin 100 with the configuration of the second vertical metal layer 300*b*, it is possible to prevent the occurrence of arcing and improve the current carrying capacity.

In addition, since the outer extension portion 320 of the electrically conductive contact pin 100 has a length of 100 μm to 400 μm, it is possible to implement the same cross-sectional structure even when the first and second end portions 111 and 112 are shortened to the length of 100 μm to 400 μm. With this configuration, it is possible to reuse the first and second end portions 111 and 112 by grinding them within the range of 100 μm to 400 μm.

Sixth Embodiment

Next, a sixth embodiment according to the present disclosure will be described. However, the embodiments described below will be mainly described in terms of characteristic elements in comparison with the first embodiment, and descriptions of the same or similar elements to the first embodiment will be omitted.

Hereinafter, an electrically conductive contact pin 100 according to the sixth embodiment of the present disclosure will be described with reference to FIGS. 38 to 44B.

Figure 38:
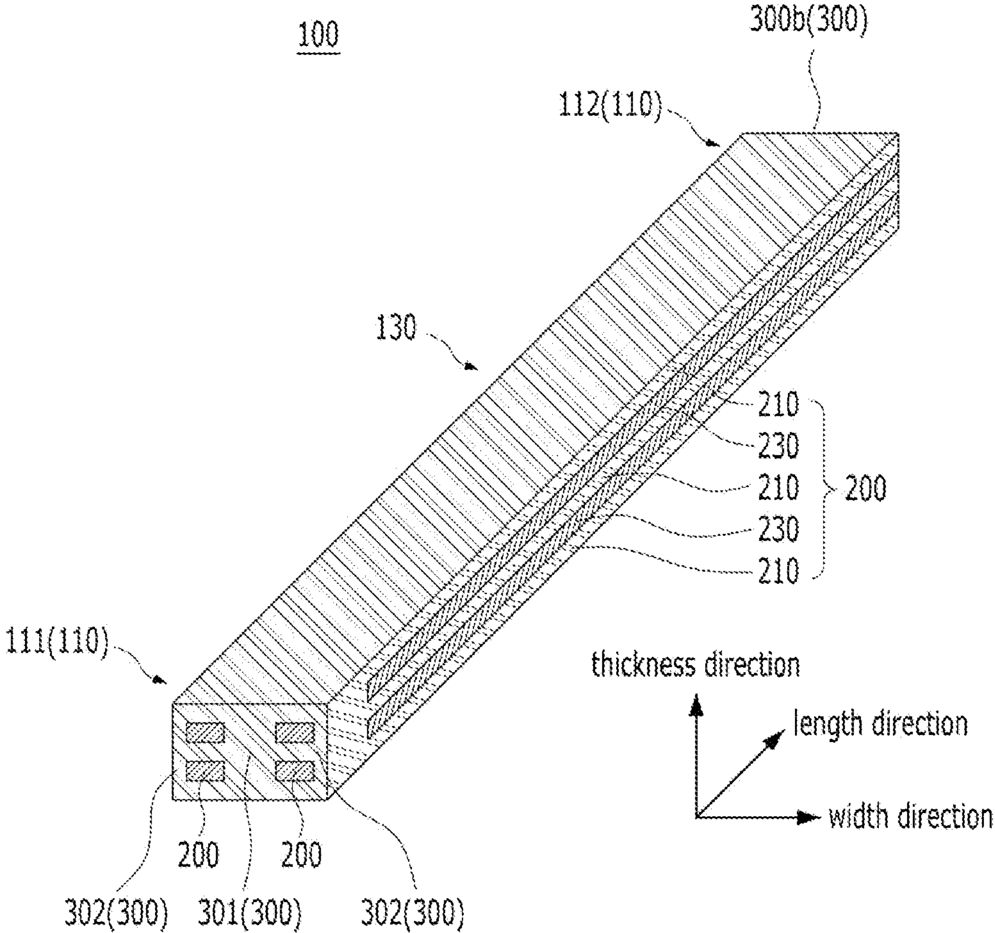
FIG. 38 is a perspective view illustrating an electrically conductive contact pin according to a sixth embodiment of the present disclosure.

FIG. 38 is a perspective view illustrating the electrically conductive contact pin 100 according to the sixth embodiment of the present disclosure. FIGS. 39A to 43E are views illustrating a manufacturing method for the electrically conductive contact pin 100 according to the sixth embodiment of the present disclosure. FIGS. 44A and 44B are perspective views illustrating a first end portion 111 (FIG. 44A) and a second end portion 112 (FIG. 44B) of the electrically conductive contact pin 100 according to the sixth embodiment of the present disclosure.

The electrically conductive contact pin 100 according to the sixth embodiment of the present disclosure is different from the electrically conductive contact pin 100 according to the first embodiment in that a vertical metal layer 300 is also provided at opposite sides of an end portion 110 of the electrically conductive contact pin 100.

In the electrically conductive contact pin 100 according to the sixth embodiment, the vertical metal layer 300 includes a center vertical metal layer 301 located at a center of an end portion of the electrically conductive contact pin 100 and opposite side vertical metal layers 302 located at opposite sides of the end portion of the electrically conductive contact pin 100.

Hereinafter, a manufacturing method for the electrically conductive contact pin 100 according to the sixth embodiment of the present disclosure will be described with reference to FIGS. 39A to 43E.

Figure 39A:
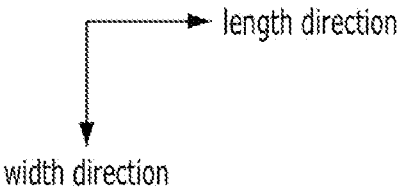
FIGS. 39A to 43E are views illustrating a manufacturing method for the electrically conductive contact pin according to the sixth embodiment of the present disclosure.
Figure 39A:
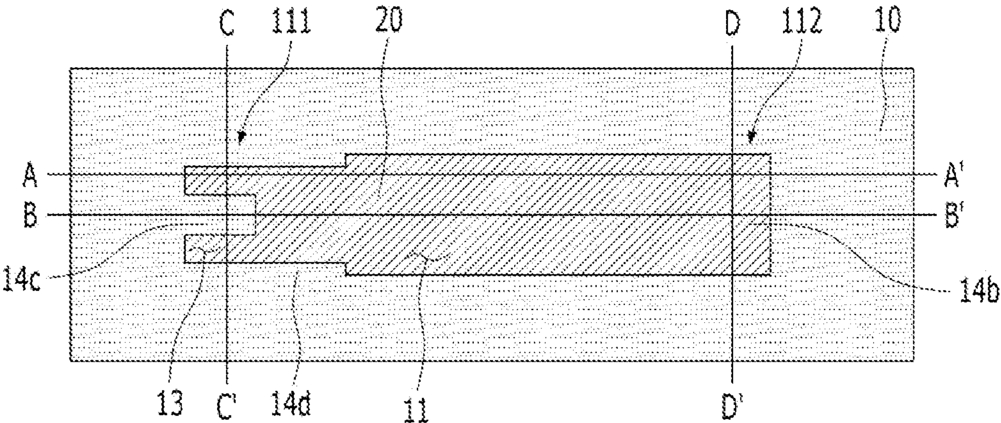
Figure 39B:
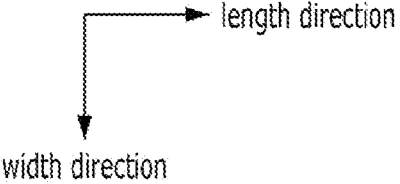
Figure 39B:
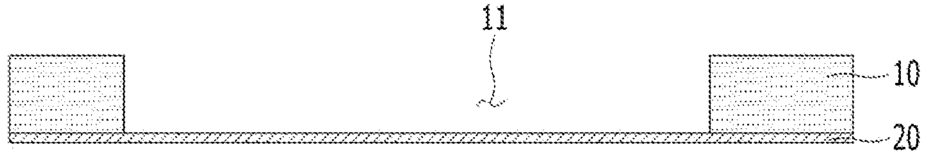
Figure 39C:
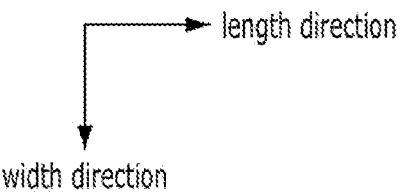
Figure 39C:
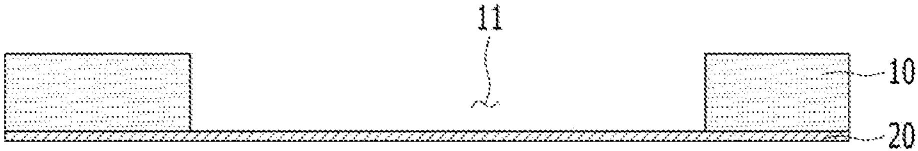
Figure 39D:
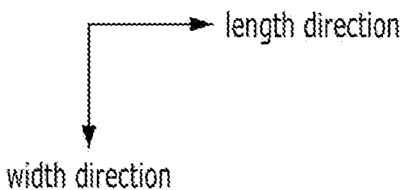
Figure 39D:
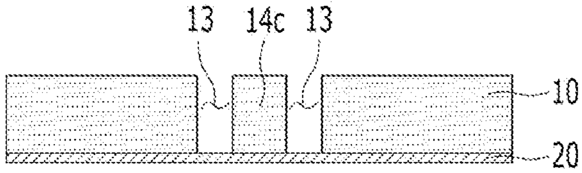
Figure 39E:
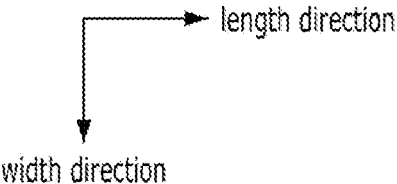
Figure 39E:
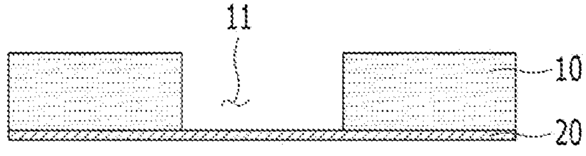

Referring to FIGS. 39A, 39B, 39C. 39D, and 39E, FIG. 39A is a plan view illustrating a mold 10 in which an inner space 11 is formed. FIG. 39B is a sectional view taken along line A-A' of FIG. 39A. FIG. 39C is a sectional view taken along line B-B' of FIG. 39A, FIG. 39D is a sectional view taken along line C-C' of FIG. 39A, and FIG. 39E is a sectional view taken along line D-D' of FIG. 39A.

Referring to FIGS. 39A, 39B, 39C, 39D, and 39E, the inner space 11 is formed in the mold 10, and a seed layer 20 is provided under the mold 10. The inner space 11 formed in the mold 10 includes an end extension space 13 at a position corresponding to a first end portion 111 of the electrically conductive contact pin 100. Two end extension spaces 13 are formed in the width direction of the electrically conductive contact pin 100. An end sacrificial mold portion 14*c* to be removed later is located between the two end extension spaces 13. Opposite side sacrificial mold portions 14*d* to be removed later are located outside the end extension spaces 13. The end sacrificial mold portion 14*c* and the sacrificial mold portions 14*d* are parts of the mold 10 that are removed after a plurality of horizontal metal layers 200 are formed.

Figure 40A:
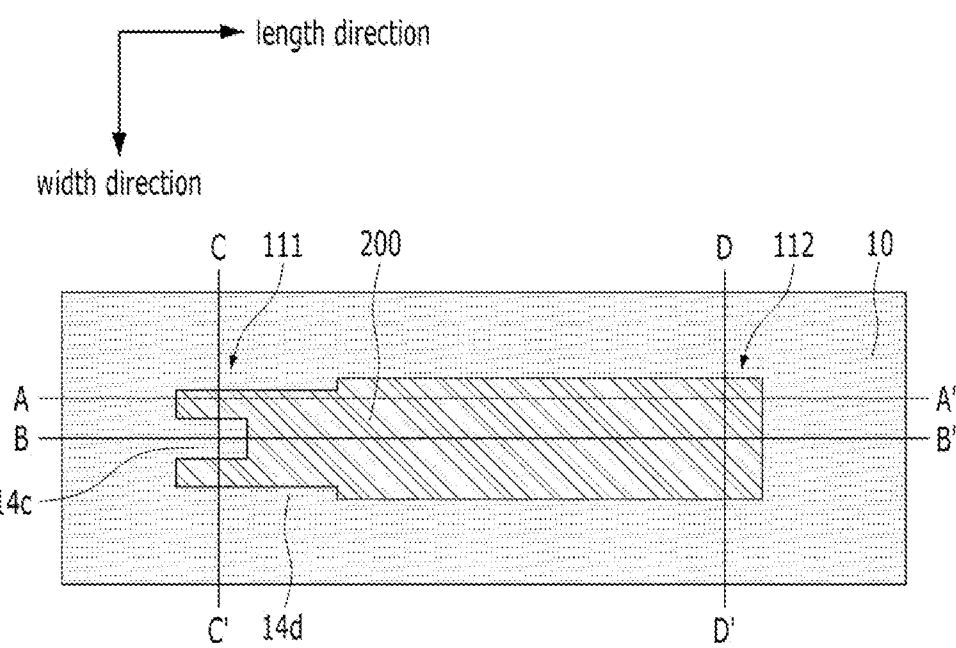
Figure 40B:
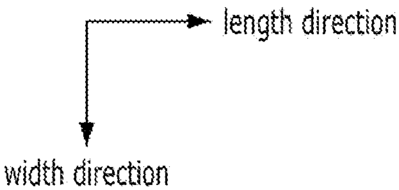
Figure 40B:
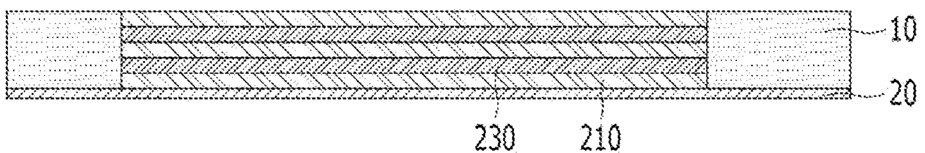
Figure 40C:
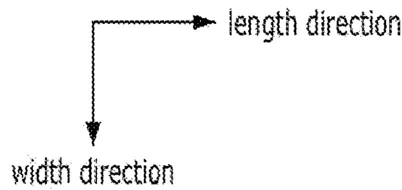
Figure 40C:
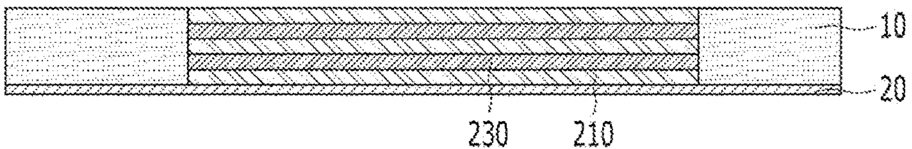
Figure 40D:
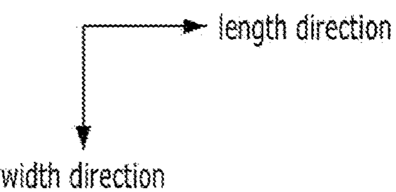
Figure 40D:
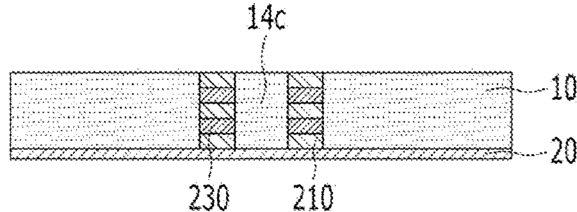
Figure 40E:
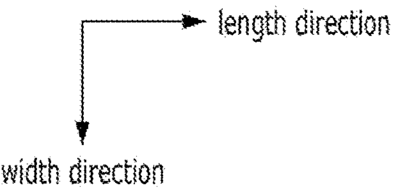
Figure 40E:
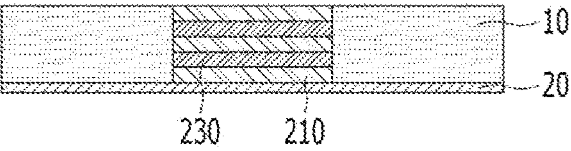

Next, referring to FIGS. 40A, 40B. 40C. 40D, and 40E, FIG. 40A is a plan view illustrating the mold 10 in which the horizontal metal layers 200 are formed in the inner space 11. FIG. 40B is a sectional view taken along line A-A' of FIG. 40A. FIG. 40C is a sectional view taken along line B-B' of FIG. 40A. FIG. 40D is a sectional view taken along line C-C' of FIG. 40A, and FIG. 40E is a sectional view taken along line D-D' of FIG. 40A.

The step of forming the horizontal metal layers 200 in the inner space 11 of the mold 10 by electroplating is performed. The horizontal metal layers 200 are stacked in the thickness direction of the electrically conductive contact pin 100 by performing electroplating a plurality of times. The horizontal metal layers 200 are formed by stacking at least two metals, each of which is selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; the group consisting of a nickel-phosphor (NiPh) alloy, a nickel-manganese (NiMn), a nickel-cobalt (NiCo), and a nickel-tungsten (NiW) alloy; or the group consisting of copper (Cu), silver (Ag), and gold (Au). For example, a first metal 210 made of a palladium-cobalt (PdCo) alloy and a second metal 230 made of copper (Cu) may be alternately stacked.

Figure 41A:
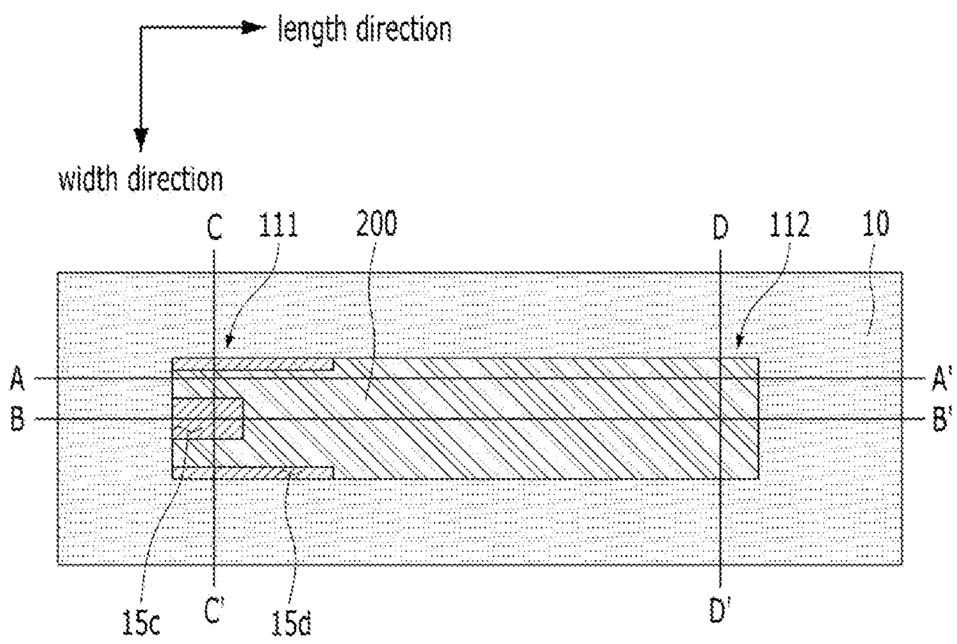
Figure 41B:
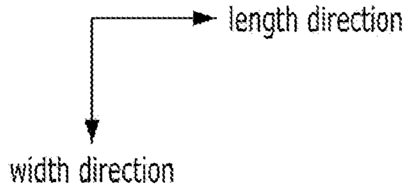
Figure 41B:
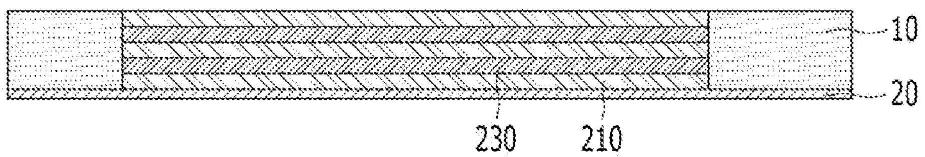
Figure 41C:
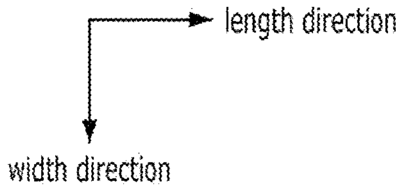
Figure 41C:
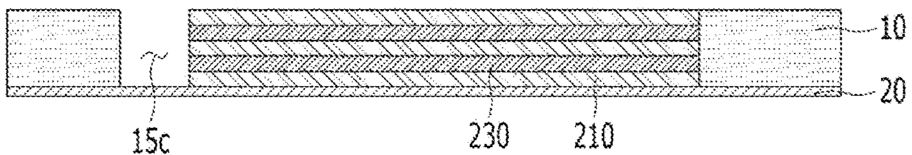
Figure 41D:
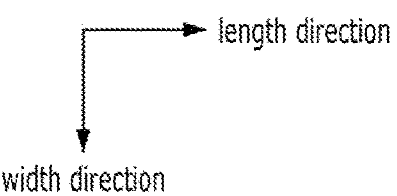
Figure 41D:
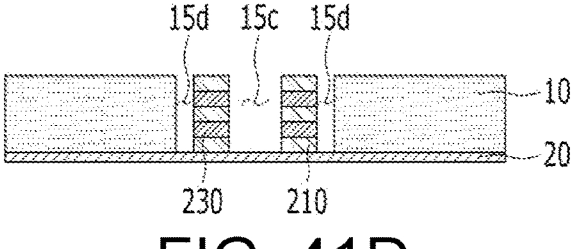
Figure 41E:
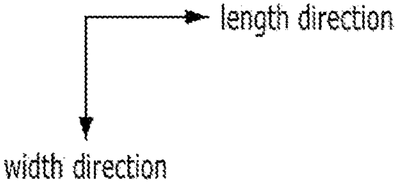
Figure 41E:
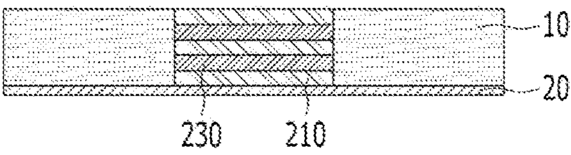

Next, referring to FIGS. 41A, 41B, 41C, 41D, and 41E, FIG. 41A is a plan view illustrating the mold 10 in which additional spaces 15 are formed by removing the end sacrificial mold portion 14*c* and the side sacrificial mold portions 14*d*. FIG. 41B is a sectional view taken along line A-A' of FIG. 41A, FIG. 41C is a sectional view taken along line B-B' of FIG. 41A. FIG. 41D is a sectional view taken along line C-C' of FIG. 41A, and FIG. 41E is a sectional view taken along line D-D' of FIG. 41A.

The step of removing the end sacrificial mold portion 14*c* and the side sacrificial mold portions 14*d* is performed. The additional spaces 15 are formed in the mold 10 by removing the end sacrificial mold portion 14*c* and the side sacrificial mold portions 14*d*. The additional spaces 15 include an end additional space 15*c* formed by removing the end sacrificial mold portion 14*c* and opposite side additional spaces 15*d* formed by removing the side sacrificial mold portions 14*d*.

Figure 42A:
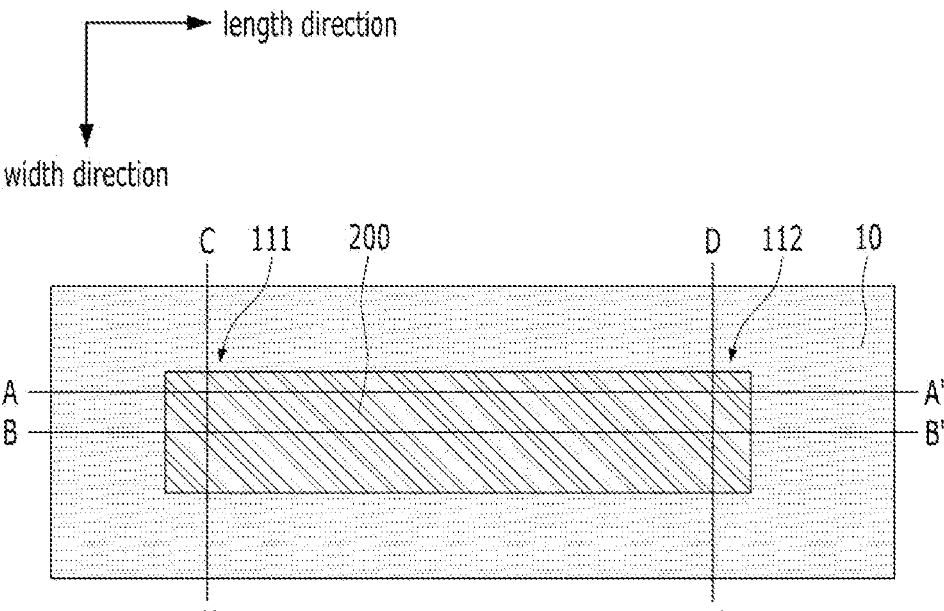
Figure 42B:
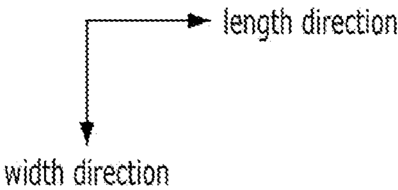
Figure 42B:
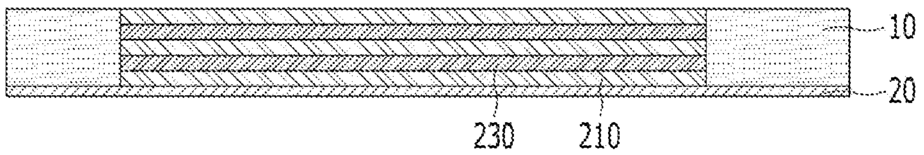
Figure 42C:
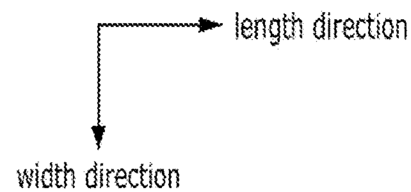
Figure 42C:
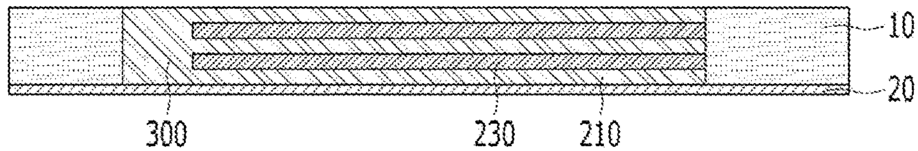
Figure 42D:
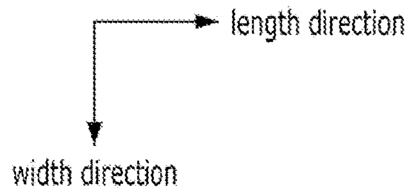
Figure 42D:
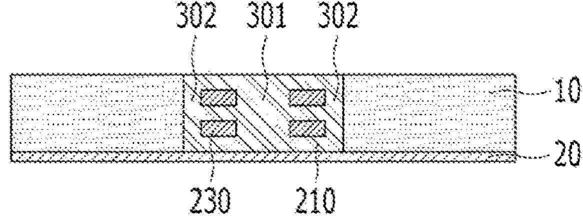
Figure 42E:
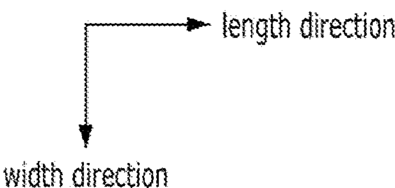
Figure 42E:
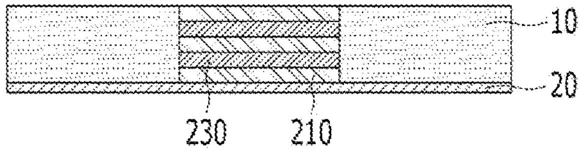

Next, referring to FIGS. 42A, 42B, 42C, 42D, and 42E, FIG. 42A is a plan view illustrating the mold 10 in which a vertical metal layer 300 is formed at the first end portion 111. FIG. 42B is a sectional view taken along line A-A' of FIG. 42A, FIG. 42C is a sectional view taken along line B-B' of FIG. 42A. FIG. 42D is a sectional view taken along line C-C' of FIG. 42A, and FIG. 42E is a sectional view taken along line D-D' of FIG. 42A.

The vertical metal layer 300 includes a center vertical metal layer 301 formed by filling the end additional space 15*c* with a metal by electroplating, and opposite side vertical metal layers 302 formed by filling the side additional spaces 15*d* with a metal by electroplating.

The vertical metal layer 300 may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. Preferably, the vertical metal layer may be made of the same material as the material of the first metal 210. For example, when the first metal 210 is made of a palladium-cobalt (PdCo) alloy, the vertical metal layer 300 may also be made of a palladium-cobalt (PdCo) alloy.

Figure 43A:
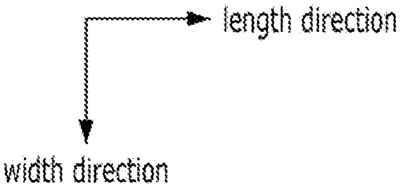
Figure 43A:
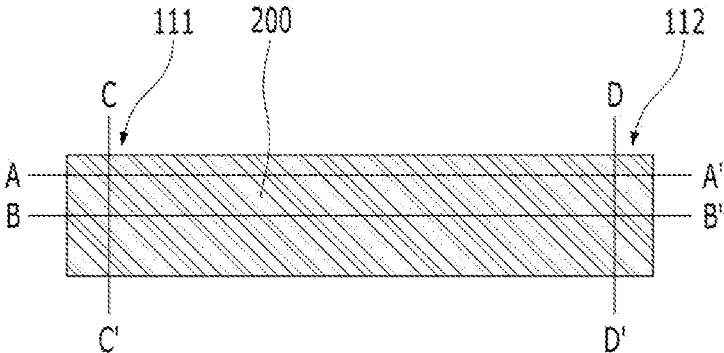
Figure 43B:
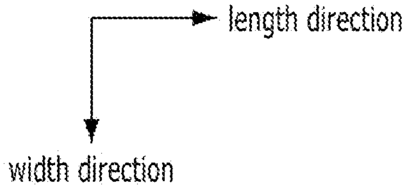
Figure 43B:
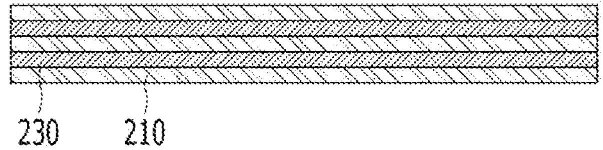
Figure 43C:
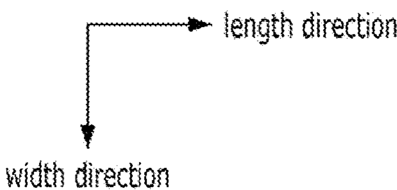
Figure 43C:
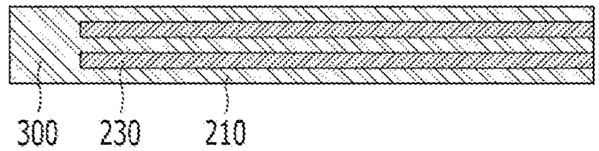
Figure 43D:
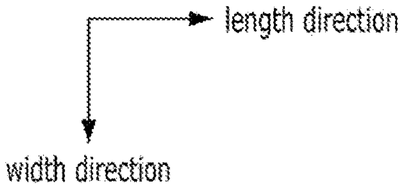
Figure 43D:
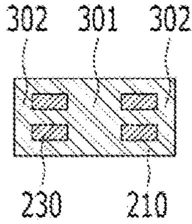
Figure 43E:
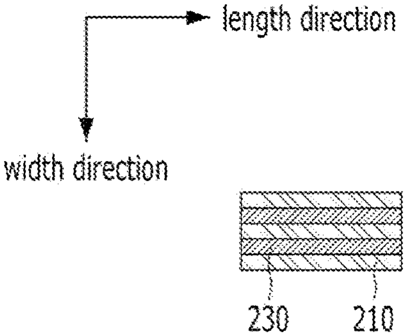
Figures 44A, 44B:
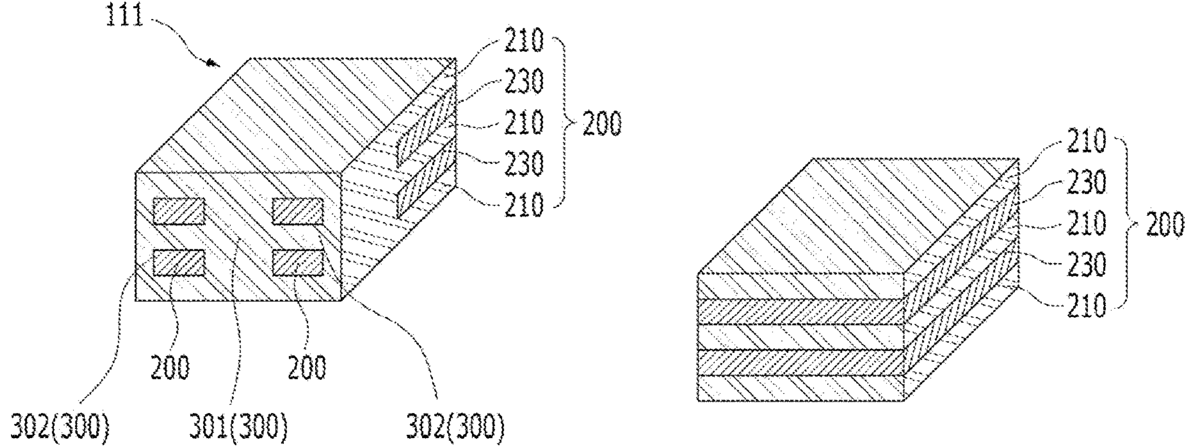
FIG. 44A is a perspective view illustrating a first end portion of the electrically conductive contact pin according to the sixth embodiment of the present disclosure.
FIG. 44B is a perspective view illustrating a second end portion of the electrically conductive contact pin according to the sixth embodiment of the present disclosure.

Next, referring to FIGS. 43A, 43B. 43C. 43D, and 43E. FIG. 43A is a plan view illustrating the electrically conductive contact pin 100. FIG. 43B is a sectional view taken along line A-A' of FIG. 43A. FIG. 43C is a sectional view taken along line B-B' of FIG. 43A, FIG. 43D is a sectional view taken along line C-C' of FIG. 43A, and FIG. 43E is a sectional view taken along line D-D' of FIG. 43A.

The step of removing the mold 10 and the seed layer 20 is performed after the previous step. When the mold 10 is made of an anodic aluminum oxide film, the mold 10 is removed using a solution that selectively reacts with the anodic aluminum oxide film. In addition, when the seed layer 20 is made of copper (Cu), the seed layer 20 is removed using a solution that selectively reacts with copper (Cu).

FIG. 44A is a perspective view illustrating a front surface, that is, the first end portion 111, of the electrically conductive contact pin 100 according to the sixth embodiment of the present disclosure, and FIG. 44B is a perspective view illustrating a rear surface, that is, a second end portion 112, of the electrically conductive contact pin 100 according to the sixth embodiment of the present disclosure.

While the second end portion 112 is composed of only the horizontal metal layers 200, the first end portion 111 is composed of both the horizontal metal layers 200 and the vertical metal layer 300 unlike the second end portion 112.

The horizontal metal layers 200 may include the first metal 210 and the second metal 230. The first metal 210 may be a metal having relatively high wear resistance or hardness compared to the second metal 230, and the second metal 230 may be a metal having relatively high electrical conductivity compared to the first metal 210. The first metal 210 may be a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy. The second metal 230 may be a metal selected from the group consisting of copper (Cu), silver (Ag), and gold (Au).

While the second end portion 112 has a configuration in which the first metal 210 and the second metal 230 are alternately spaced apart from each other only in the thickness direction of the electrically conductive contact pin 100, the first end portion 111 has a configuration in which second metals 230 are spaced apart from each other not only in the thickness direction of the electrically conductive contact pin 100 but also in the width direction of the electrically conductive contact pin 100 and the first metal 210 exists at a position where the second metals 230 are spaced apart from each other in the width direction. At the first end portion 111, the first metal 210 is continuous not only in the thickness direction of the electrically conductive contact pin 100 but also in the width direction of the electrically conductive contact pin 100.

In addition, the vertical metal layer 300 includes the center vertical metal layer 301 located at a center of an end portion of the electrically conductive contact pin 100 and the opposite side vertical metal layers 302 located at opposite sides of the end portion of the electrically conductive contact pin 100. Thus, the first metal 210 is additionally formed to surround side surfaces of the second metal 230 at the first end portion 111. With the configuration in which the second metal 230 is surrounded by the first metal 210 so that the second metal 230 is not exposed except for a lower surface of the end portion of the electrically conductive contact pin, it is possible to further improve the wear resistance of the first end portion 111. In addition, since the position of the second metal 230 can be precisely detected through a vision camera, it is possible to more accurately detect the position of the first end portion 111.

In performing a process of grinding the first end portion 111, the remaining length of an inner extension portion 310 can be easily determined through a change in the length of the side vertical metal layers 302. More specifically, since the inner extension portion 310 of the vertical metal layer 300 is located inside the electrically conductive contact pin 100, it may be difficult to easily determine how much the length of the inner extension portion 310 actually remains in performing the grinding the first end portion 111. However, by adopting the configuration of the side vertical metal layers 302, when the first end portion 111 is ground, the inner extension portion 310 and the side vertical metal layers 302 are removed together with the first end portion, and the remaining length of the side vertical metal layers 302 can be easily determined from the outside of the electrically conductive contact pin 100. Thus, it is easy to determine the remaining length of the inner extension portion 310.

The vertical metal layer 300 includes the inner extension portion 310 extending inside the first end portion 111 in the length direction of the electrically conductive contact pin 100 by a length of 100 μm to 400 μm. The second metals 230 are spaced apart from each other in the width direction by the width (10 μm to 40 μm) of the inner extension portion 310 within the length (100 μm to 400 μm) of the inner extension portion 310.

By increasing the content of a metal having high wear resistance or high hardness in the first end portion 111 of the electrically conductive contact pin 100 with the configuration of the vertical metal layer 300, it is possible to improve the wear resistance or hardness characteristics of the first end portion 111 and at the same time increase the content of a metal having high electrical conductivity in a body portion 130 of the electrically conductive contact pin 100, thereby improving the current carrying capacity.

In addition, since the first end portion 111 is not composed only of the metal having high wear resistance or high hardness, but also the metal having high electrical conductivity, it is possible to lower the contact resistance compared to configuring a tip portion only with a metal having high wear resistance or high hardness.

In addition, since the vertical metal layer 300 having a length of 100 μm to 400 μm exists in the electrically conductive contact pin 100 in the length direction thereof, it is possible to implement the same cross-sectional structure even when the first end portion 111 is shortened to the length of 100 μm to 400 μm. With this configuration, it is possible to reuse the first end portion 111 by grinding it within the range of 100 μm to 400 μm.

In addition, with the configuration in which the first metal 210 is formed to surround the side surfaces of the second metal 230 so that edges of the first end portion 111 are all composed of the first metal 210, the wear resistance of the edges of the first end portion 111 can be increased. Thus, it is possible to maintain the shape of the first end portion 111 in the process of grinding the first end portion.

A plating film made of gold (Au) may be additionally formed on a surface of the electrically conductive contact pin 100 according to various embodiments described above to further improve the current carrying capacity. In this case, the gold (Au) plating film may not be formed on the first end portion 111.

Although the exemplary embodiments of the present disclosure have been described for illustrative purposes, those skilled in the art will appreciate that various modifications, additions, and substitutions are possible, without departing from the scope and spirit of the present disclosure as disclosed in the accompanying claims.

REFERENCE SIGNS LIST

10: mold
20: seed layer
100: electrically conductive contact pin
110: end portion
200: horizontal metal layer
300: vertical metal layer

What is claimed is:

1. An electrically conductive contact pin, comprising:

a plurality of horizontal metal layers stacked in a thickness direction of the electrically conductive contact pin; and a vertical metal layer provided at a first end portion forming a front surface of the electrically conductive contact pin, the vertical metal layer being continuously formed from a lower surface to an upper surface in the thickness direction of the electrically conductive contact pin and being located at a center portion of the first end portion in a width direction of the electrically conductive contact pin, such that the plurality of horizontal metal layers are positioned at both side surfaces thereof, wherein a second end portion forming a rear surface of the electrically conductive contact pin and a body portion provided between the first end portion and the second end portion do not include the vertical metal layer and are composed only of the plurality of horizontal metal layers.

2. The electrically conductive contact pin of claim 1, wherein the vertical metal layer is made of the same metal as a material of at least one of the horizontal metal layers.

3. The electrically conductive contact pin of claim 1, wherein the vertical metal layer is made of a metal different from materials of the plurality of horizontal metal layers composed of different materials.

4. The electrically conductive contact pin of claim 1, wherein the first end portion comprises:

first regions, at the first end portion, in which the plurality of horizontal metal layers are stacked, the first regions being located at opposite sides in the width direction; and a second region, at the first end portion, in which the vertical metal layer is formed, wherein the second region is provided between the first regions, and wherein the first regions and the second region have the same thickness.

5. The electrically conductive contact pin of claim 4, wherein the second region has a higher hardness than an average hardness of the first region.

6. The electrically conductive contact pin of claim 4, wherein the second region has a higher electrical conductivity than an average electrical conductivity of the first region.

7. The electrically conductive contact pin of claim 1, wherein the vertical metal layer comprises an inner extension portion extending, from the first end portion, along a length direction of the electrically conductive contact pin in an inward direction of the electrically conductive contact pin.

8. The electrically conductive contact pin of claim 7, wherein the inner extension portion has a length in a range of 100 μm to 400 μm.

9. The electrically conductive contact pin of claim 1, wherein the vertical metal layer comprises an outer extension portion formed to extend, from the first end portion, along a length direction of the electrically conductive contact pin in an outward direction of the electrically conductive contact pin such that the outer extension portion protrudes outward from the first end portion.

10. The electrically conductive contact pin of claim 1, wherein the vertical metal layer has a width in a range of 10 μm to 40 μm.

11. The electrically conductive contact pin of claim 1, wherein the plurality of horizontal metal layers comprise a first metal and second metals, and the plurality of horizontal metal layers are configured by alternately stacking the first metal and the second metals, wherein the vertical metal layer is made of the same material as the first metal, and wherein at the first end portion, the second metals are formed to be spaced apart in a width direction of the electrically conductive contact pin such that the first metal is positioned between the spaced apart second metals.

12. The electrically conductive contact pin of claim 11, wherein the first metal is made of a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, and the second metals are made of a metal selected from the group consisting of copper (Cu), silver (Ag), gold (Au), and an alloy of these metals.

13. The electrically conductive contact pin of claim 1, wherein the plurality of horizontal metal layers comprise a first metal and second metals, and the plurality of horizontal metal layers are configured by alternately stacking the first metal and the second metals, wherein the center vertical metal layer and the side vertical metal layers are made of the same material as the first metal, and wherein at the first end portion, the second metals are formed to be spaced apart in the width direction of the electrically conductive contact pin such that the first metal is positioned between the spaced apart second metals, and the first metal is positioned to surround side surfaces of the spaced apart second metals.

14. The electrically conductive contact pin of claim 1, wherein the plurality of horizontal metal layers comprise a first metal and second metals, and the plurality of horizontal metal layers are configured by alternately stacking the first metal and the second metals, wherein the vertical metal layer is made of a third metal having a material different from materials of the first metal and the second metals, and wherein at the first end portion, the second metals are formed to be spaced apart from each other such that the third metal is positioned between the spaced apart second metals.

15. The electrically conductive contact pin of claim 14, wherein the first metal is made of a metal selected from the group consisting of platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, the second metals are made of a metal selected from the group consisting of copper (Cu), silver (Ag), gold (Au), and an alloy of these metals, and the third metal is made of rhodium (Rh).

16. The electrically conductive contact pin of claim 14, wherein the first metal is made of a metal selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiPh) alloy, a nickel-manganese (NiMn), a nickel-cobalt (NiCo), and a nickel-tungsten (NiW) alloy, the second metals are made of a metal selected from the group consisting of copper (Cu), silver (Ag), and an alloy of these metals, and the third metal is made of gold (Au).

17. An electrically conductive contact pin, comprising:

a plurality of horizontal metal layers stacked in a thickness direction of the electrically conductive contact pin;

a first vertical metal layer provided at a first end portion forming a front surface of the electrically conductive contact pin, the first vertical metal layer being continuously formed from a lower surface to an upper surface in the thickness direction of the electrically conductive contact pin and being located at a center portion of the first end portion in a width direction of the electrically conductive contact pin such that the plurality of horizontal metal layers are positioned at both side surfaces thereof; and a second vertical metal layer provided at a second end portion forming a rear surface of the electrically conductive contact pin, the second vertical metal layer being continuously formed from a lower surface to an upper surface in the thickness direction of the electrically conductive contact pin and being located at a center portion of the second end portion in the width direction of the electrically conductive contact pin such that the plurality of horizontal metal layers are positioned at both side surfaces thereof, wherein the first vertical metal layer comprises a first outer extension portion formed to extend, from the first end portion, along a length direction of the electrically conductive contact pin in an outward direction of the electrically conductive contact pin such that the first outer extension portion protrudes outward from the first end portion, and wherein the second vertical metal layer comprises a second outer extension portion formed to extend, from the second end portion, along the length direction of the electrically conductive contact pin in the outward direction of the electrically conductive contact pin such that the second outer extension portion protrudes outward from the second end portion, wherein a body portion provided between the first end portion and the second end portion does not include the first vertical metal layer and the second vertical metal layer and is composed only of the plurality of horizontal metal layers.

18. The electrically conductive contact pin of claim 17, wherein the first vertical metal layer further comprises a first inner extension portion extending, from the first end portion, along the length direction of the electrically conductive contact pin in an inward direction of the electrically conductive contact pin, and wherein the second vertical metal layer further comprises a second inner extension portion extending, from the second end portion, along the length direction of the electrically conductive contact pin in the inward direction of the electrically conductive contact pin.

19. An electrically conductive contact pin, comprising:

a plurality of horizontal metal layers stacked in a thickness direction of the electrically conductive contact pin;

a center vertical metal layer provided at a first end portion forming a front surface of the electrically conductive contact pin, the center vertical metal layer being continuously formed from a lower surface to an upper surface in the thickness direction of the electrically conductive contact pin and being located at a center portion of the first end portion in a width direction of the electrically conductive contact pin such that the plurality of horizontal metal layers are positioned at both side surfaces thereof; and side vertical metal layers provided at the first end portion, the side vertical metal layers being continuously formed from a lower surface to an upper surface in the thickness direction of the electrically conductive contact pin and being located at opposite side portions of the first end portion in the width direction of the electrically conductive contact pin such that the side vertical metal layers are positioned outside the plurality of horizontal metal layers, wherein a second end portion forming a rear surface of the electrically conductive contact pin and a body portion provided between the first end portion and the second end portion do not include the center vertical metal layer and the side vertical metal layers and are composed only of the plurality of horizontal metal layers.

* * * * *